(12) United States Patent
Hansen

(10) Patent No.: US 11,354,484 B2
(45) Date of Patent: Jun. 7, 2022

(54) FAILURE MODEL FOR PREDICTING FAILURE DUE TO RESIST LAYER

(71) Applicant: ASML NETHERLANDS B.V., Veldhoven (NL)

(72) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/288,167

(22) PCT Filed: Oct. 22, 2019

(86) PCT No.: PCT/EP2019/078706
§ 371 (c)(1),
(2) Date: Apr. 23, 2021

(87) PCT Pub. No.: WO2020/094389
PCT Pub. Date: May 14, 2020

(65) Prior Publication Data
US 2021/0382393 A1    Dec. 9, 2021

Related U.S. Application Data

(60) Provisional application No. 62/914,168, filed on Oct. 11, 2019, provisional application No. 62/757,386, filed on Nov. 8, 2018.

(51) Int. Cl.
*G06F 30/30*      (2020.01)
*G03F 7/20*       (2006.01)
(Continued)

(52) U.S. Cl.
CPC ............ *G06F 30/398* (2020.01); *G03F 7/705* (2013.01); *G03F 7/7065* (2013.01); *G06F 30/392* (2020.01)

(58) Field of Classification Search
None
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| WO | 2010059954 | 5/2010 |
| WO | 2015121127 | 8/2015 |
| WO | 2019121486 | 6/2019 |

OTHER PUBLICATIONS

M.D. Smith et al., "Comprehensive EUV Lithography Model," Proc. SPIE 7969, Extreme Ultraviolet (EUV) Lithography II, 2011 SPIE, 11 pages. (Year: 2011).*

(Continued)

*Primary Examiner* — Leigh M Garbowski
(74) *Attorney, Agent, or Firm* — Pillsbury Winthrop Shaw Pittman LLP

(57) ABSTRACT

A method of determining a failure model of a resist process of a patterning process. The method includes obtaining (i) measured data of a pattern failure (e.g., failure rate) related to a feature printed on a substrate based on a range of values of dose, and (ii) image intensity values for the feature via simulating a process model using the range of the dose values; and determining, via fitting the measured data of the pattern failure to a product of the dose values and the image intensity values, a failure model to model a stochastic behavior of spatial fluctuations in the resist and optionally predict failure of the feature (e.g., hole closing).

20 Claims, 46 Drawing Sheets

(51) Int. Cl.
    *G06F 30/398* (2020.01)
    *G06F 30/392* (2020.01)

(56) References Cited

U.S. PATENT DOCUMENTS

| | | | |
|---|---|---|---|
| 5,523,193 A | 6/1996 | Nelson | |
| 5,969,441 A | 10/1999 | Loopstra et al. | |
| 6,046,792 A | 4/2000 | Van Der Werf et al. | |
| 7,003,758 B2* | 2/2006 | Ye | G06T 7/0004 716/52 |
| 7,280,945 B1 | 10/2007 | Weiner et al. | |
| 8,108,805 B2* | 1/2012 | Rathsack | G03F 7/705 716/52 |
| 8,200,468 B2 | 6/2012 | Ye et al. | |
| 9,213,783 B2* | 12/2015 | Hansen | G03F 7/70441 |
| 9,310,674 B2* | 4/2016 | Azpiroz | G03F 1/76 |
| 10,394,131 B2* | 8/2019 | Hsu | G03F 7/70433 |
| 10,545,411 B2* | 1/2020 | Hansen | G06F 30/398 |
| 2005/0076322 A1 | 4/2005 | Ye et al. | |
| 2010/0315614 A1 | 12/2010 | Hansen | |
| 2017/0010538 A1 | 1/2017 | Hansen | |

OTHER PUBLICATIONS

International Search Report issued in corresponding PCT Patent Application No. PCT/EP2019/078706, dated Feb. 25, 2020.
Taiwanese Office Action issued in corresponding Taiwanese Patent Application No. 108140202, dated Jul. 21, 2020.
Hansen, S.G.: "Photoresist and Stochastic Modeling", J. Micro/Nanolith. MEMS MOEMS, vol. 17, No. 1 (Mar. 14, 2018).
Vaglio Pret, A. et al.: "Stochastic and systematic patterning failure mechanisms for contact-holes in EUV lithography: Part 2", Proc. of SPIE, vol. 9048 (2014).
De Bisschop, P. et al: "Impact of stochastic effects on EUV printability limits", Proc of SPIE, vol. 9048 (2014).
Bristol, R. et al.: "Lithographic Stochastics: Beyond 3sigma" Proc. of SPIE. vol. 10143 (Mar. 24, 2017).
Spence, C.: "Full-Chip Lithography Simulation and Design Analysis—How OPC is Changing IC Design", Proc. of SPIE, vol. 5751, pp. 1-14 (2005).
Rosenbluth et al., "Optimum Mask and Source Patterns to Print A Given Shape", Journal of Microlithography, Microfabrication, Microsystems 1(1), pp. 13-20 (2002).
Granik, Y.: "Source Optimization for Image Fidelity and Throughput", Journal of Microlithography, Microfabrication, Microsystems 3(4), pp. 509-522 (2004).
Socha et. al.: Simultaneous Source Mask Optimization (SMO), Proc. of SPIE. vol. 5853 (2005).
Nocedal, J. et al: "Numerical Optimization", Springer, Berlin, New York: Vandenberghe. Cambridge University Press (2006).
De Bisschop, Peter.: "Stochastic effects in EUV Lithography: random local CD variability, and printing failures", J. Microlith., Microfab., Microsyst. 16(4), 023001 (Oct.-Dec. 2017).

* cited by examiner

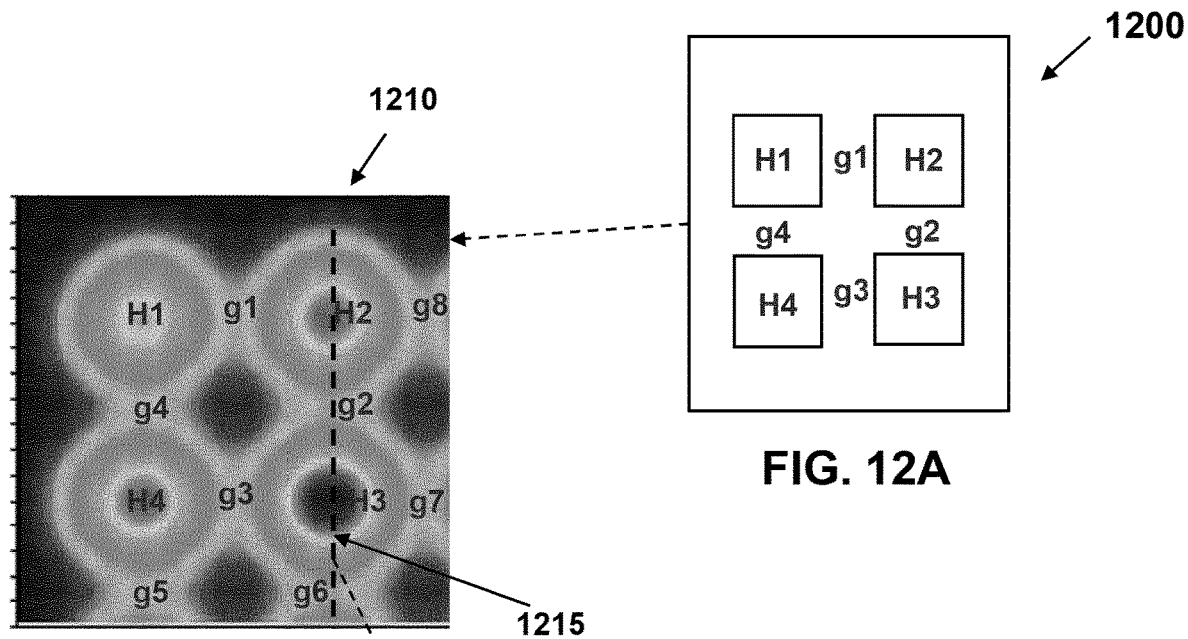
FIG. 12A
FIG. 12B
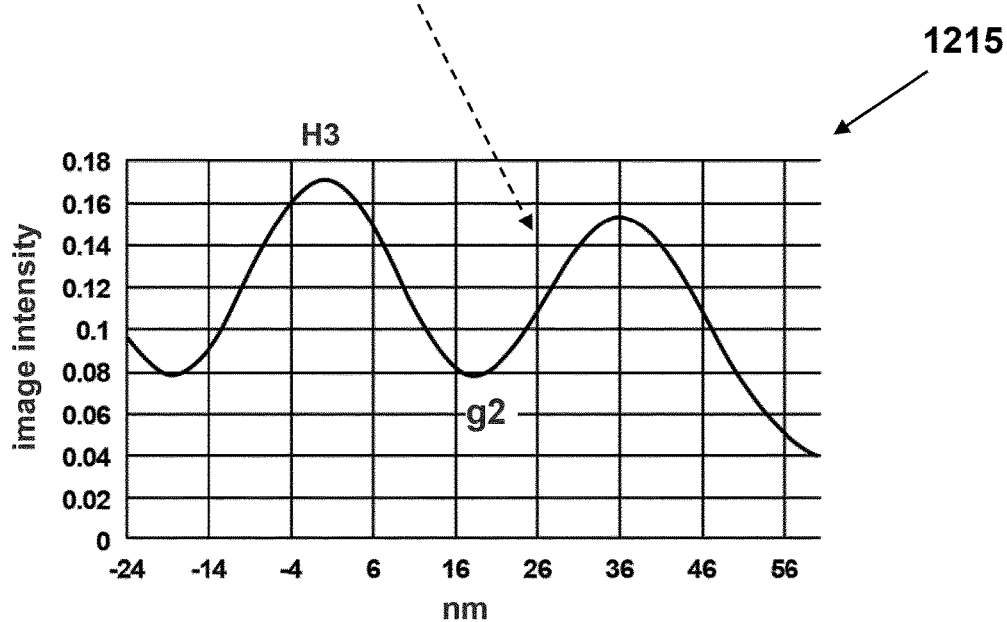
FIG. 12C

FAILURE MODEL FOR PREDICTING FAILURE DUE TO RESIST LAYER

CROSS-REFERENCE TO RELATED APPLICATIONS

This application is the U.S. national phase entry of PCT Patent Application No. PCT/EP2019/078706 which was filed on Oct. 22, 2019, which is based upon and claims the benefit of priority of U.S. Patent Application No. 62/757,386 which was filed on Nov. 8, 2018, and of U.S. Patent Application No. 62/914,168 which was filed on Oct. 11, 2019, each of which is incorporated herein in its entirety by reference.

TECHNICAL FIELD

The description herein relates to lithographic apparatuses and processes, and more particularly to a tool to determining stochastic variations in resist layer and optimization of the patterning process based on stochastic variations.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

According to an embodiment, there is provided a method of determining a failure model of a resist process of a patterning process. The method includes obtaining (i) measured data of a pattern failure related to a feature printed on a wafer based on a range of values of dose, and (ii) an image intensity values for the feature via simulating a process model using the range of the dose values; and determining, via fitting the measured data of the pattern failure to a product of the dose values and the image intensity values, the failure model that models a stochastic behavior of spatial fluctuations in the resist.

In an embodiment, the method further includes applying, via a processor, the values of dose and image intensity to the failure model configured to predict a value of the pattern failure, wherein the failure model represents spatial fluctuations in resist composition of a resist layer as a function of the dose and the image intensity; and adjusting, via the processor, a parameter of the patterning process based on the value of the pattern failure predicted by the failure model.

In an embodiment, the applying the values of dose and image intensity comprises predicting, via executing of the failure model with the values of the dose and image intensity as input, the value of the pattern failure.

In an embodiment, the failure model is a probabilistic model fitted as the product of the values of dose and image intensity.

In an embodiment, the probabilistic model comprises a Gaussian function fitted based on a product of the values of dose and image intensity.

In an embodiment, the Gaussian function comprises at least two fitting parameters.

In an embodiment, the fitting parameters are mean and variance of the values of the dose and image intensity.

In an embodiment, the measured data of the pattern failure comprises a failure rate of a failure of the feature upon exposure of the resist layer.

In an embodiment, the failure comprises at least one of: a hole closure, a missing hole, merging holes, a space closure, and a line breaking.

In an embodiment, the failure of the feature is dependent on an amount of light at a center of the feature center and on an amplitude of stochastic fluctuations of the resist layer, wherein the amplitude of the fluctuations is determined from the failure model based on the measured data of the failure rate and the values of dose and image intensity.

In an embodiment, the image intensity is determined from an aerial image obtained for a design pattern.

In an embodiment, the image intensity is blurred image intensity, wherein the blurred image intensity is a function of the resist process of the patterning process.

In an embodiment, the blurred image intensity is determined by convolution of an aerial image with a function chosen to approximately predict behavior of the resist layer or the resist process.

In an embodiment, the resist model is another Gaussian function.

In an embodiment, the adjusting a parameter of the patterning process includes determining the value of the pattern failure via simulation of the lithographic model and the failure model using the values of the dose and intensity; and adjusting a value of the parameter of the patterning process such that the value of the pattern failure is reduced.

In an embodiment, the parameter of the patterning process is at least one of: dose, focus, critical dimension, mask bias, mask pattern, and optical proximity correction.

In an embodiment, the adjusting a value of the optical proximity correction of the patterning process comprises placement of assist features relative to a main feature of the design pattern.

In an embodiment, the values of dose are obtained at a center of a feature of the pattern printed on the resist layer.

In an embodiment, the image intensity is a peak image intensity or a normalized image log-slope of a distribution of the values of the image intensity.

Furthermore, there is provided a method for calibrating a failure model related to a resist process of a patterning process. The method includes obtaining measured values of a pattern failure related to a failure for a feature on a wafer subjected to the patterning process; and calibrating the failure model based on the measured values of the pattern failure such that a difference between predictions of the failure model and the measured values is reduced.

In an embodiment, the failure model is a probabilistic model configured to predict the values of the pattern failure.

In an embodiment, the value of the pattern failure comprises a failure rate of the failure of the feature upon exposure of the resist layer.

In an embodiment, the calibrating the failure model comprises fitting the probabilistic model based on a product of the measured values of dose and image intensity.

In an embodiment, the probabilistic model is a Gaussian function comprising at least two fitting parameters including a mean and a standard deviation.

In an embodiment, the method further includes integrating the calibrated failure model with a blurred image model or a resist model of a lithographic model to allow the blurred image model or the resist model to predict a failure rate of a feature within the resist layer.

In an embodiment, the method further includes extrapolating, via calculation with the lithographic model and the calibrated failure model, to the low failure conditions associated with high volume manufacturing of the patterning process.

In an embodiment, the extrapolating of the failure model is based on data from under exposed condition and over exposed condition at nominal focus of the patterning process.

Furthermore, there is provided a method including obtaining values of dose and intensity for a resist process of a patterning process; obtaining a failure model configured to predict a value of a pattern failure, wherein the failure model models resist stochastic composition fluctuations of a resist layer after exposure and bake as a function of the dose and intensity values; and adjusting a parameter of the patterning process based on the value of the pattern failure predicted by the failure model to improve performance of the patterning process.

In an embodiment, adjusting the parameter of the patterning process includes determining the value of the pattern failure via simulating a lithographic model and the failure model using the values of the dose and intensity; and adjusting a value of the parameter of the patterning process such that the value of the pattern failure is reduced.

In an embodiment, the parameter of the patterning process is at least one of: dose, focus, critical dimension, mask bias, mask pattern, and optical proximity correction.

In an embodiment, the adjusting a value of the optical proximity correction of the patterning process comprises placement of assist features relative to a main feature of the design pattern.

In an embodiment, the values of dose are obtained at a center of a feature of the pattern printed on the resist layer.

Furthermore, there is provided a computer program product comprising a non-transitory computer readable medium having instructions recorded thereon, the instructions when executed by a computer implementing the steps of methods above.

BRIEF DESCRIPTION OF THE DRAWINGS

FIGS. 12A-12D are example for contact hole development with merging failure, according to an embodiment.

Figure 1:
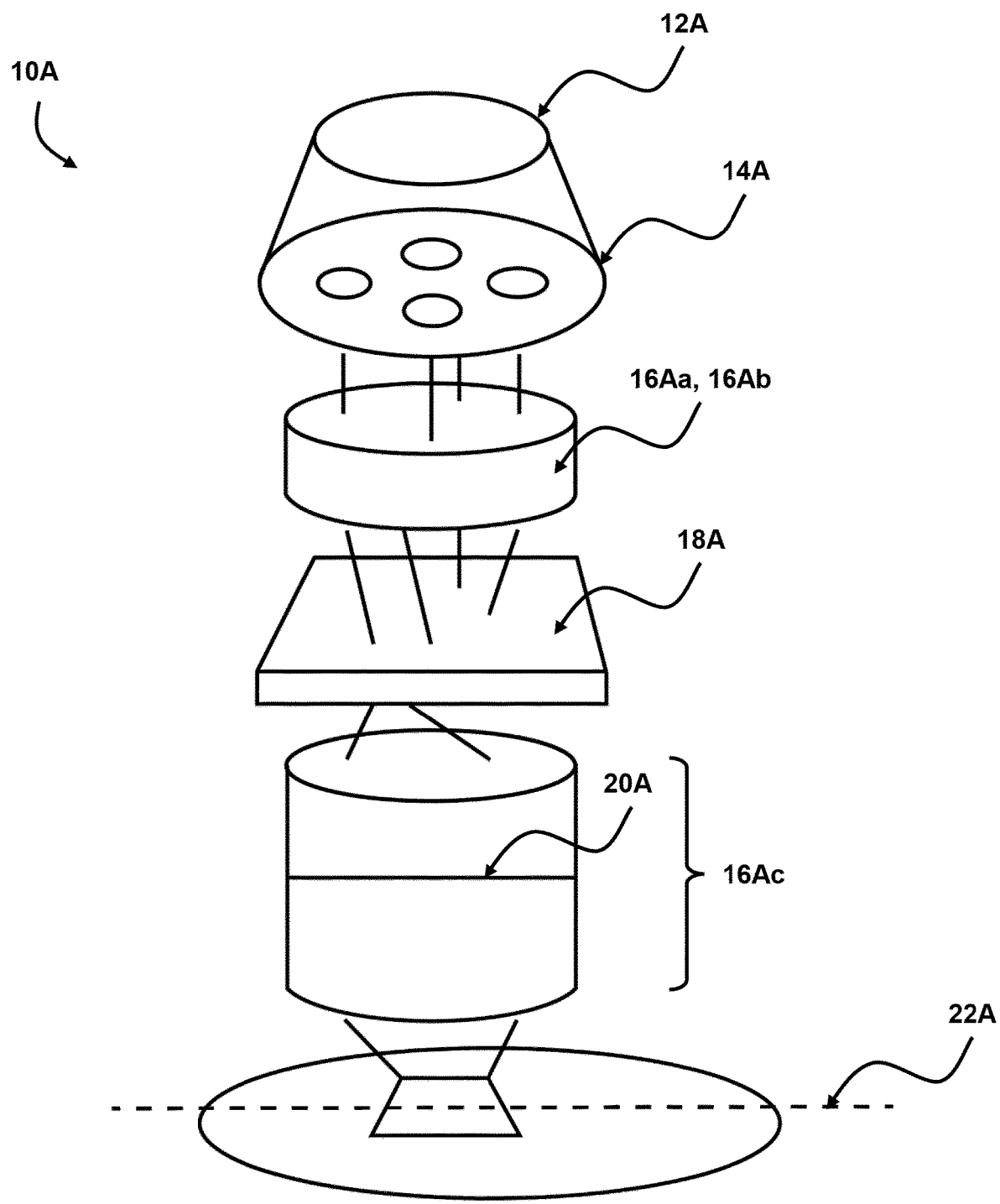
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=sin ($\Theta_{max}$).

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
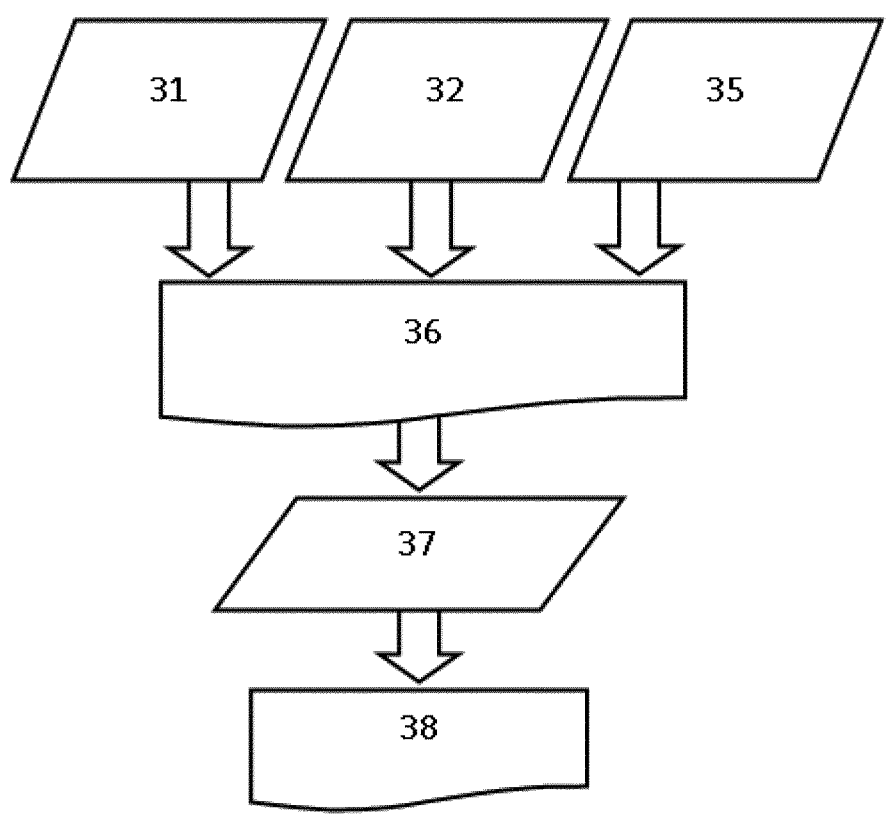
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In a lithographic projection apparatus, for example, using an EUV (extreme ultra-violet radiation, e.g. having a wavelength in the range 5-20 nm) source or a non-EUV source reduced radiation intensity may lead to stronger stochastic effects, such as failure of a feature in a resist layer, pronounced line width roughness (LWR) and local CD variation in small two-dimensional features such as holes. In a lithographic projection apparatus using an EUV source, reduced radiation intensity may be attributed to low total radiation output from the source, radiation loss from optics that shape the radiation from the source, transmission loss through the projection optics, high photon energy that leads to fewer photons under a constant dose, etc. The stochastic effects may be attributed to factors such as photon shot noise, photon-generated secondary electrons, photon absorption variation, photon-generated acids in the resist. The small sizes of features for which EUV is called for further compound these stochastic effects. The stochastic effects in smaller features are a significant factor in production yield and justifies inclusion in a variety of optimization processes of the lithographic projection apparatus.

Under the same radiation intensity, lower exposure time of each substrate leads to higher throughput of a lithographic projection apparatus but stronger stochastic effect. The photon shot noise in a given feature under a given radiation intensity is proportional to the square root of the exposure time. The desire to lower exposure time for the purpose of increasing the throughput exists in lithography using EUV and other radiation sources. Therefore, the methods and apparatuses described herein that consider the stochastic effect in the optimization process are not limited to EUV lithography.

The throughput can also be affected by the total amount of light directed to the substrate (or interchangeably referred as "wafer"). In some lithographic projection apparatuses, a portion of the light from the source is sacrificed in order to achieve desired shapes of the source.

Stochastic variations of the patterning process (e.g., resist process) potentially limits lithography (e.g., EUV lithography), for example, in terms of shrink potential of features and exposure-dose specification, which in turn affects wafer throughput of the patterning process. In an embodiment, stochastic variations of a resist layer may manifest in stochastic failures such as closed holes or trenches, or broken lines. Such resist related stochastic variations impact and limit successful high volume manufacturing (HVM) more than compared to, for example, stochastic CD variation, which is a traditional metric of interest to measure and adjust performance of the patterning process.

The present disclosure provides methods to account for the stochastic variations in the resist. In an embodiment, there is provided a method for building a calibratable model for predicting failure rates. In an embodiment, the calibratable model is determined based on simulation of resist image or blurred image intensity at a center of a feature to be printed on a substrate or wafer. According to an embodiment, the model may be calibrated at certain focus value for a feature under an illumination condition by measuring the failure rate for the feature over a range of applied doses. Further, the calibrated model can be extrapolated to other doses, focuses, masks/patterns, source shapes, NAs, or other parameters of the patterning process. Such model is useful for predicting failure rates in arbitrary patterns when combined with a process model that predicts aerial images, for example tools such as Tachyon and hotspot prediction tools.

The method of the present disclosure addresses several problems of the patterning process associated with stochastic failure rates of patterns printed on a wafer. For example, information (e.g., failure rate) related to the stochastic variation of the resist layer of the wafer enables a user or a system implementing the methods to: (i) estimate whether a planned patterning process or recipes of the patterning process will result in a desired yield with regards to stochastic failures, (ii) identify areas in the pattern with highest failure rates, (iii) compare relative failure rates of alternative processes, particularly source, mask bias, and resist process variations, (iv) based on relative failure rates perform optimizations to reduce (in an embodiment, minimize) failures and address trade-offs in failure rate vs applied dose/wafer throughput, or (v) other improvement or control functions related to the patterning process.

According to the present disclosure, a mechanism of resist image formation and development and how the mechanism is used to account for stochastic variations of the resist layer (also referred as "resist" or "photoresist" in general) is explained with reference to FIGS. 3A-3D, FIGS. 4A-4B and FIGS. 5A-5C.

Figure 3A:
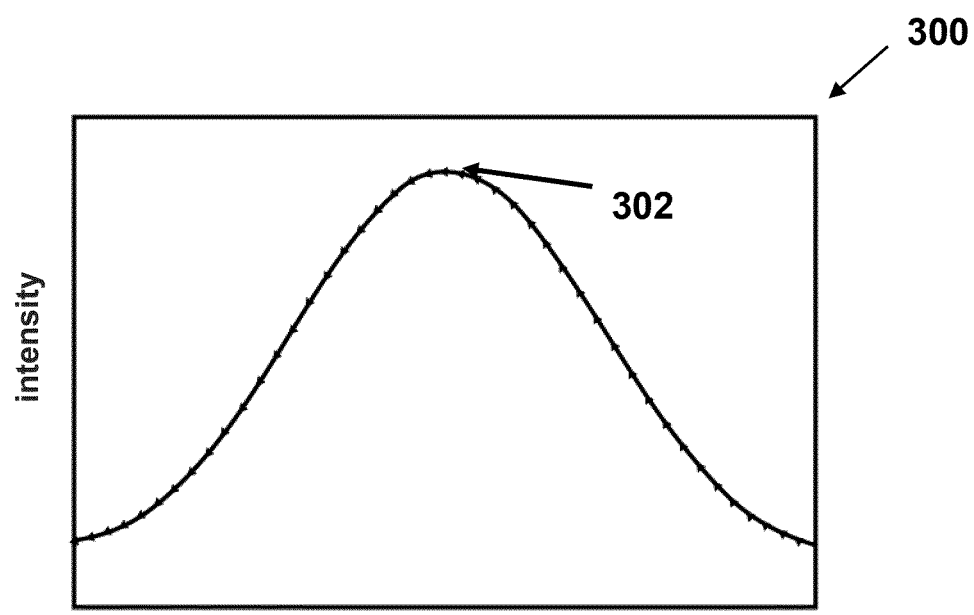
FIG. 3A illustrates an example intensity profile of an aerial image corresponding a contact hole, according to an embodiment.
Figure 3B:
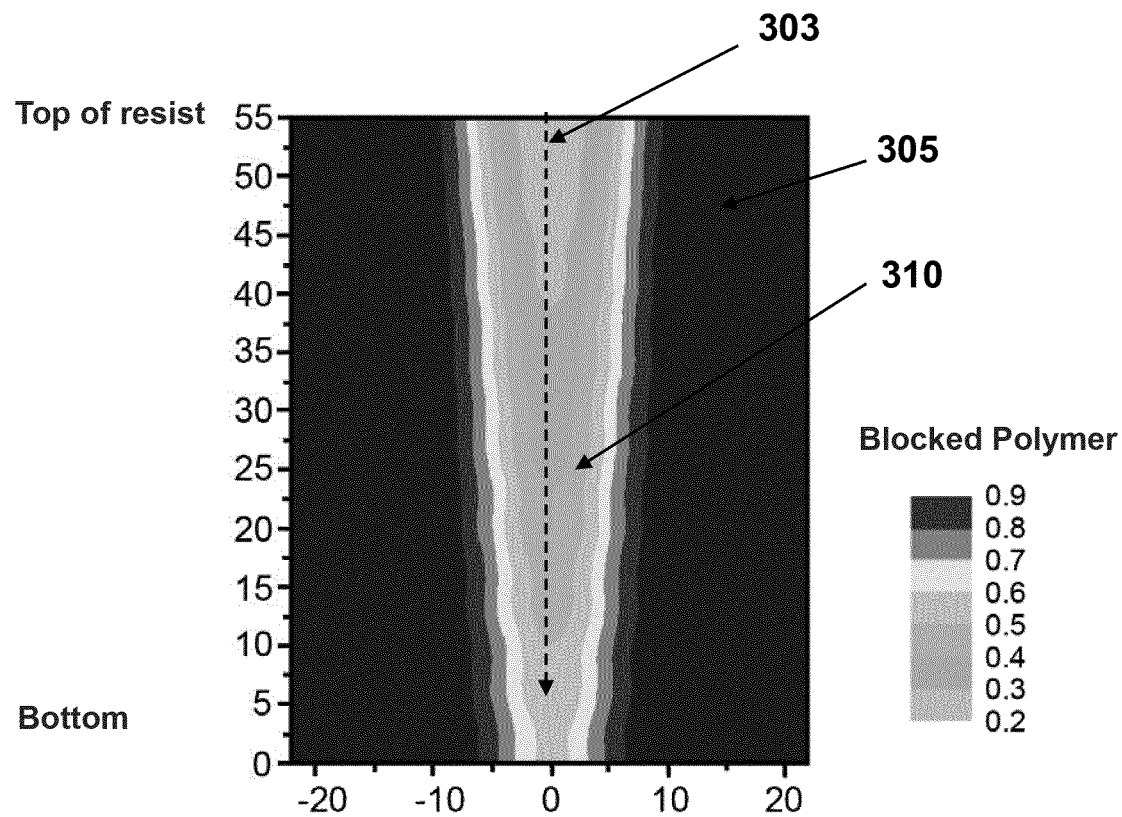
FIG. 3B illustrates an example resist layer with a contact hole developed from top of the resist layer to the bottom of the resist layer, according to an embodiment.

FIG. 3A illustrates intensity 300 of an aerial image corresponding an example feature such as a contact hole (e.g., 310 in FIG. 3B) of a pattern to be printed on a wafer. In this example, intensity 300 varies around the center of the contact hole with a peak intensity 302 at a center of the contact hole and gradually decreasing away from the center. When the aerial image with intensity 300 is transferred to a resist layer of the wafer, it results in a gradient of deblocked polymer of the contact hole in the resist, as shown in FIG. 3B, due to optical absorption and an image contrast. The smooth contours shown represent the average or continuum expectation in the absence of stochastic effects. More detailed consideration shows that each hole experiences variations in the spatial locations of absorbed photons and the locations of chemical constituents such as photo-acid generator and quencher molecules which combine to create fluctuations (interchangeably referred as stochastic variation) in the latent image. These spatial fluctuations affect the manner in which the resist develops and hence the final characteristics of the developed hole. In an embodiment, the fluctuations refer to a spatial distribution of blocked polymer, which is a critical part of the resist development process.

FIG. 3B illustrates an example resist layer 305 with a contact hole 310 developed from top of the resist layer 305 to the bottom of the resist layer 305. The contact hole 310 is formed due to dissolution of blocked polymer of the resist layer 305 and other chemical process when the image having sufficient intensity 300 is transferred to the resist layer 305. However, as shown, although a through hole is formed from top to bottom of the resist layer, the development of the contact hole 310 around a center 303 along the thickness of the resist layer is not uniform. For example, the contact hole 310 has a relatively larger dimension (or size) at the top compared to the dimension (or size) at the bottom of the resist layer 305. Ideally, a through hole of constant dimension should be formed throughout the resist layer. However, the variation in dimension of the contact hole 310 occurs due to the fluctuations or stochastic variations resulting from the resist composition. For example, a resist layer composition may include chemicals such as a polymer resin, a photo acid generator, a base quencher, and a dissolution inhibitor. When light in the form of aerial image (e.g., 300) is incident on such resist layer, light is absorbed and photoacid is generated. In the subsequent bake step several processes occur including 1) acid-catalyzed deblocking of the polymer, 2) acid and quencher diffusion, and acid-quencher neutralization. The final spatial distribution of blocked polymer (or resin) determines the development characteristics of the patterned wafer after the bake.

Figure 3C:
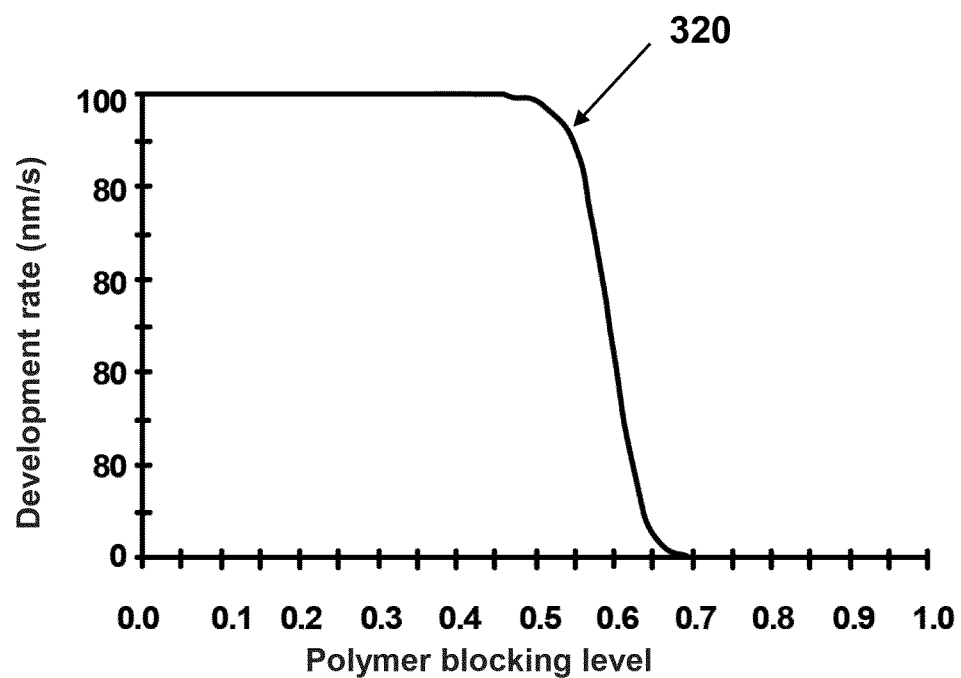
FIG. 3C illustrates an example resist development behavior, according to an embodiment.

An example of bulk resist development behavior 320 is illustrated in FIG. 3C. The development behavior can be illustrated as a photoresist dissolution curve 320, which shows a relationship between a resist development rate (e.g., in nm/s) and a polymer blocking level, which is related to light exposure. The resist development rate very rapidly increases after the polymer blocking level breaches a threshold value (e.g., around 0.65). For example, in FIG. 3C, when the blocking level is more than 0.7 there is only very slow dissolution of resist and feature formation may be blocked. When the blocking level drops below 0.7, the development rate increases exponentially thereby forming a desired feature (e.g., hole 310 in FIG. 3B) in the resist layer (e.g., 305).

Figure 3D:
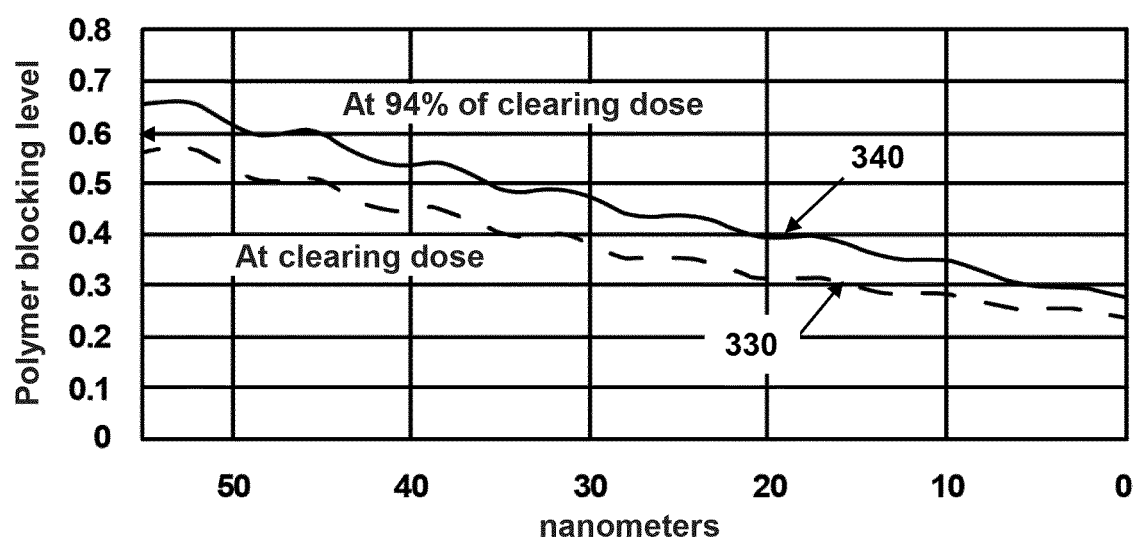
FIG. 3D illustrates an example effect of polymer blocking level as a function of depth into the resist layer (at hole center) for two different doses, according to an embodiment.

According to an embodiment, the development rate or dissolution of the resist is affected by dose, intensity, or both of the patterning process. In an embodiment, the development rate of resist is a function of dose and intensity values among other things related to a resist development process, so any variations in dose and intensity values will affect development of the resist. An example effect of variations in dose and polymer blocking level is shown in FIG. 3D. In FIG. 3D, a first curve 330 corresponds to a first dose value at which a hole cleared to the bottom of the resist. The curve slopes because there is more light and photochemistry at the top of the resist layer (right side) and the intensity is attenuated by absorption as the light propagates to the bottom of the layer (left). The entire first curve 330 is below the polymer blocking dissolution threshold value (e.g., 0.7) indicating that the developer will penetrate fast enough to reach the bottom and form a through hole in the allocated development time (e.g. 60 sec). A second curve 340 corresponding to a second dose value which is about 94% of the first dose value or hole clearing dose. A portion of the second curve 340 is above the threshold value, particularly towards the bottom of the resist layer, indicating that development may slow down and the hole may not be cleared at the bottom of the resist layer. This illustrates for the continuum case how a small variation in dose causes a hole closure or incomplete development of a feature in general.

Figure 4A:
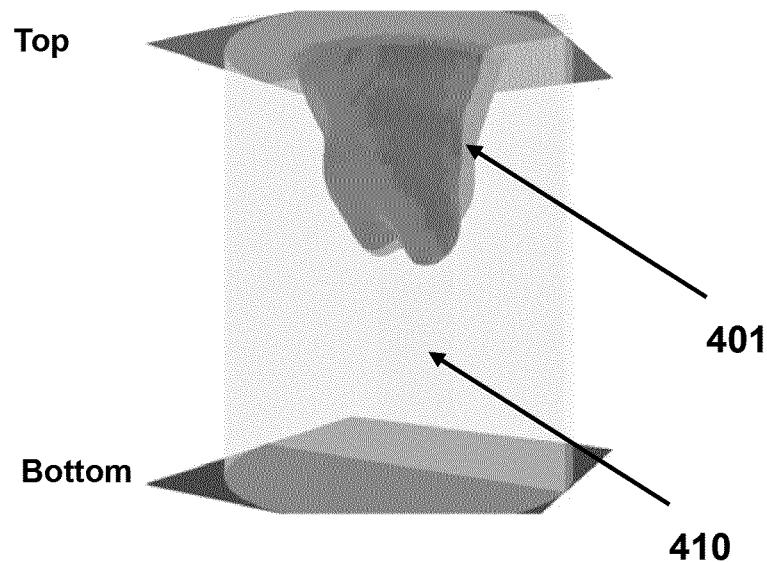
FIG. 4A shows an example of closed hole where the hole starts to develop at the top of the resist layer but does not develop through to the bottom of the resist layer, according to an embodiment.
Figure 4B:
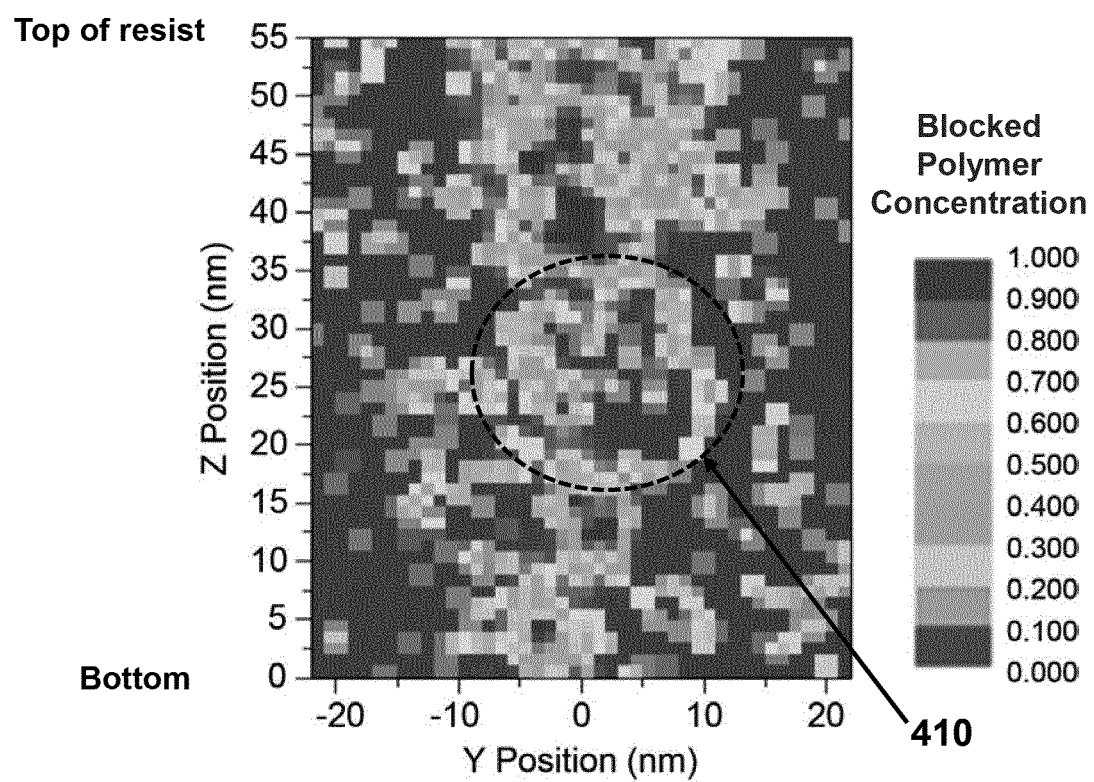
FIG. 4B is a cross-section view of the latent image of the resist, i.e. the spatial distribution of the blocked polymer concentration, of FIG. 4A having the closed hole, according to an embodiment.

For real stochastic processes though even if the average hole clearing dose value is applied, the hole may be closed due to the fluctuations or the stochastic variations in the resist layer, as show in FIGS. 4A and 4B. FIG. 4A shows an example of closed hole 401, where the hole starts to develop at the top of the resist layer but does not develop or only partially develops towards the bottom of the resist layer. For example, the hole 401 does not develop in a blocking region 410. In an embodiment, the blocking region 410 is a portion of the resist layer in which stochastic variations of resist components or the chemical process causes an incomplete development of a feature resulting in a faulty or defective pattern on a wafer.

FIG. 4B is a cross-section view of the resist latent image for the closed hole 401 (in FIG. 4A). In FIG. 4B, region 410 shows an unexpectedly high polymer blocking level (e.g., greater than 0.7) and so sufficient dissolution of resist does not occur. Thus, as discussed earlier with respect to FIG. 3C, the resist development rate is low to zero when the blocked polymer level is more than 0.7. Examination of other stochastic calculations under the same conditions show that all have significant fluctuations for this assumed process but that almost all provide a path for the developer around the slow developing areas and do reach the bottom. But within a blocked polymer region such as the region 410 (in FIG. 4A-4B), the polymer concentration and distribution varies such that the development path is completely blocked and the hole is closed. It can be understood by a person skilled in the art that the present disclosure uses contact hole features as an example and the concepts described herein are not limited to a particular feature such as a contact hole. It can also be understood by a person of ordinary skill in the art that different photoresist processes and the models which describe them will show fluctuations of varying amplitudes and frequencies but all will show stochastic fluctuations which contribute to hole closing or pattern failure as shown in FIG. 4A.

Figure 5A:
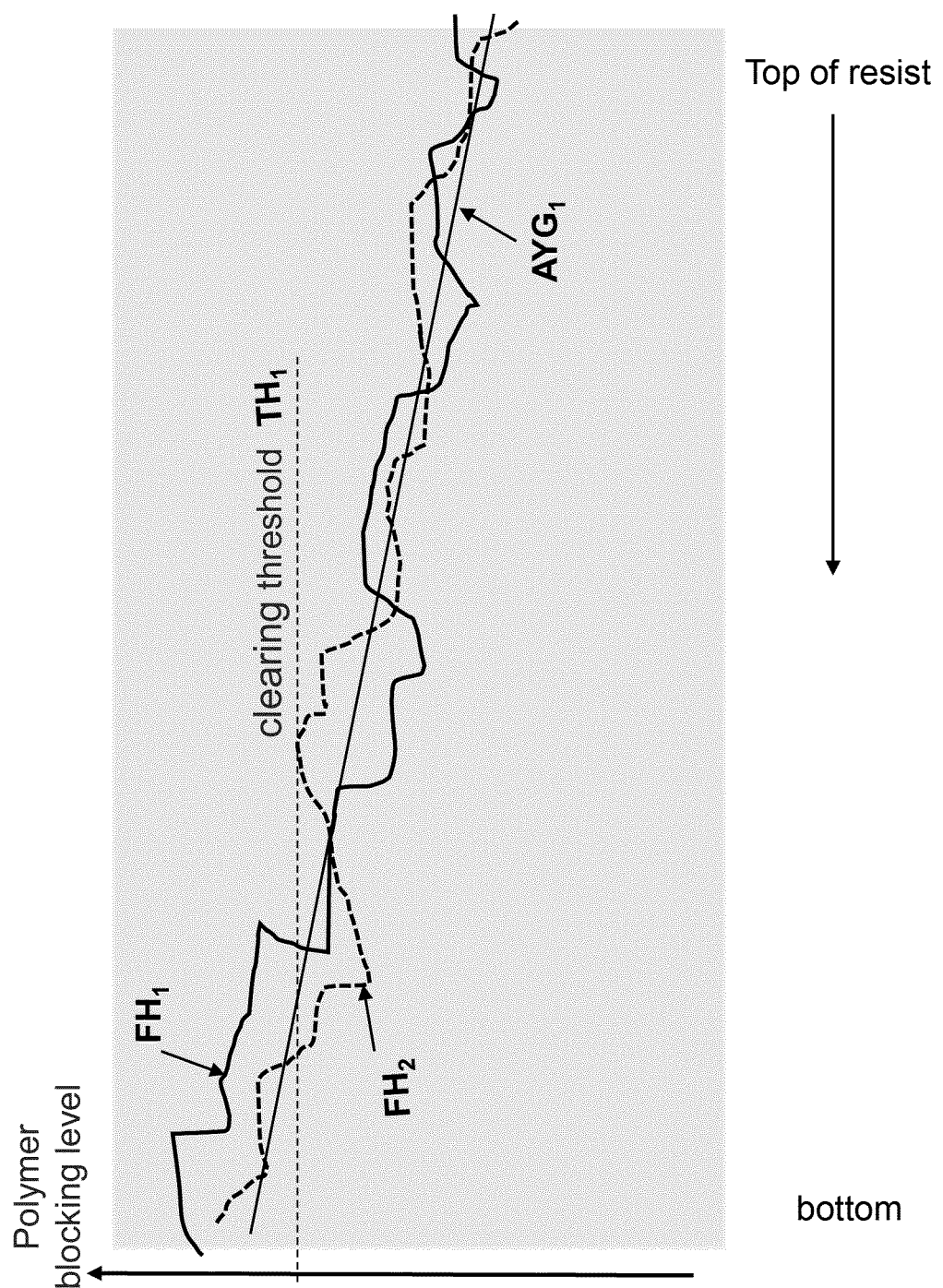
FIGS. 5A-5C are examples of stochastic variation and its impact on hole clearing for different dose values, according to an embodiment.
Figure 5B:
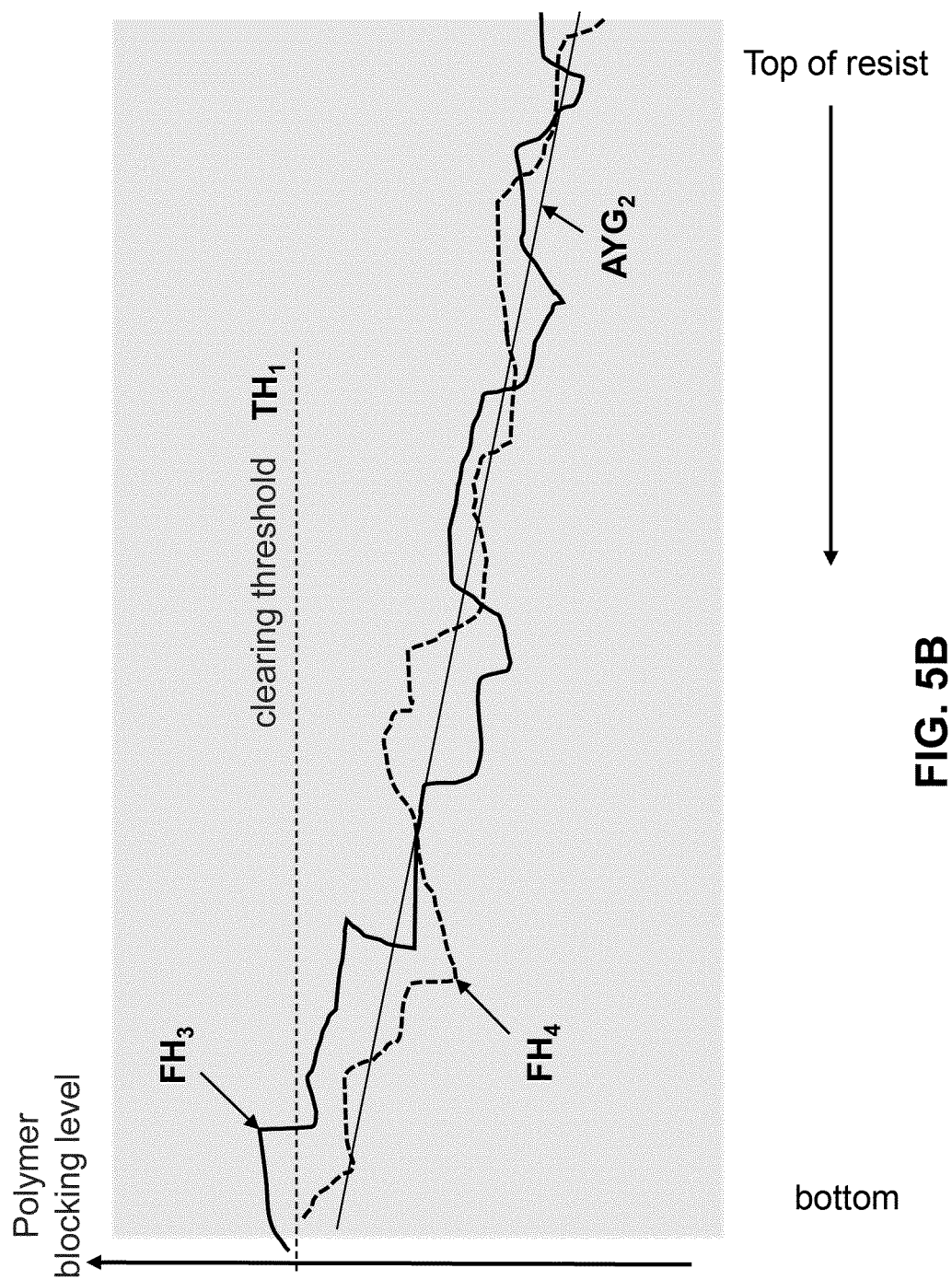
Figure 5C:
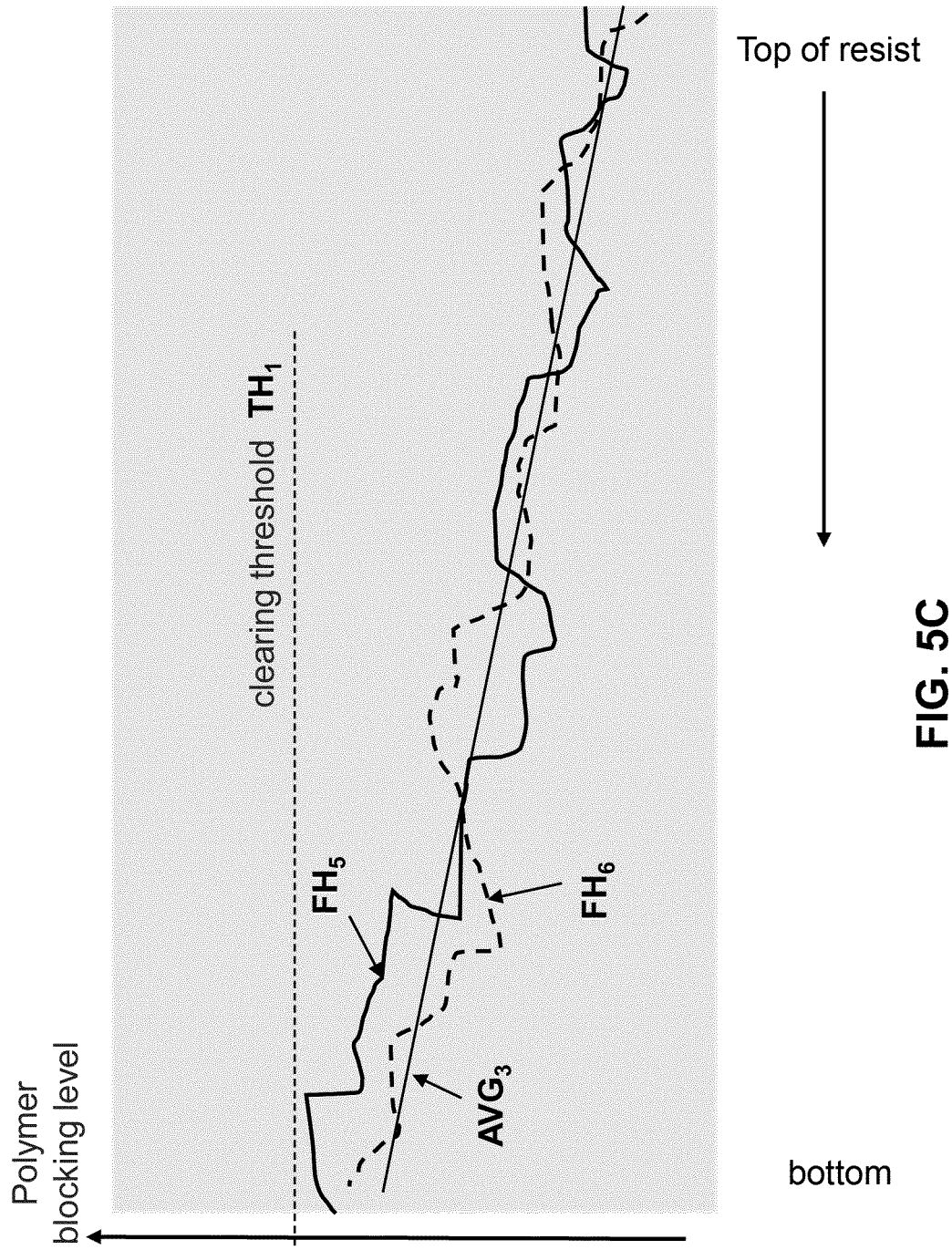

FIGS. 5A-5C provide further examples of stochastic variation and its impact on hole clearing for different dose values. FIG. 5A illustrates case of two holes FH1 and FH2 schematically showing the polymer blocking levels at hole center from top of the resist (at right) to the bottom of the resist. The first hole FH1 and the second hole FH2 are developed by exposing a wafer at the same "low" dose values (e.g., less than 30 mJ/cm$^2$) compared to a nominal clearing dose value (e.g., 30 mJ/cm$^2$). A mean value AVG1 of polymer blocking level from top to bottom of the resist layer is also plotted for reference purposes, this represents the expected average for many holes at this dose.

At lower dose values, both the first FH1 and the second FH2 holes breach a clearing threshold Th1 of the blocked polymer level (as discussed in FIGS. 3C and 3D) towards the bottom of the resist layer. Thus, both the holes do not clear to the bottom of the resist layer. In an embodiment, the threshold value may be associated with a development time. For example, in reality, whether hole clears or not depends on an integrated development trajectory and whether it reaches the bottom of the resist layer in the allocated development time. So, in an embodiment, hole clearing depends not only on the blocking level (e.g., the clearing threshold value) but also how long level stays at a particular value.

In FIG. 5B, holes FH3 and FH4 are developed at a higher dose than the previous example. Although both FH3 and FH4 exhibit fluctuations in blocked polymer level, the fluctuation amplitude of FH3 breaches (e.g., above) the clearing threshold Th1 resulting in a closed hole FH3 on a wafer. In other words, the dose was not high enough to pull all the fluctuations of FH3 below the threshold for clearing. On the other hand, the fluctuation amplitude of FH4 does not breach the clearing threshold Th1, thus a through hole is printed on the wafer. Since holes FH3 and FH4 were exposed at the same dose, the fluctuation amplitude of the chemical composition in a resist layer is a determining factor whether a hole is closed or open. This fact may be decoupled from additional stochastic details such as the number of photons absorbed or number of photoacids formed within the hole volume.

In FIG. 5C, holes FH5 and FH6 are exposed with a relatively higher dose than the other examples and both holes clear to the bottom of the resist layer. The spatial distribution of the polymer blocking level of the resist layer stays below the threshold Th1 for both FH5 and FH6 thereby forming an open hole on a wafer subjected to the patterning process. It should be clear from these examples though that if a hole occurs with greater stochastic fluctuations than shown in these examples, it could be closed even at this higher dose.

At a particular dose there will be a mean spatial distribution of blocked polymer having a random variation, as different holes will experience different stochastic fluctuations. For example, mean values AVG1, AVG2, and AVG3 of blocked polymer, as shown in FIGS. 5A-5C. Changing the dose values affect the mean value of the blocked polymer level but, to a good approximation, not a fluctuation amplitude of the blocked polymer. A fluctuation amplitude refers to an amount of variation in the blocked polymer at a particular location across the resist layer.

Hence, although desired dose values may be determined, for example, by simulation of patterning process, to generate desired patterns or features on a wafer, the stochastic variations of the resist layer may cause undesired results (e.g., defective patterns such as closed holes, merging holes, missing holes, etc.) thereby reducing the yield of the patterning process. The present disclosure presents methods to model and account for such stochastic variations in the resist layer so that appropriate process window, OPC or other measures may be applied based on failures or defects resulting from the stochastic variations. For example, in an embodiment, a method of FIG. 6 or a portion thereof may be applied as a part (e.g., as a part of the resist model) of the simulation of the patterning process to determine OPC, optimize process window, source optimization, mask optimization, source-mask co-optimization, etc.

Figure 6:
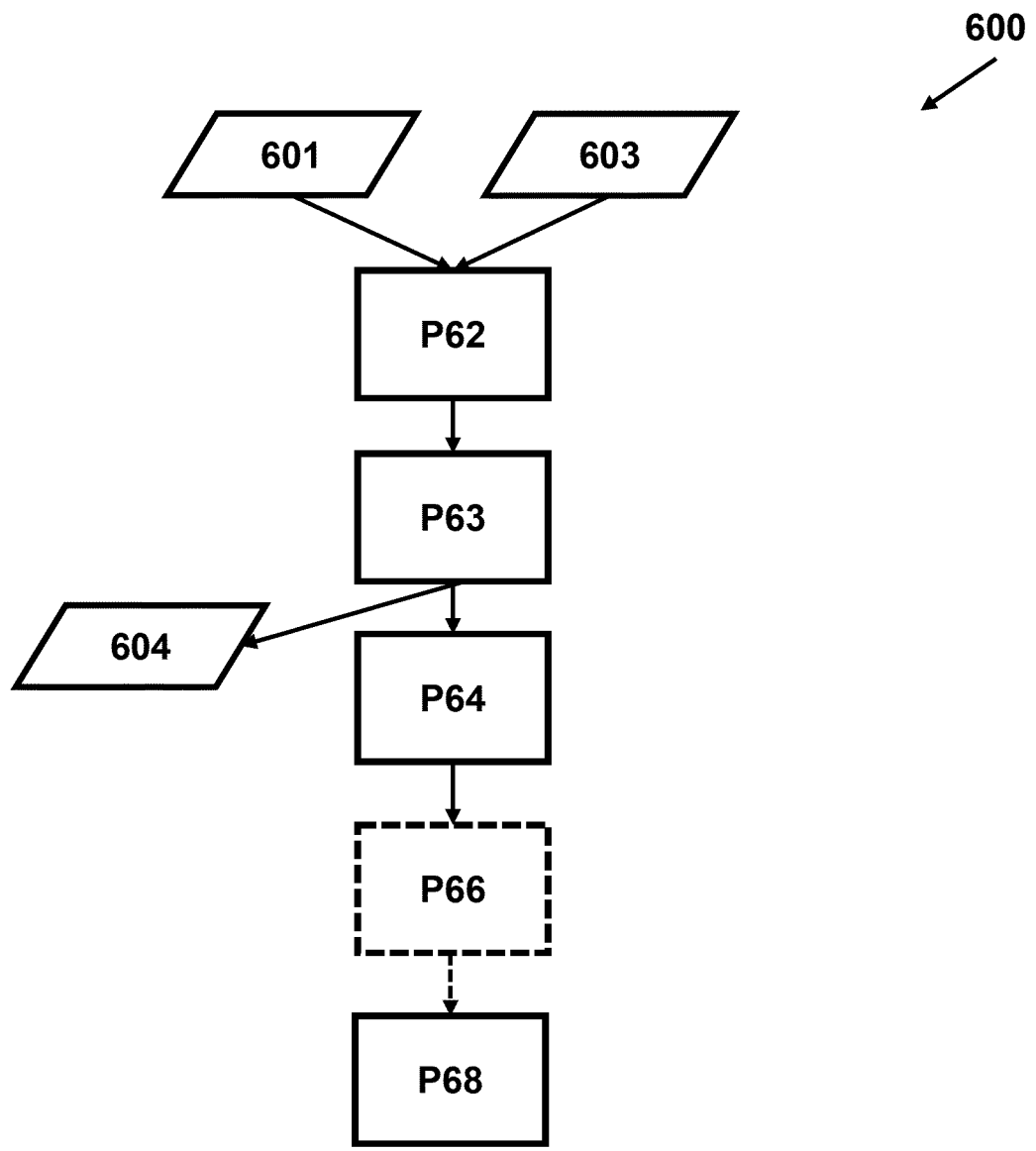
FIG. 6 is a flow chart of a method for determining a failure model of fluctuations in the resist layer, according to an embodiment.

FIG. 6 is a flow chart of a method 600 for determining a failure model (e.g., a Gaussian model) that describes failure due to fluctuations (e.g., in 410 of FIG. 4) in the resist layer or failures associated with resist layer in general. In an embodiment, the failure may be stochastic in nature or other resist related failure such as lines falling over or etch failure if the resist has gotten too thin. In an embodiment, the failure model can take an image (or intensity values therein) and dose values as input and predict a failure rate based on such intensity and dose values. The image may be obtained from simulation of the patterning process such as simulation of an aerial image model (in FIG. 2) or a blurred image using a desired pattern to be imaged on a wafer and including details of the patterning process to produce an accurate image.

The failure model can be calibrated and extrapolated based on measurement data or simulation data obtained at certain patterning conditions such as extreme conditions such as under exposed conditions represented by, for example, very low dose values (compared to nominal dose), or low intensity values (compared to nominal value). Such "off-nominal" conditions produce quantifiable failure rates—failure rates may be too low to measure at nominal—and the goal is to be able to extrapolate the model to make useful predictions at the desired nominal condition and at alternative interesting conditions.

In an embodiment, the failure model is a function of a product of dose and intensity of an aerial image (or the blurred image) and is configured to predict a failure rate of a feature. In an embodiment, the failure model is a stochastic model which is a function of a stochastic variable (e.g., failure rate) and the product of dose and intensity. In an embodiment, the stochastic model is based on a probabilistic model such as a Gaussian model whose parameters such as mean and variation/standard deviation (represented by sigma) are determined based on fitting of simulation or measurement data associated with a resist process. For example, fitting is based on measured failure data obtained for a fixed resist process and one or more pattern features in a useful dose range under well characterized optical and process conditions.

The method 600, in process P62, involves obtaining measured values 601 of a pattern failure (e.g., a failure rate) of a failure of feature on a printed substrate subjected to a patterning process through a range of dose values. The dose values may be obtained for a particular failure such as closed holes, missing holes, etc. from a metrology tool (e.g., SEM). In an embodiment, such failure rate data is observed or obtained at underexposed conditions such as a low dose value. Furthermore, an image intensity values 603 for the feature are obtained via simulating a process model using the range of the dose values. In an embodiment, the image intensity value is a peak (or a blurred) image intensity that is used as a multiplier of the dose to fit the failure model.

The method, in process P63, involves determining, via fitting the measured data 601 of the pattern failure to a product of the dose values and the image intensity values 603, a failure model 604 that models a stochastic behavior of spatial fluctuations in the resist.

In an embodiment, the metrology data may include a wafer image generated from the design pattern. Patterns on the wafer image may be extracted using a contour extraction software and further design rules may be applied to determine defects or failure of a feature in the wafer image. If a defect is found, then the values of image intensity may be obtained from the simulation of lithographic models data. In an embodiment, the values of image intensity are obtained via a lithographic model of the patterning process to compute the resist process for a design pattern. The simulation outputs a resist image that may be further analyzed to determine/detect defects/failures, and for each failure corresponding dose and intensity values may be stored in a database.

Process P64 involves applying, via a processor (e.g., a processor 104), the values of dose and intensity to a failure model configured to predict a value of a pattern failure, where the failure model models resist composition fluctuations of the resist layer as a function of the dose and the intensity. In an embodiment, applying the values of dose and intensity to the failure model involves predicting, via simulation of the failure model using the values of the dose and intensity, the value of the pattern failure (e.g., a failure rate of a feature) affected due to the fluctuations in the resist layer. In an embodiment, the intensity values are collected at a center of a feature, for example, a center of a hole.

The fluctuations or the stochastic variations in the resist layer may affect a feature printed on a substrate, as mentioned earlier with respect to FIGS. 4A-4B and 5A-5C. The effects of the fluctuations are captured via the failure model in terms of a measurable variable such as failure rate. The present disclosure is not limited to a particular pattern failure, a person skilled in the art may modify the methods to any appropriate variable related to the patterning process. In an embodiment, the failure model is a probabilistic model whose parameters are fitted using a product of dose and intensity values obtained from measurement data or simulation data.

In an embodiment, physically the model is based on the amount of light at feature center (e.g., peak intensity*dose applied at the scanner). But other quantities are strongly correlated with peak intensity (e.g. normalized-image-log-slope, NILS) and dose is strongly correlated with hole size/CD. So it is possible to reformulate this model in terms of dose*NILS or make a less powerful version based on CD. A Gaussian model could be fit to dose*NILS and be applied to other conditions (focus, source shape, pattern details, etc.) similar to that discussed with respect to the product of dose and intensity (i.e., dose*intensity). A Gaussian model could also be fit to CD (probably most intuitive to lithographers) but it may have limited extrapolatability to other conditions.

In an embodiment, the probabilistic model is a Gaussian function fitted based on a product of the values of dose and intensity. The Gaussian function comprises at least two fitting parameters including mean and standard deviation (or variance). The Gaussian function or the Gaussian model uses the dose and intensity values associated with the measured failure conditions as input, and fits the model parameters. The interpretation is that the measured failures are due to resist stochastic compositional variations which can be approximately matched by Gaussian fluctuations. The model can be used to make predictions for failure rates at alternate conditions by substituting appropriate values for the image intensity and dose. Such failure rate information may be further used for adjusting, for example, OPC, process window, etc. of the patterning process to improve the yield of the patterning process. The adjusting may be part of a process optimization process of the lithographic simulation. For example, assist features may be added around the design pattern to reduce the failure rate of a feature within the design pattern, thereby improving the yield (i.e., reduced number of failures of a feature) of the patterning process. Examples of optimization process are discussed with respect to FIGS. 13-16 later in the disclosure.

In an embodiment, the failure model may predict values of the pattern failure including a failure rate of a feature after the resist process. In an embodiment, the pattern failure may be any variable related to resist process that is related to the dose and intensity of the patterning process that leads to defective patterns to be printed on the substrate. In an embodiment, a failure of a pattern is at least one of: a hole closure, a space closure, a missing hole, merging holes, and a line breaking. In an embodiment, the failure of the feature is dependent on an amount of light (e.g., measured in terms of dose) at a center of the feature center and an amplitude of the compositional fluctuations of the resist layer. The amount of light at the center of the feature varies as a function of dose and image intensity (e.g., a peak value of an aerial image intensity) thereby affecting the development of the resist of the wafer. In an embodiment, the image intensity is determined from an aerial image generated by simulation of lithographic models (e.g., as discussed in FIG. 2). It will be recognized by one skilled in the art that many commonly measured image parameters are strongly correlated and so alternate image parameters (such as NILS or contrast) which are highly correlated with peak image intensity may similarly be used as variables as in the model formulation, as discussed above. Accordingly, the failure model can be configured as a product of dose and NILS.

In an embodiment, the image intensity is blurred image intensity, where blurred image intensity is a function of resist process of the patterning process. The blurred image intensity is determined by convolution of the aerial image with a function which approximates the performance of the resist process. The appropriate function is the one that alters the optical image to best match the behavior of the resist process on the wafer. In an embodiment, this may be another Gaussian function which is fitted to match wafer or simulated CD values, the best Gaussian convolution width taken as the effective "blur" of the process. In an embodiment, the blurred image may be considered as a variable during fitting of failure data related to a failure of a feature. As discussed herein, the failure data may be obtained from a printed wafer. In an embodiment, the blurred ILS ($ILS_B$) is the image log slope (ILS) (or normalized ILS) having a spatial blur applied thereto (e.g., by convolution with a Gaussian distribution), such that a blurred ILS has less contrast/slope than the unblurred aerial image. The spatial blur may represent blur of the applied optical image due to diffusion of a chemical species generated in a resist layer by exposure to radiation. In an embodiment, a blurred image may be generated (e.g, by convolution within another Gaussian distribution) to characterize stochastic effects of a mask manufacturing process.

In an embodiment, the failure model is calibrated at extreme patterning conditions that are unlikely to occur, but nevertheless results in a defective pattern. Further, the calibrated model may be extrapolated (e.g., in process P66) to predict the pattern failure (e.g., failure rates) at nominal process conditions. In an embodiment, the calibration of the failure model involves comparing values of the pattern failure (e.g., failure rate) with the measured values of the pattern failure to reduce a difference between the predictions of the failure model and the actual measurements. In another embodiment, the calibration of Gaussian function is discussed with respect to FIG. 10 and FIGS. 7A-7C, where the parameters of the Gaussian function are determined based on fitting the Gaussian function to a product of dose and intensity values.

Figure 7A:
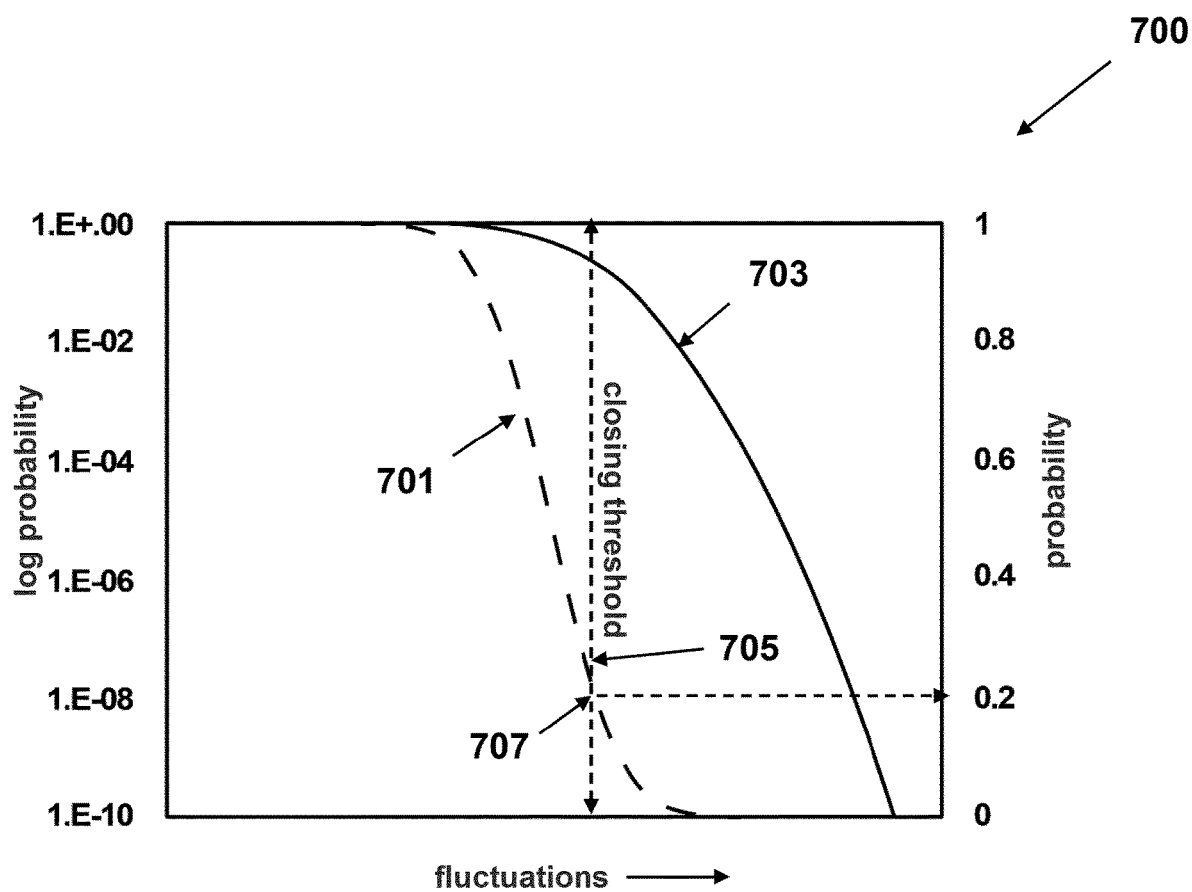
FIGS. 7A-7C, where the parameters of the Gaussian function are determined based on fitting the Gaussian function to a product of dose and intensity values, according to an embodiment.

FIG. 7A illustrates a plot 700 representing an example relationship between fluctuations in a resist layer at a particular dose and probability of failure of a feature such as a contact hole. The plot 700 illustrate a probability distribution 701 (or a log probability distribution 703) given by a Gaussian function based on a product of dose and intensity values at a first dose (e.g., lower than nominal dose) and how it varies as a function of fluctuations (horizontal axis) such as blocking level of a resist. In the absence of the stochastic variation, the curves would have vertical steps corresponding to a single clearing dose. The plot 700 also includes a threshold 705 (e.g., in terms of blocking level of resist) for determining whether a feature (e.g., contact hole) will be printed without a failure or a defect. For example, a resist process comprises a threshold blocking level (e.g., 410 discussed with respect to FIGS. 4A-4B) beyond which a pattern may be blocked or under developed causing a failure of a feature. According to FIG. 7A, the Gaussian function predicts that the probability of failure of the feature at the first dose is approximately 20% an intersection point 707 between the curve 701 and the threshold 705.

Similar to plot 700, another plot 710 (in FIG. 7B) may be determined based on dose and intensity values obtained at a higher dose value around a nominal dose. The plot 710 illustrates that a probability distribution curve 711 (or a log probability distribution curve 713) given by the same Gaussian function, shifted left from the previous example (in FIG. 7A) because of greater average polymer deblocking. The probability of failure due to resist fluctuations at this second dose is approximately 2%, as shown an intersection point 717 between the curve 713 and the threshold 705.

Similar to the plots 700 and 710, yet another plot 720 (in FIG. 7C) illustrates a probability distribution curve 721 (or a log probability distribution curve 723) given by the same Gaussian function for a dose higher than that used for 700 and 710. For example, the probability of failure due to resist fluctuations this third dose is approximately 0.05%, as shown by an intersection point 727 between the curve 723 and the threshold 705.

Thus, probability distribution curves 701, 711, and 721 (or 703, 713, and 723) can be determined at different dose values and for different features such that the curve will pass through the measured failure rates (e.g., 20%, 2%, 0.05%, etc.) using a single Gaussian function.

Figure 7B:
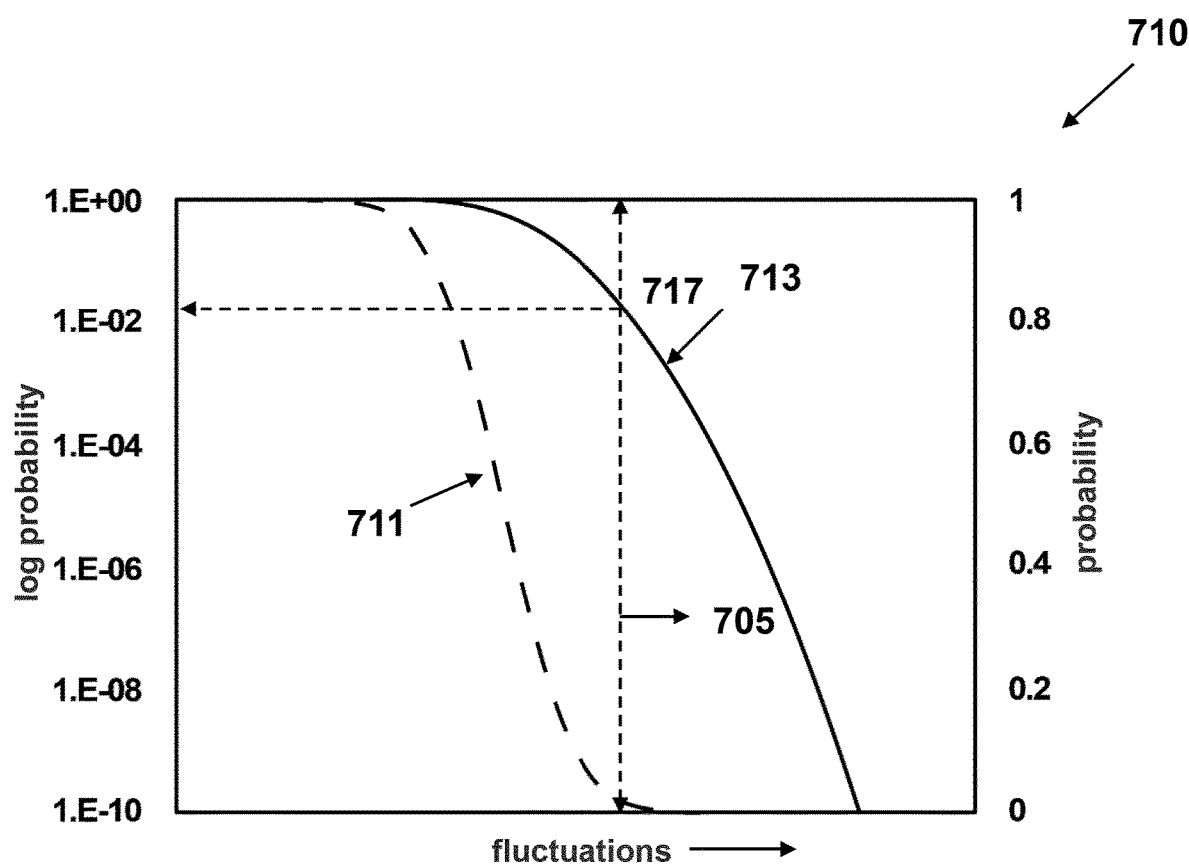
Figure 7C:
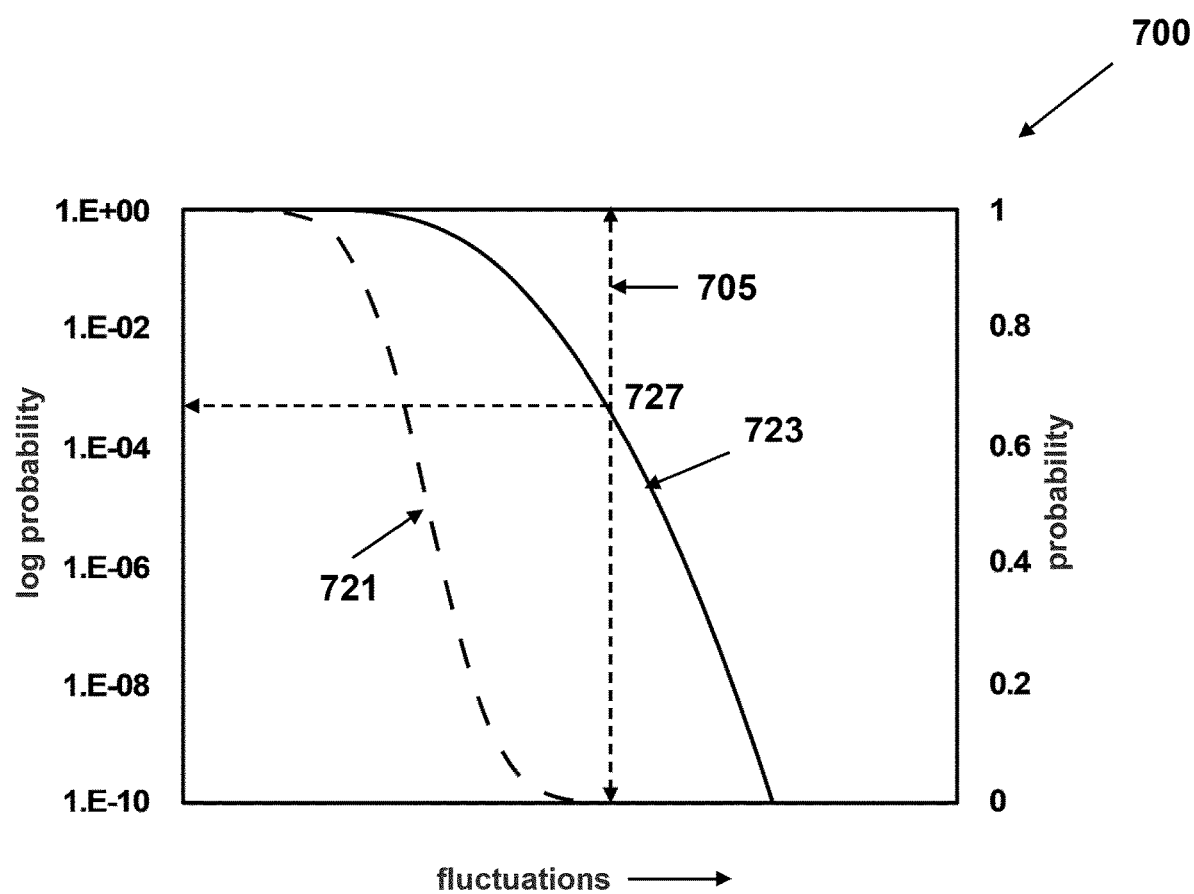
Figure 7D:
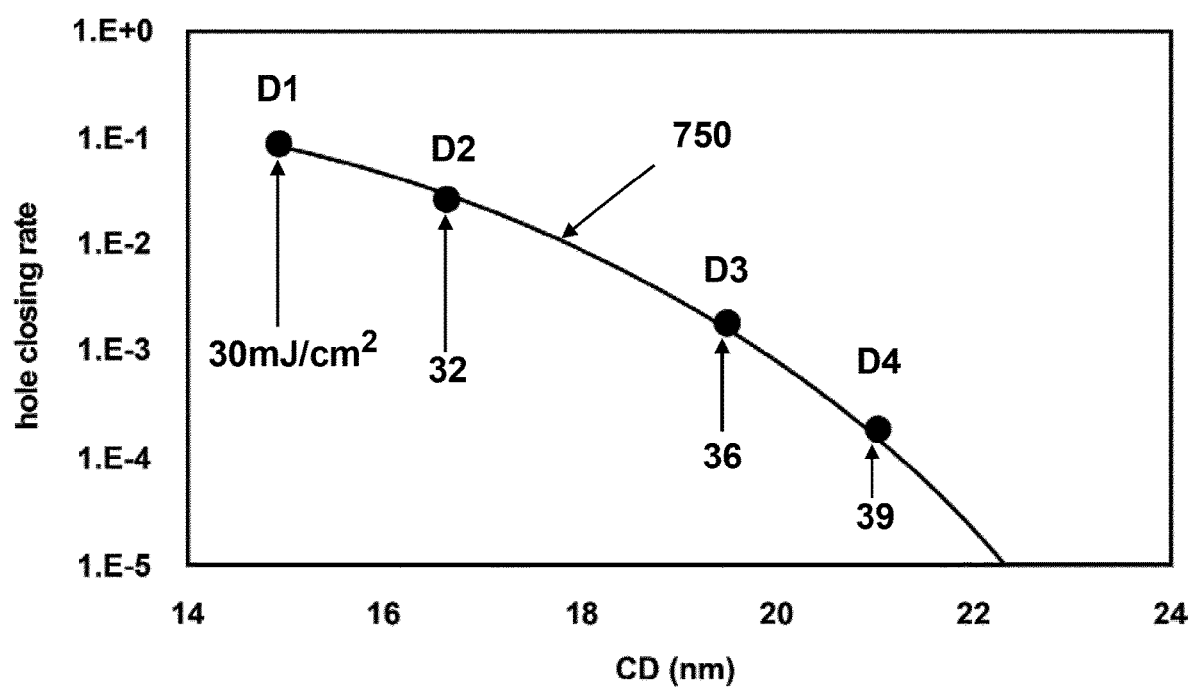
FIG. 7D illustrate use of a single Gaussian function used with respect to CD of the patterning process, according to an embodiment.
Figure 8:
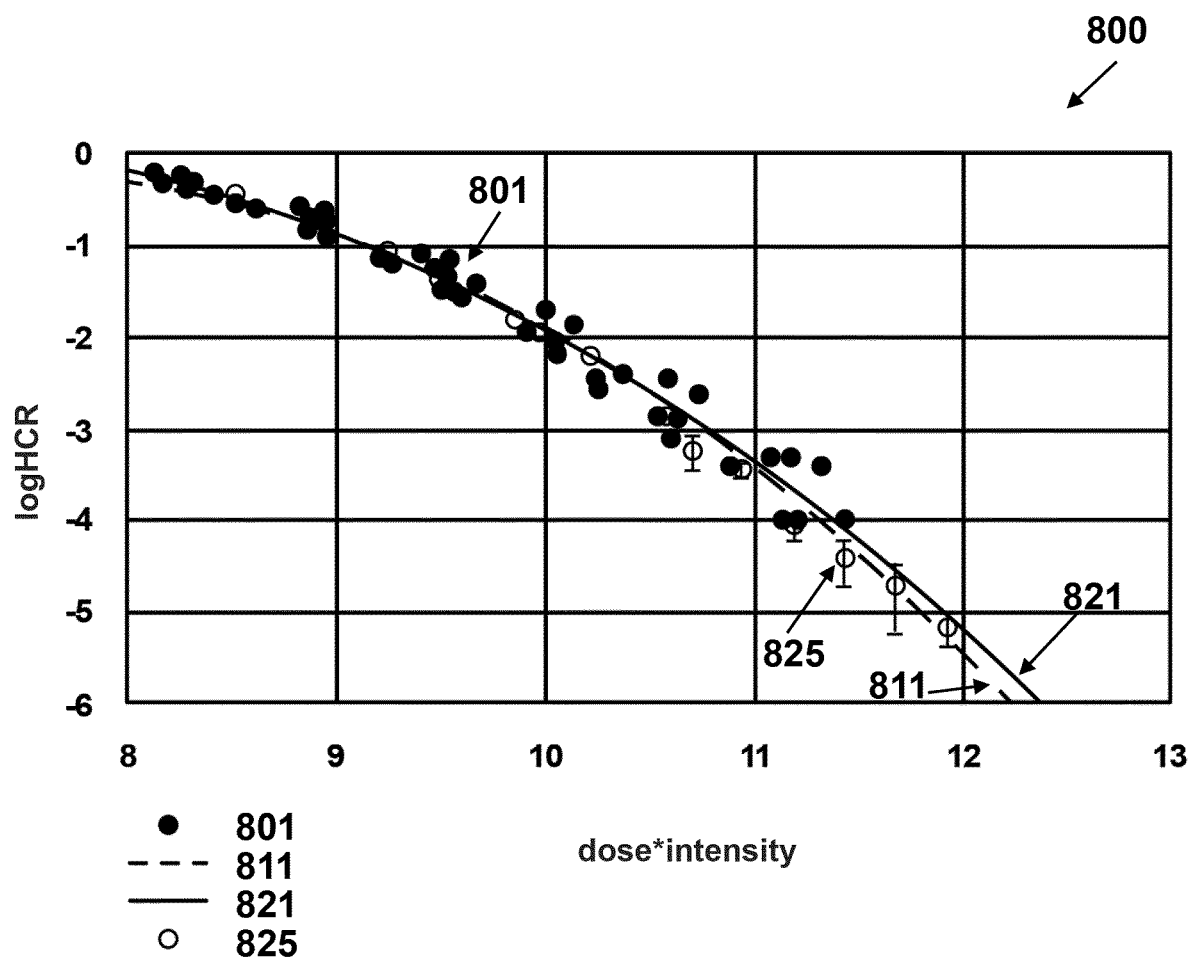
FIG. 8 illustrate an example of a Gaussian fit function of calibrated failure model for a hole closure type of failure, according to an embodiment.

Based on a relationship between probability of failure (or failure rate of a feature) and dose*intensity, two parameters such as mean and variation of the Gaussian curve can be determined, for example, via data fitting methods. FIG. 7D illustrates another example that more clearly shows how a single Gaussian function 750 fitted based on failure rate and (dose*intensity) pair that can be used with respect to other related parameters (e.g., CD) of the patterning process. For example, the Gaussian function 750 describes a failure rate (e.g., Hole closure rate) for different dose values D1, D2, D3, and D4. The Gaussian function 750 is fitted according to the present disclosure and is shown here as a plot of failure probability vs. hole size. The curve can be further extrapolated as discussed below.

In an embodiment, the process P66 involves extrapolating, via simulation of lithographic model, a calibrated failure model to relatively low failure conditions associated with a high volume manufacturing (HVM) process. In an embodiment, the extrapolating of the failure model is based on data from under exposed condition and/or over exposed condition at nominal focus of the patterning process. In an embodiment, the data for extrapolation is obtained from measurement on a printed wafer or simulation of the lithographic model, where the exposure is varied to generate the under exposed condition and/or the over exposed condition.

FIGS. 8 and 9A-9C illustrate example fits 800, 900 and extrapolates the calibrated failure model for a hole closure type of failure, discussed above. In an embodiment, data 801 is obtained from measurements on a printed wafer or simulation of lithographic models (e.g., Prolith software) for different process conditions such as different features, source, focus, dose and intensity values. Further, an example Gaussian model 811 is fitted to the data 801, where the fitting is based on a product of dose and intensity values. In an addition, for illustration purposes, a different model such as a multi-parameter non-probabilistic model 831 such as a polynomial model having 3-parameters may be fitted using the predicted data 801, where the fitting is based on a product of dose and intensity values. Further, additional data points with low hole closure rates (HCR) 825 are included to verify the goodness of fit of the Gaussian model 811 and the 3-parameter model 821. The predictions of the Gaussian model 811 may be more trustworthy compared to a polynomial fit model, since the Gaussian model 811 more accurately captures the physics of fluctuations in the resist process, as the characterizing terms of a product of dose and intensity more accurately captures the resist process fluctuation effect as discussed earlier.

Figure 9A:
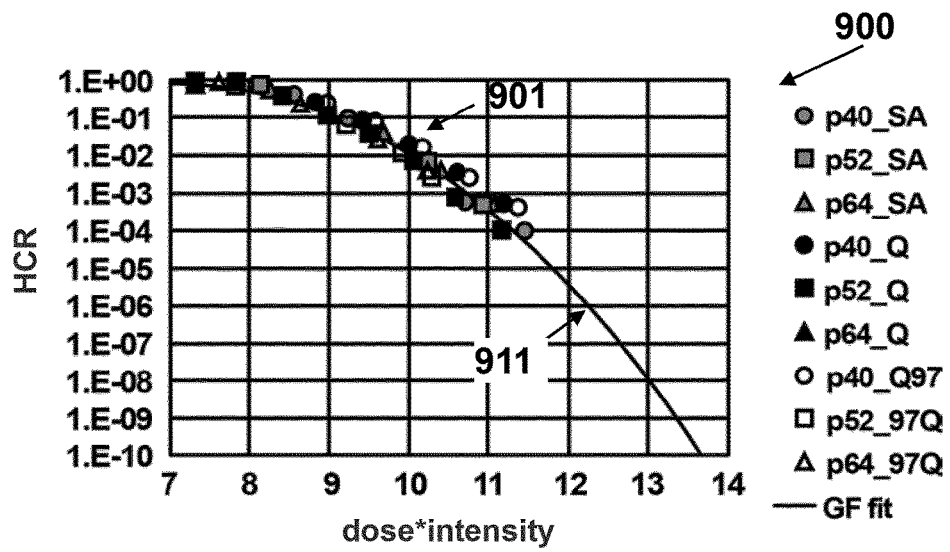
FIG. 9A illustrate a Gaussian fit model for hole closure rate(HCR) and its extrapolation, according to an embodiment.
Figure 9B:
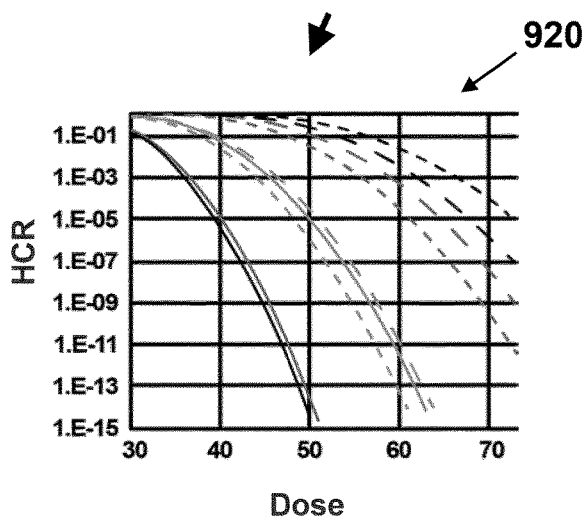
FIGS. 9B and 9C illustrate stochastic variation into CD and dose dependent stochastic variation, respectively, according to an embodiment.
Figure 9C:
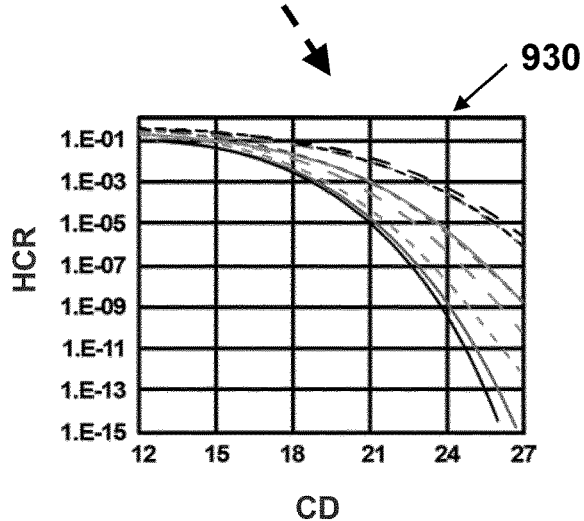

In an embodiment, a Gaussian model (e.g., for HCR) may be developed (in a similar manner as discussed in FIG. 6) by collecting data for one process condition such as one mask pattern and one illumination mode and can be generalized to match the failure rates with other masks and sources. FIG. 9A illustrates different features (e.g., features with different pitches, CD values, etc.) and illumination settings, however, the model 911 is independent of features and illumination settings. Furthermore, the model 911 can be converted (e.g., using the known CD vs dose relationships) to more useful CD and/or dose dependent HCR plots such as 920 and 930 of FIGS. 9B and 9C, respectively.

Furthermore, process P68 involves using the predicted value of the pattern failure for adjusting, via the processor, a parameter of the patterning process. For example, the failure model may be executed for a particular dose and intensity values to predict a failure rate (e.g., closed hole) of a feature. In an embodiment, the adjusting of a parameter of the patterning process involves determining the value of the pattern failure via simulation of the lithographic model and the failure model using the values of the dose and intensity; and adjusting a value of the parameter of the patterning process such that the value of the pattern failure is reduced. As mentioned earlier, the parameter of the patterning process is dose, focus, source shape, numerical aperture and optical proximity correction. In an embodiment, the adjusting a value of the optical proximity correction of the patterning process involves placement of assist features relative to a main feature of the design pattern. In practice the model 911 allows to understand how the failure rate will change upon varying different process parameters. In an embodiment, a goal may be to achieve a lowest possible failure rate or may be to map out a parameter space so a trade-off between failure rate and some important parameter such as wafer throughput or aberration sensitivity may be analyzed.

Figure 10:
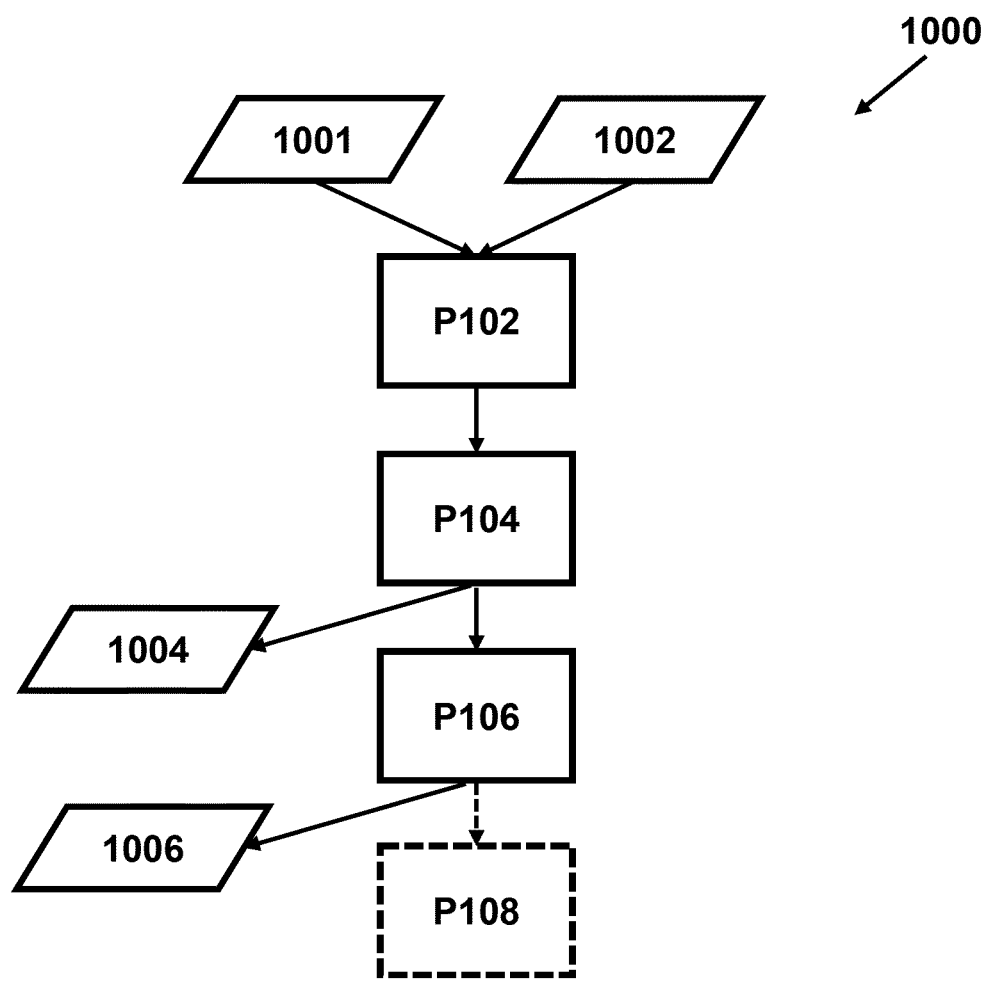
FIG. 10 is a flow chart of a method of calibrating a failure model for a resist layer, according to an embodiment.

FIG. 10 is a flow chart of a method 1000 of calibrating a failure model configured to predict fluctuations (e.g., as discussed FIGS. 4A-4B and 5A-5C) in spatial distribution of the resist or chemical composition after exposing the resist in a resist layer. In an embodiment, the failure model is similar to that discussed with respect to FIG. 6. The calibration is based on measured data 1002 related to a variable (e.g., failure rate, CD, etc.) of a resist process as discussed below. As discussed earlier, FIGS. 7A-7C illustrate example calibration of the failure model using a Gaussian function. However, the method 1000 can be applied to any other probabilistic model.

The method 1000, in process P102 involves obtaining measured values 1002 of the patterning process. In an embodiment, the measured values 1002 of the patterning process are associated with a failure in a resist layer, where the failure is represented in terms of a pattern failure, as discussed earlier with respect to the method 600, and illustrated in examples of FIGS. 7A-7C. Further, in an embodiment, predictions 1001 of resist process from simulation of a lithographic model of the patterning process may be obtained that are calibrated to the measured values 1002.

The measured values 1002 of the patterning process includes, but not limited to, dose, focus, pattern details (e.g., mask CD and pitch) and source shape as input conditions. Furthermore, resist CD and failures rates may be measured from the printed wafer. The measured values 1002 may be obtained from metrology tool of the lithographic apparatus and/or SEM tool used for measuring, for example, patterns printed on the wafer. In an embodiment, the measured values 1002 may be related to a pattern failure (e.g., failure rate) associated with a feature of the resist pattern and a particular failure type such as closed hole, bridging, line break, necking, or other defect of the feature. In an embodiment, the values of image intensity may be obtained at a center of a feature to be printed on a wafer with a simulator. In an embodiment, the image intensity values can be obtained from a simulator based on the measured values of focus, pattern details, and source shape. The relationship between CD and dose can be measured from the wafer data and may be calibrated by a separate model calibration so that CD can also be predicted as process parameters such as dose, focus, mask pattern, source shape are varied.

In an embodiment, the failure model is a probabilistic model configured to predict the values of the pattern failure, as mentioned earlier in FIG. 6. The value of the pattern failure comprises a failure rate of a failure of a feature upon exposure of the resist layer. The predictions comprise a failure rate of a feature in the resist layer obtained via simulation of the failure model.

The method 1000, in process P104 involves calibrating the failure model based on the measured values 1002. An example of calibrating the failure model is discussed earlier with respect to FIGS. 7A-7C, where the data used for fitting comprises measured values 1002. In an embodiment, the calibrating the failure model involves fitting the probabilistic model based on a product of the measured values of dose and intensity. In an embodiment, the probabilistic model is a Gaussian function comprising at least two fitting parameters, where the fitting parameters are mean and variance (or standard deviation), as illustrated in FIGS. 7A-7C. According to some examples of the present disclosure, the fitting may be illustrated based on simulation based data for demonstrating the concepts of the present disclosure. However, it is desirable to fit models of the present disclosure based on measured data, since such data more accurately captures variations of the patterning process thereby resulting in a more accurate models.

The calibration process is an iterative process involves adjusting the parameters of the failure model till a convergence criteria or a stopping criteria is reached. For example, the stopping criteria can be an error between the predicted failure rate and the measured failure rate. At the end of the calibration process P104, a calibrated failure model 1004 is obtained. In practice, the failure model may be calibrated to best match measured wafer CDs (e.g., obtained from varying dose and focus) and the measured edge variation (e.g., line edge roughness (LER), local CD uniformity (LCDU), etc.).

Further, the calibrated failure model 1004 may be integrated in a lithographic model. In an embodiment, process P106 involves integrating the calibrated failure model with a blurred image model to enable the blurred image model to predict a failure rate of a failure of a feature. In an embodiment, the blurred image model may be configured to predict LER or LCDU depending on the data used for fitting the calibration model. Blurred image refers to a predicted resist image. In an embodiment, the blurred image may be obtained from convolution of an aerial image with a Gaussian function that represents a resist process.

As mentioned earlier, the lithographic model may be an optical proximity correction model, a full physical model, and/or the blurred image model.

Furthermore, as mentioned with respect to FIG. 6 and examples in FIGS. 8 and 9A-9C, for example, extrapolating the calibrated model 1004 involves examining the fit curve in regions of low failure rates which will be associated with high volume manufacturing conditions. The extrapolating of the calibrated model 1004 is based on data from under exposed condition and over exposed condition at nominal focus of the patterning process such that failure rates are reliably measurable. The resulting extrapolated model 1006 may be further used, in process P108, for predicting failure rates of a feature at nominal conditions typical of a normal patterning process. Such predictions can be highly valuable since, actual wafer measurements of very low failure rates is highly time consuming and may be infeasible.

Figure 11:
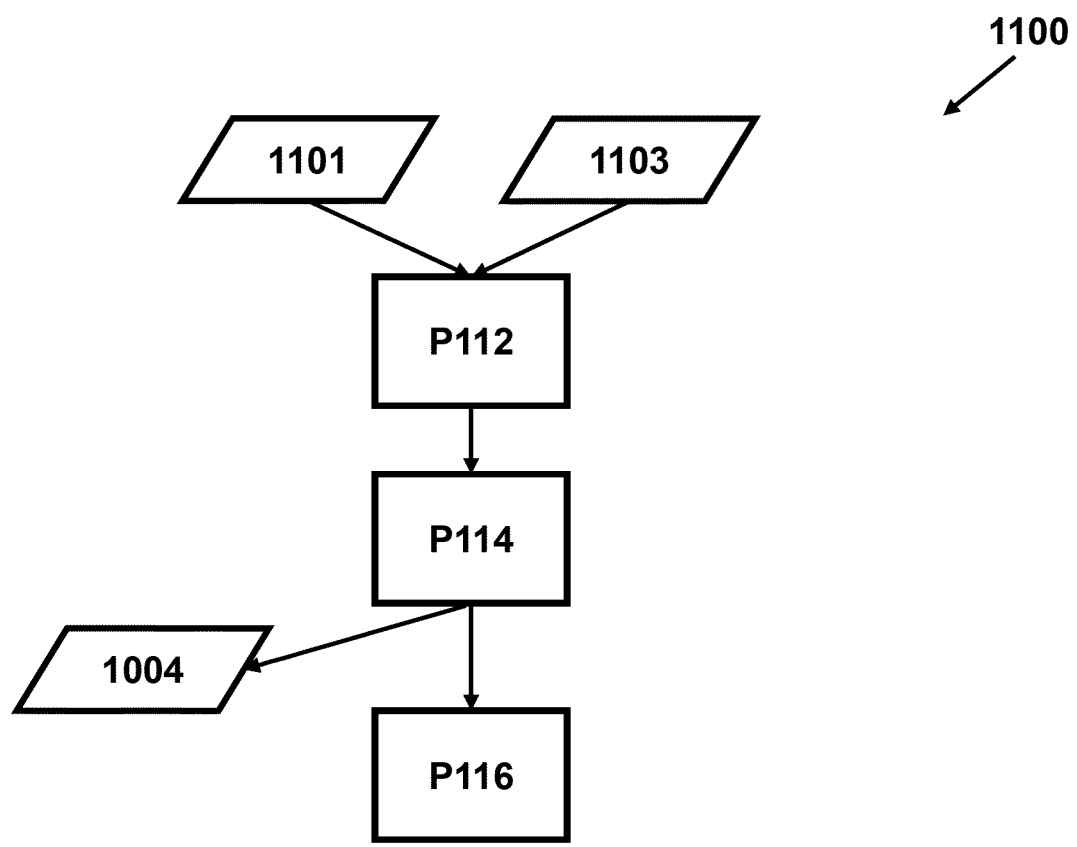
FIG. 11 illustrates a flow chart of a method for adjusting a model parameter based on a calibrated failure model, according to an embodiment.

FIG. 11 illustrates a flow chart of a method 1100 for adjusting a model parameter based on a calibrated failure model (e.g., a Gaussian model) discussed in the methods 600 or 1000 above. The method, in process P112 involves obtaining values of dose 1101 and intensity 1103 for a resist process of a patterning process, for example, during a pattering process or HVM. Furthermore, process P114 involves obtaining a failure model 1004 configured to predict a value of a pattern failure based on the values of dose 1101 and intensity 1103.

Furthermore, process P116 involves adjusting a parameter of the patterning process based on the value of the pattern failure predicted by the failure model (e.g., the Gaussian model). For example, as discussed in P68 of FIG. 6, the failure model may predict a failure rate of a feature based on the dose 1101 and intensity 1103 of an on-going patterning process. Based on the predicted failure rate of the feature, adjustment of parameters may be determined using lithographic simulations. For example, dose and focus values may be adjusted so that the predicted failure rate is reduced for subsequent processing of a wafer during the patterning process.

The above methods may be applied to any type of stochastic failure and not limited to a particular feature or a particular failure type. Each failure will have a different characteristic and the way it develops in the resist. The failure model for each such feature and related failure types may be developed. For example, FIGS. 12A-12D illustrate an example of kissing or merging hole defect and its development in the resist.

FIG. 12A is a portion of a pattern 1200 having four contact holes H1, H2, H3 and H4 having gaps g1, g2, g3, and g4 between adjacent holes as shown. The pattern 1200 may be an aerial image or a design pattern that may be printed in a resist layer of a wafer. The pattern 1200 may be used as an input to the lithographic model simulation. In particular, the pattern 1200 (e.g., square holes) or associated design pattern on a mask is the input to a simulator. Then, an aerial image corresponding to the pattern 1200 may be simulated thereby projecting the mask image on to a photoresist-coated wafer which is then processed (baked and developed) to produce the wafer pattern.

FIG. 12B is a blurred image 1210 of the pattern 1200 (of FIG. 12A), which can be obtained from lithographic simulation or convolution of an aerial image with a Gaussian function, as discussed in methods 600, 1000, or 1100. In an embodiment, the blurred image 1210 approximates the pattern printed on the wafer if selected at the appropriate image threshold. The blurred image 1210 shows that: hole H1 can fail by merging with another hole on two edges in gaps g1 and g4; holes H2 and H4 can fail on three edges in gaps g3, g4, g5 and g8; and hole H3 can fail on four edges gaps g2, g5, g6, and g7. The failing of the holes on the edges refer to merging of the adjacent holes when the resist is exposed and processed. The gaps g1, g2, g3, g4, g5, g6, g7 and g8 are saddle points in the aerial image. In an embodiment, a minimum image intensity is slightly different for all the different saddle points but can be approximated as 0.072 units for first set of saddles (e.g., g1 and g4) and 0.077 units for a second set of saddles (e.g., g2 and g3) in this example.

An example image intensity distribution or intensity profile along a cut line 1215 is illustrated in FIG. 12C. As shown, the image intensity is relatively high (or maximum) at a center of the hole H3 and gradually decreases away from the hole to a relatively low value (or local minima) at the gap g2.

When the image intensity such as intensity profile 1215 is incident on the resist layer, holes such as H1-H4 develop non-uniformly, as discussed earlier. Similarly image intensity differences in the gaps will result in differences in adjacent holes interactions such that the gaps g1-g8 will fail at varying rates.

Figure 12D:
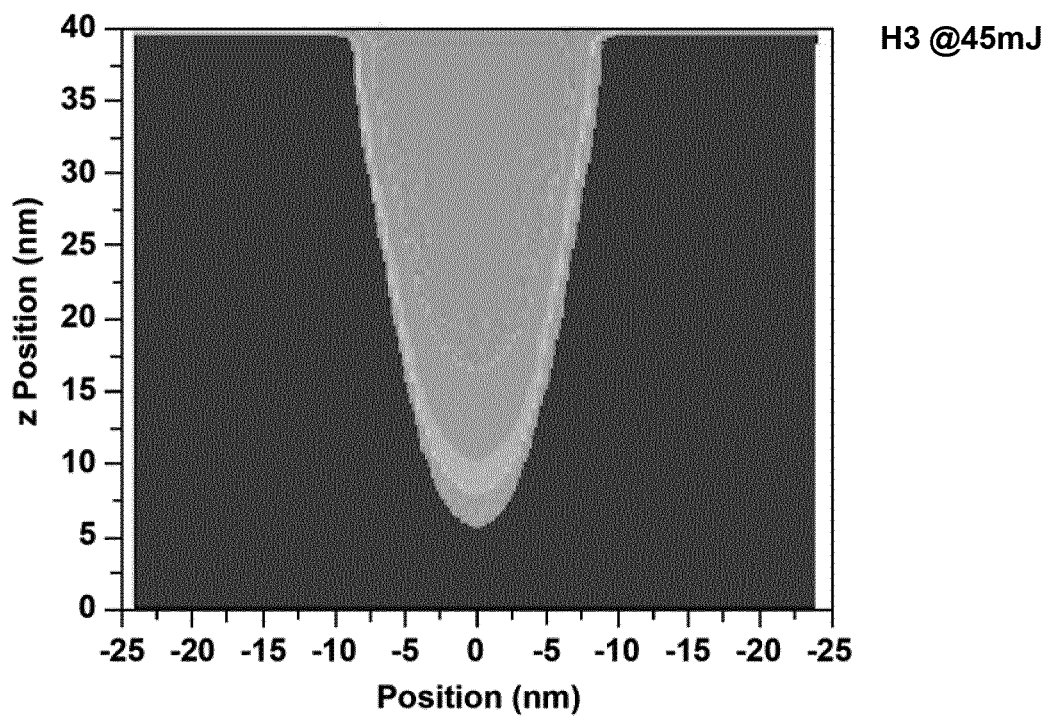
Figure 12E:
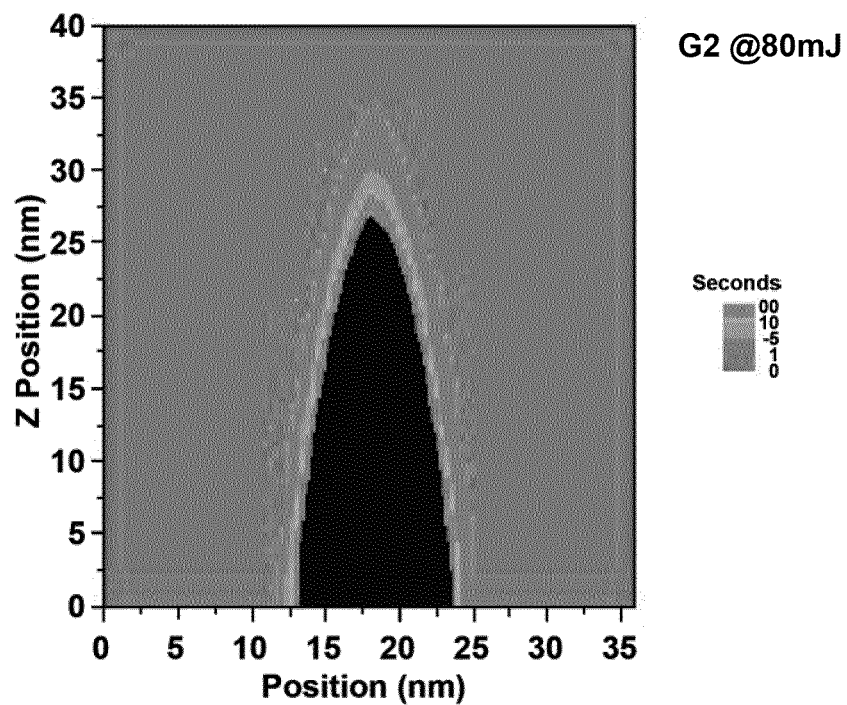
FIG. 12E illustrate example resist development at a gap, according to an embodiment.

FIG. 12D illustrates a cross-section at a center of the hole H3 that shows how the resist development occurs with time evolution for the hole H3 at dose of, for example, 45 mJ/cm$^2$. The hole may be cleared or closed depending on an effective dose at hole center, fluctuations in the resist layer, and a vertical development along the thickness of the resist layer influenced by fluctuations in the resist composition after exposure and bake. The vertical development may be incomplete and result in a closed hole. However, simultaneously with the vertical development of the hole through the resist, the resist development at the gap is also happening, as shown in FIG. 12E and such development in the gap is also affected by the dose*gap intensity and stochastic fluctuations in the resist layer therein. Thus, analogous to the hole closing, merging also is based on development clearing between the holes and may also depend on dose*intensity at a saddle point.

For example, development at a saddle point e.g., a gap g2 is illustrated in FIG. 12E, a cross-section at the gap g2. The cross-section shows how the resist development occurs with time evolution for G2 at dose of 80 mJ. Because the gaps represent image saddle points, non-vertical development can also contribute to a gap's top loss. In an embodiment, with a relatively higher exposure at either side of a gap's center, the top erodes faster than with vertical development, which contributes to merging holes' type of failure.

In an embodiment, the failure due to hole merging can be characterized by a failure model based on, for example, the product of dose and intensity approach, as discussed in methods 600, 1000, and 1100 for all saddles.

For example, a failure of a first set of saddle point (e.g., g1 and g4) may be characterized by a failure model represented as PSF=1−GF(dose), where GF(dose) is a Gaussian function computed as function of a normal distribution Normdist(dose*intensity, m, s) and a product of dose and intensity. For example, GF(dose) equates to 1−Normdist (dose*intensity, m, s), where m and s are mean and standard deviation parameters fitted based on data related to the first set of saddle points.

Similarly, a failure of the second set of saddle point (e.g., g2 and g3) may be characterized by a failure model represented as ISF=1−GF(dose), where GF(dose) is Gaussian function computed as function of a normal distribution Normdist(dose*intensity, m, s) and a product of dose and intensity. Thus, although one Gaussian model (i.e. one set of fit parameters) for the process and hole merging is used, the failure probability for each hole changes because the image intensity values may be different at each saddle point and the number of failure possibilities depends on the number of neighboring holes.

Then, the probability of the merging hole failure can be computed as a function of probabilities associated with the first set of saddle points (e.g., g1, and g4) and the second set of saddle points (e.g., g2 and g3) around the holes. For example, the merging failure probability can be calculated as follows: (i) for hole H1, the probability is PSF*PSF, (ii) for holes H2 and H4, the probability is PSF*PSF*ISF, and (iii) for hole H3, the probability is ISF*ISF*ISF*ISF.

In an embodiment, a single Gaussian model may be fitted according to present disclosure for different types of hole failures such as hole closing, merging or other related hole failure, where associated dose and intensity values are obtained and fitting is based on the product of dose and image intensity. Although a fitted model based on dose and intensity data at the saddle point that experiences non-vertical development will differ from only hole closing (e.g., vertical development) data, a single Gaussian model may be fitted and further used in predicting failure rates at nominal conditions.

In the present disclosure contact hole failures such as hole closing and merging holes are used as an example to illustrate the concepts of the present disclosure and does not limit the scope of the present disclosure. However, the same concept should be applicable to "blocking or merging failures" in more general patterns like space bridging or line breaking.

As discussed above, a failure model is fitted using a product of dose and intensity, where the intensity was obtained from a blurred image. In an embodiment, the blurred image is obtained using a nominal blur value applied (e.g., via Gaussian blur) to an aerial image. In an embodiment, the blur (used to generate the blurred image) can be used as a variable to further improve a fitting of the failure model (e.g., the Gaussian model as a function of dose*intensity). In an embodiment, the blurred ILS ($ILS_B$) is the image log slope ILS (or normalized ILS) having a spatial blur applied thereto (e.g., by convolution with a Gaussian distribution), such that a blurred image has less contrast/slope than the unblurred aerial image. The spatial blur may represent blur of a resist image due to diffusion of a chemical species generated in a resist layer by exposure to radiation. In an embodiment, the spatial blur may be varied to generate a blurred image that better fits the failure data obtained at e.g., off-nominal conditions such as the failure data of a printed wafer when the aerial image was out-of-focus (e.g., outside a best focus range). FIGS. 13A-13E illustrates examples of hole closing failure rate data obtained from a printed wafer that was exposed at varying focus values and corresponding fitted models.

Figure 13A:
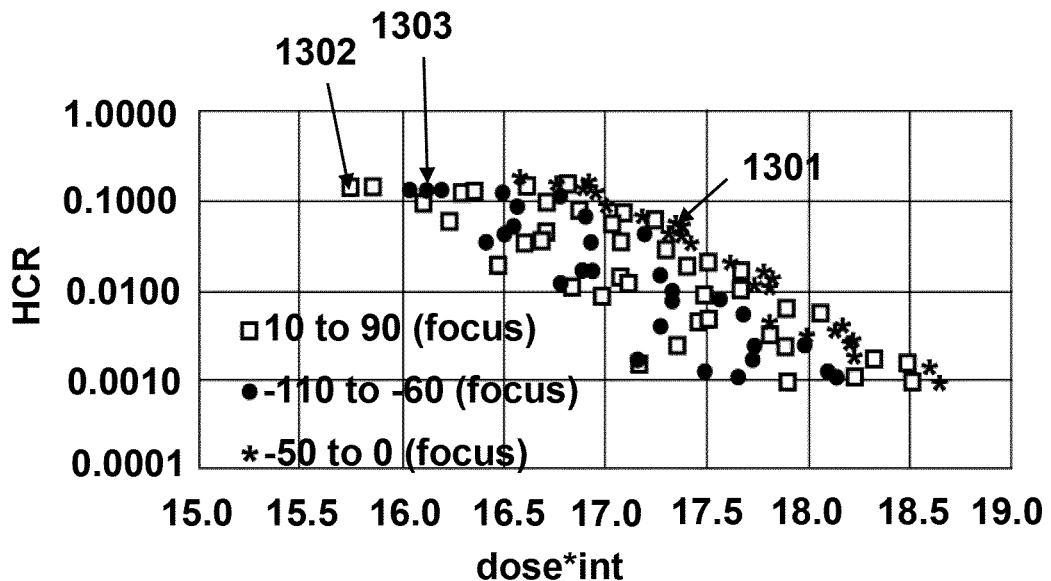
FIG. 13A is hole closure data (failure data) from a printed wafer using 4.25 nm blur, according to an embodiment.

FIG. 13A is a plot showing hole failure data points plotted against a product of dose and intensity (dose*intensity) assuming a nominal spatial blur (e.g., 4.25 nm). The failure data corresponds to a range of focus and dose values. In the plot, y-axis represents values of hole closing rate (HCR), and x-axis represents values of a product of dose and intensity (dose*int) corresponding to the dose and focus values for the assumed blur. In the plot, points 1301 are related to best focus window of the patterning process, points 1302 and 1303 are failure data related to out-of-focus printing. An initial comparison to wafer failure data shows a good correlation between the product of dose and intensity to wafer HCR near best focus but large deviation for out-of-focus. For example, points 1301 show a good correlation between HCR and dose*int, while points 1302 and 1303 show a large variation with no particular trend.

Figure 13B:
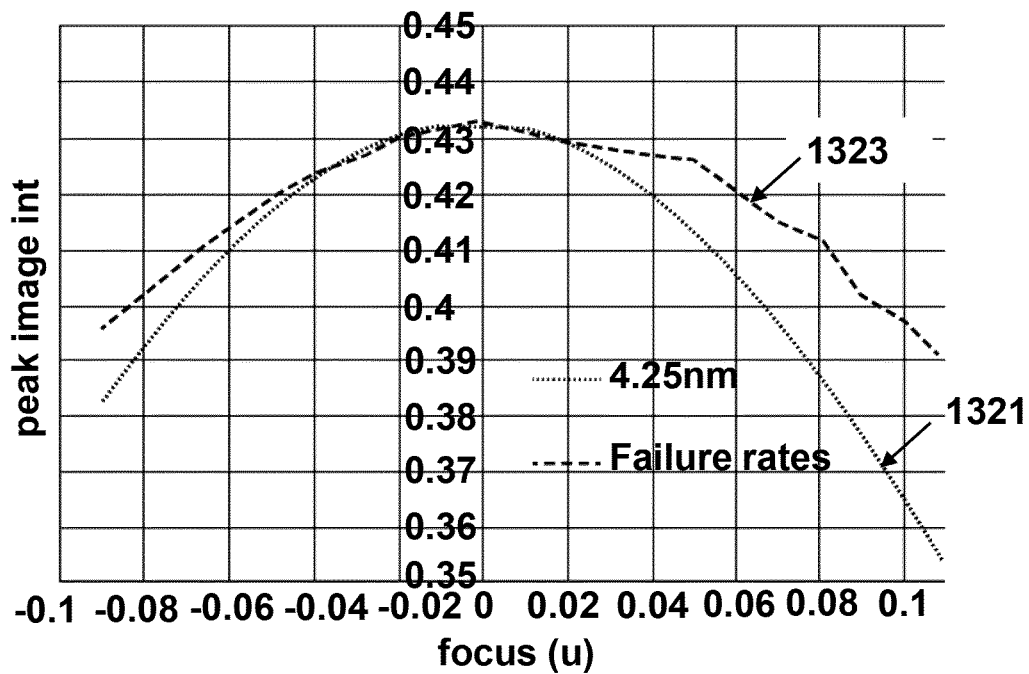
FIG. 13B is a plot of blur image intensity used for calibrating a model for FIG. 13A and the model based failure rate result, according to an embodiment.
Figure 13C:
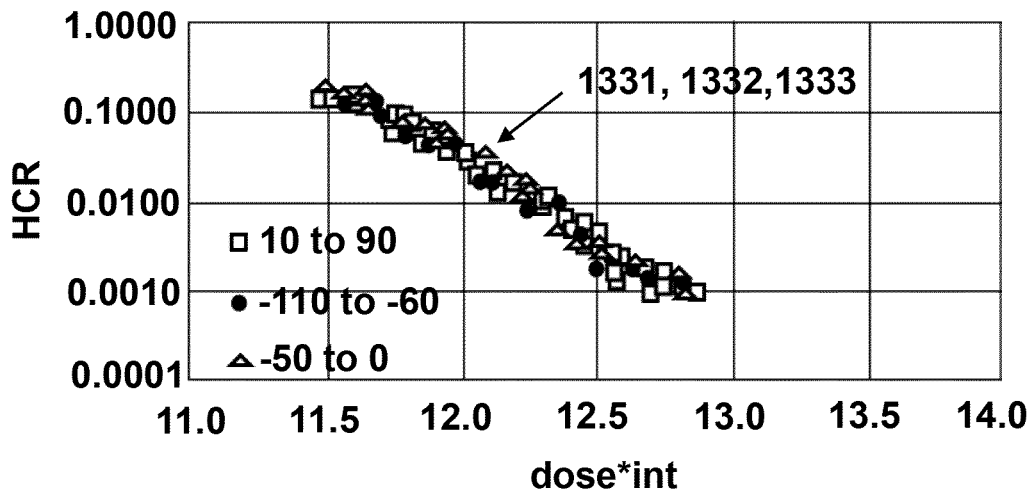
FIG. 13C is hole closure data (failure data) from a printed wafer using 8.25 nm blur, according to an embodiment.
Figure 13D:
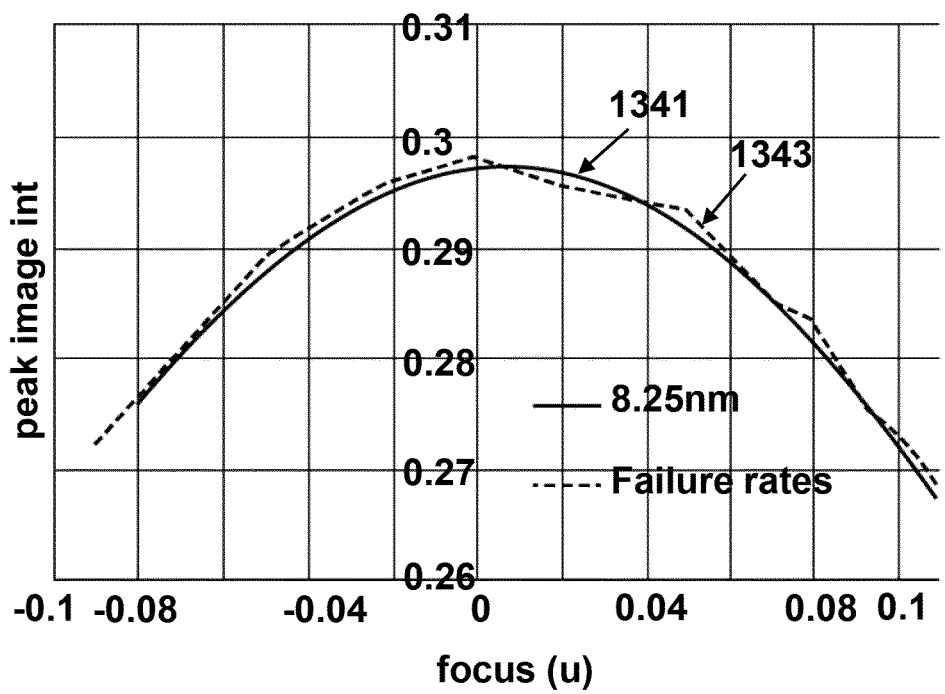
FIG. 13D is a plot of blur image intensity used for calibrating a model for FIG. 13C and the model based failure rate result, according to an embodiment.
Figure 13E:
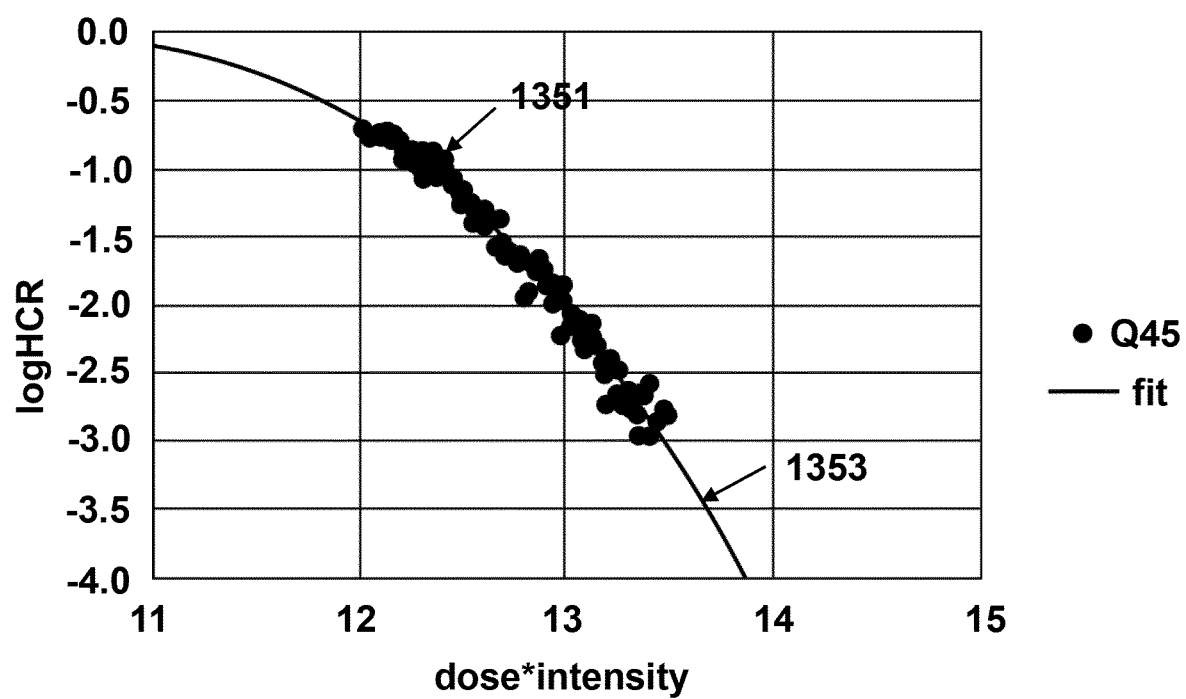
FIG. 13E is an example calibrated model fitted to data, according to an embodiment.

FIG. 13B shows a disconnect between failure rates 1323 at different focus values and blurred image intensity 1321. In this embodiment, the blurred image intensity 1321 is obtained from the blurred image generated using a nominal blur (e.g., 4.25 nm). FIG. 13C shows the advantage of including image blur as a variable. When the spatial blur is increased e.g., by approximately 2 time to a value of 8.25 nm, the HCR data 1331, 1332, and 1333 shows a matching trend with respect to the product of dose and intensity. FIG. 13D shows failure rates 1343 at different focus values and blurred image intensity 1341 are in better agreement. In other words, the focus related error may be removed if this higher (e.g., than nominal) blur is applied to all the available HCR data 1331, 1332, and 1333. For example, when a failure model, e.g., Gaussian model, is fitted using the blurred image intensity values generated using the higher blur (e.g., 8.25 nm) than a nominal blur, then, the failure model can better predict the failure rates of hole closing. FIG. 13E illustrates an example of a failure model 1353 fitted to the failure data 1351, where the failure model 1353 includes spatial blur as an extra variable. Example fitting of the Gaussian model (e.g., which is a function of dose*int) is described earlier in the disclosure.

Figure 14:
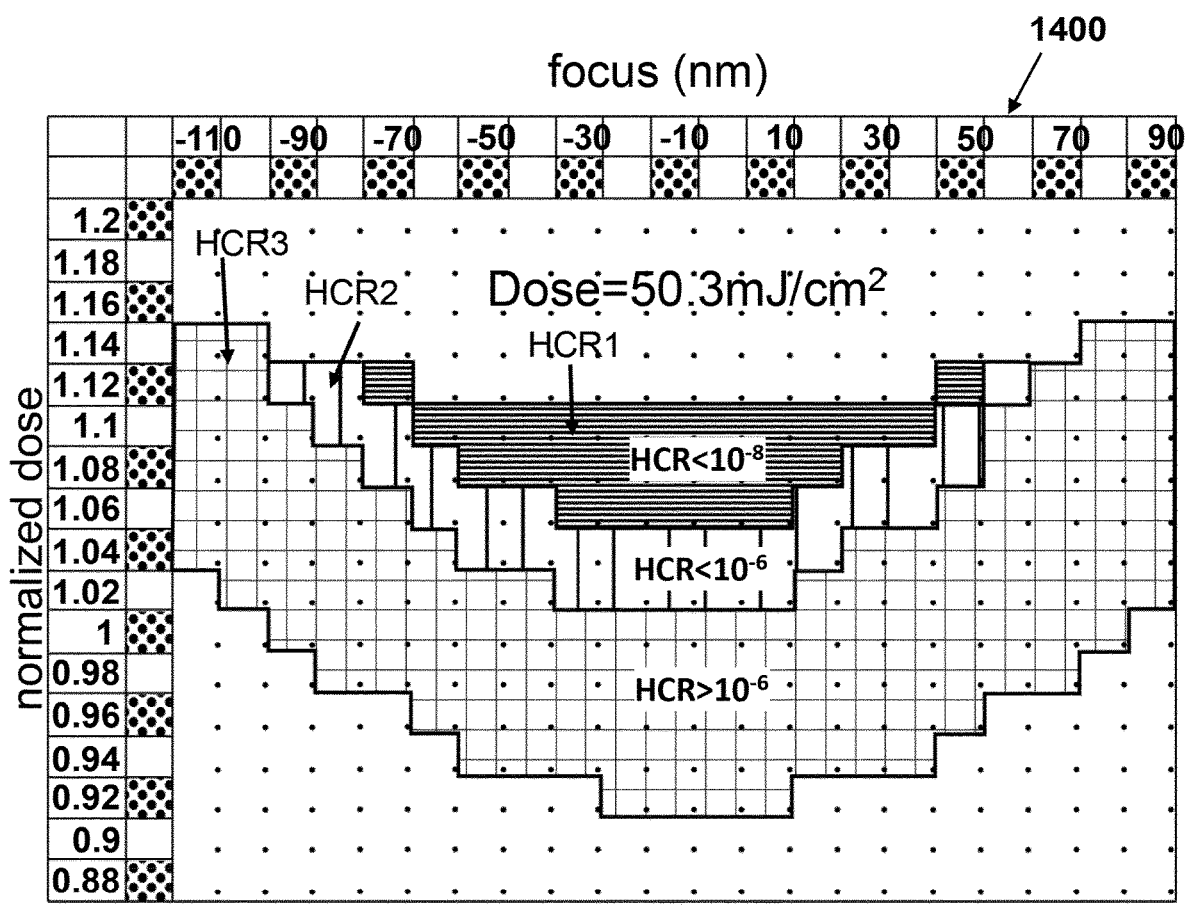
FIG. 14 illustrates an example failure process window for hole closure, according to an embodiment.

In an embodiment, the failure model (e.g., the fitted Gaussian model) can be further used to determine a failure process window of a patterning process. For example, FIG. 14 illustrates an example failure process window 1400. The process window 1400 being a dose-focus matrix where each elements of the matrix is failure probability value associated with a failure of interest (e.g., hole closure, bridging, etc.). The failure probability value can be calculated executing the calibrated failure model (e.g., according to methods 600 or 1000) using blur as an additional variable. The calibrated model is executed for each value of dose and focus to determine the failure probability value for each dose and focus values. Then, regions within the dose-focus may be classified according to the failure probability values. For example, regions HCR1, HCR2, and HCR3 are identified, where the region HCR1 has failure probability less than $10^{-8}$, the region HCR2 has failure probability less than $10^{-6}$ but greater than $10^{-8}$, and region HCR1 has failure probability greater than $10^{-6}$. In an embodiment, the regions HCR1, HCR2, and HCR3 show CD within 10% of the target CD of the target feature. Thus, depending on the criticality of a desired pattern to be printed, appropriate process window (e.g., dose-focus values) can be selected so that the failure rate of the desired pattern is minimized. In an embodiment, the calibrated failure model can be used for other lithography related applications such as determining hot spots in a design layout or a target layout.

Figure 15:
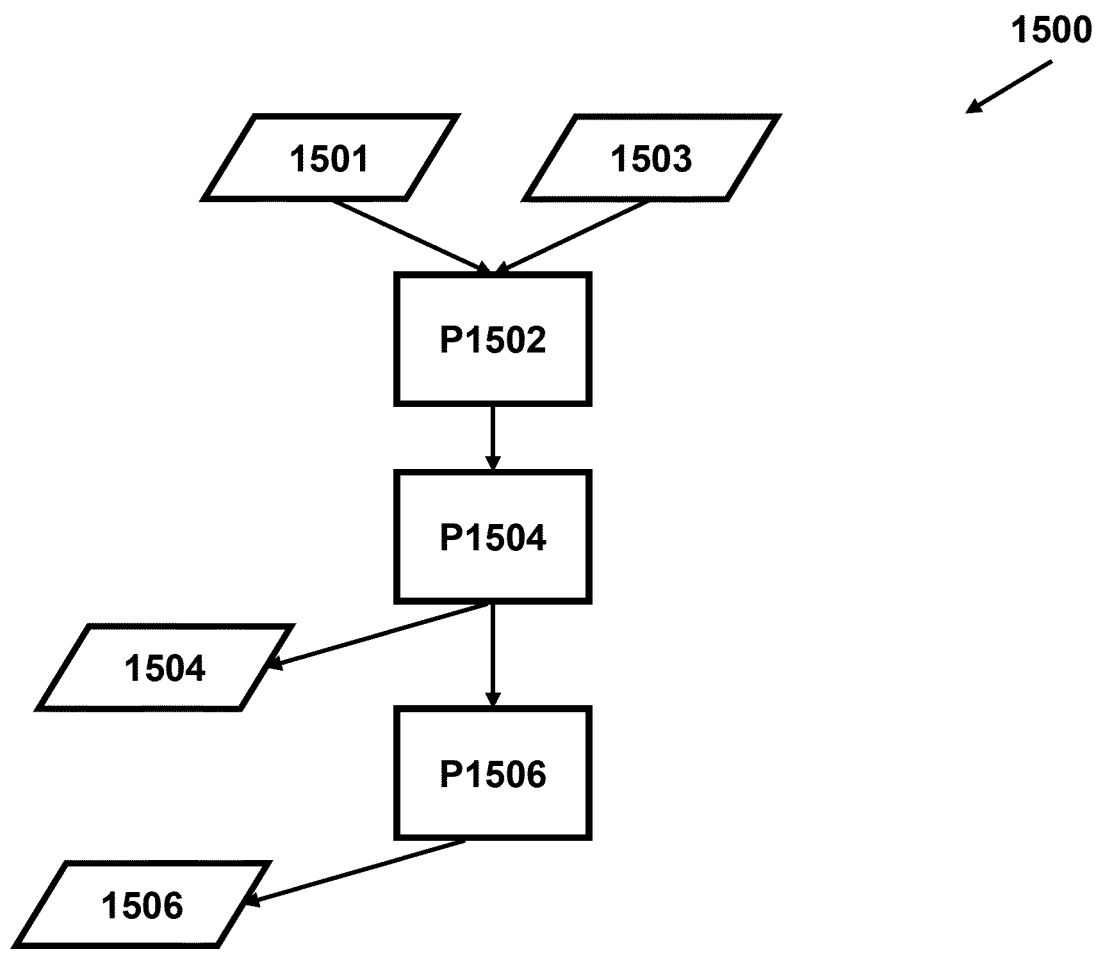
FIG. 15 is a flow chart of a method of determining hot spots based on a calibrated failure model and a blurred image, according to an embodiment.

FIG. 15 is a flow chart of a method 1500 for determining hot spot locations associated with a target pattern (e.g., in the target layout or a design layout of a circuit) to be printed on a substrate. In an embodiment, the hot spot locations are locations on the substrate where the target pattern has a higher probability of failure compared to other locations on the substrate. According to the present method 1500, such hot spot locations are determined using a blurred image associated with the target pattern. Further, for the hot spot's failure rates may be determined using a calibrated failure model (e.g., calibrated according to methods 600 or 1000 above). In an embodiment, the determined failure rates can be used to quantify (in term of probability of failure) the hot spot. For example, the hot spot locations determined from the blurred image should have relatively higher failure rates compared to other locations. The method 1500 is discussed in more detail as follows.

Procedure P1502 includes obtaining a calibrated failure model 1501 configured to predict a failure rate associated with a target pattern 1503. In an embodiment, the calibrated failure model 1501 is obtained as discussed with respect to methods 600 or 1000. For example, the calibrated failure model 1501 is a function of a product of dose and intensity associated with a patterning process.

Figure 17A:
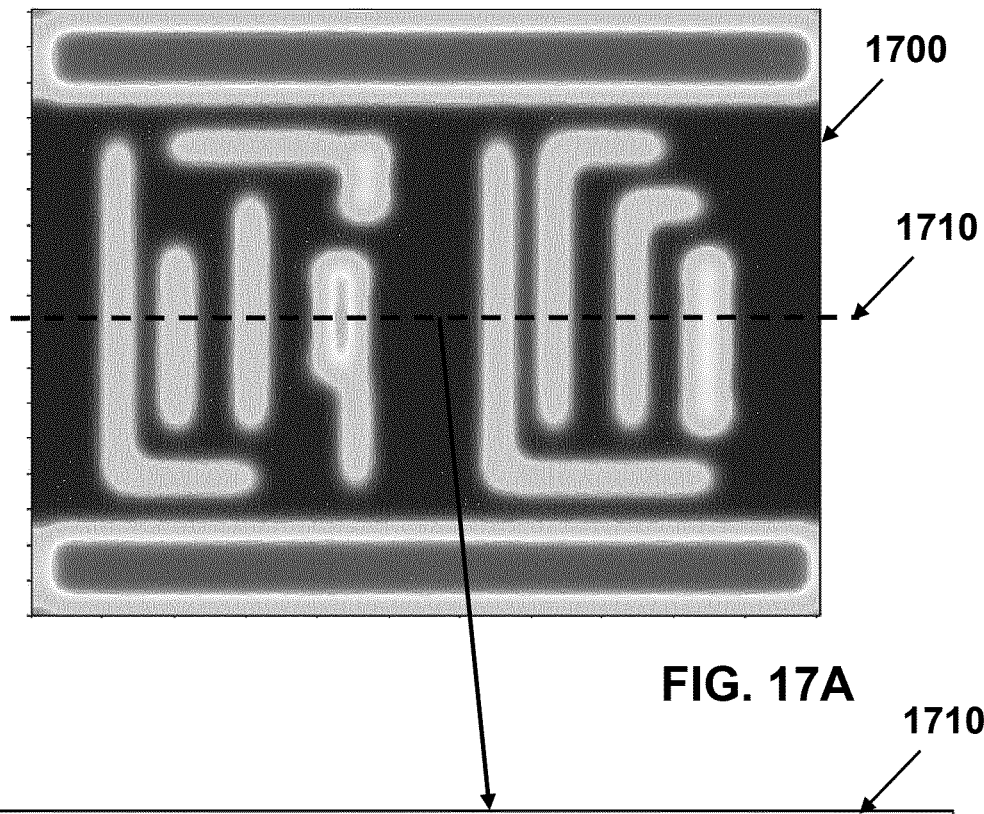
FIG. 17A is an example blurred image of the target pattern in FIG. 16A, according to an embodiment.
Figure 17B:
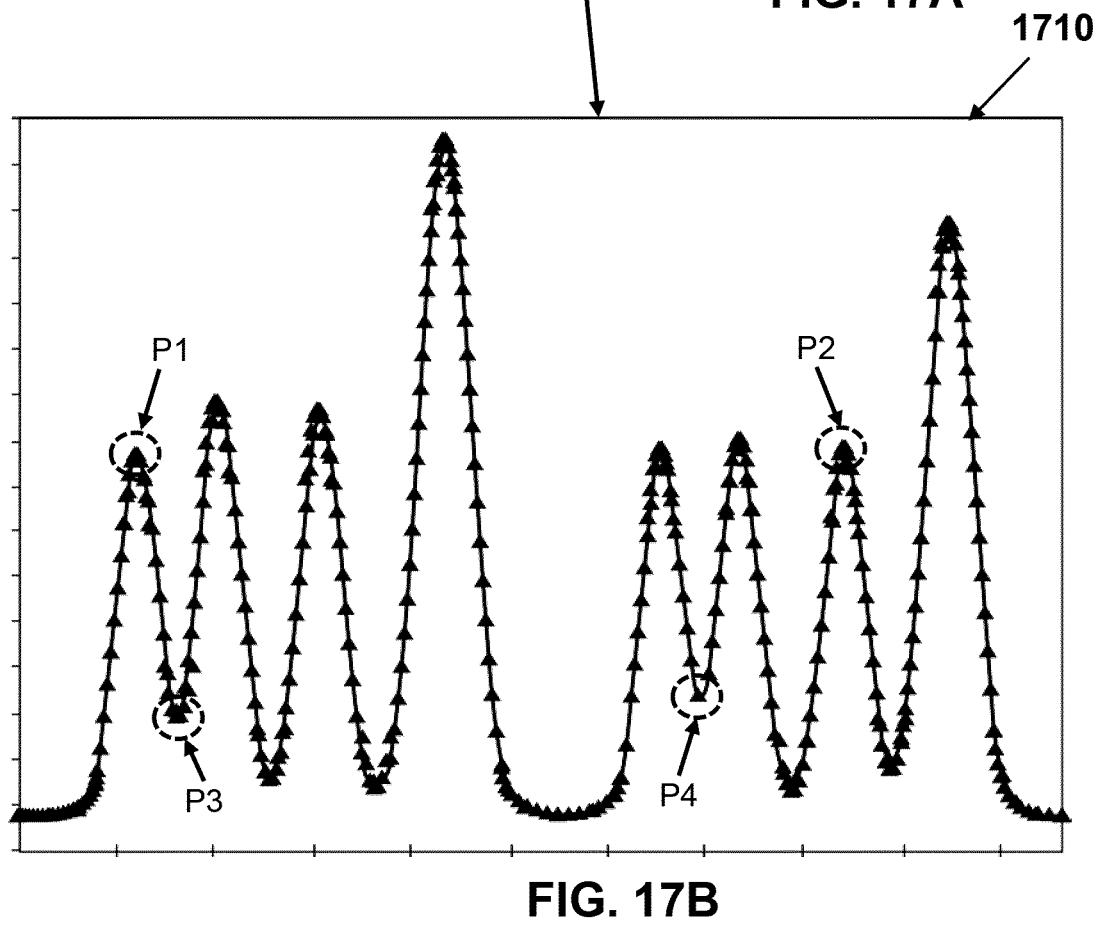
FIG. 17B is an example intensity in the blurred image of FIG. 17A, according to an embodiment.
Figure 17C:
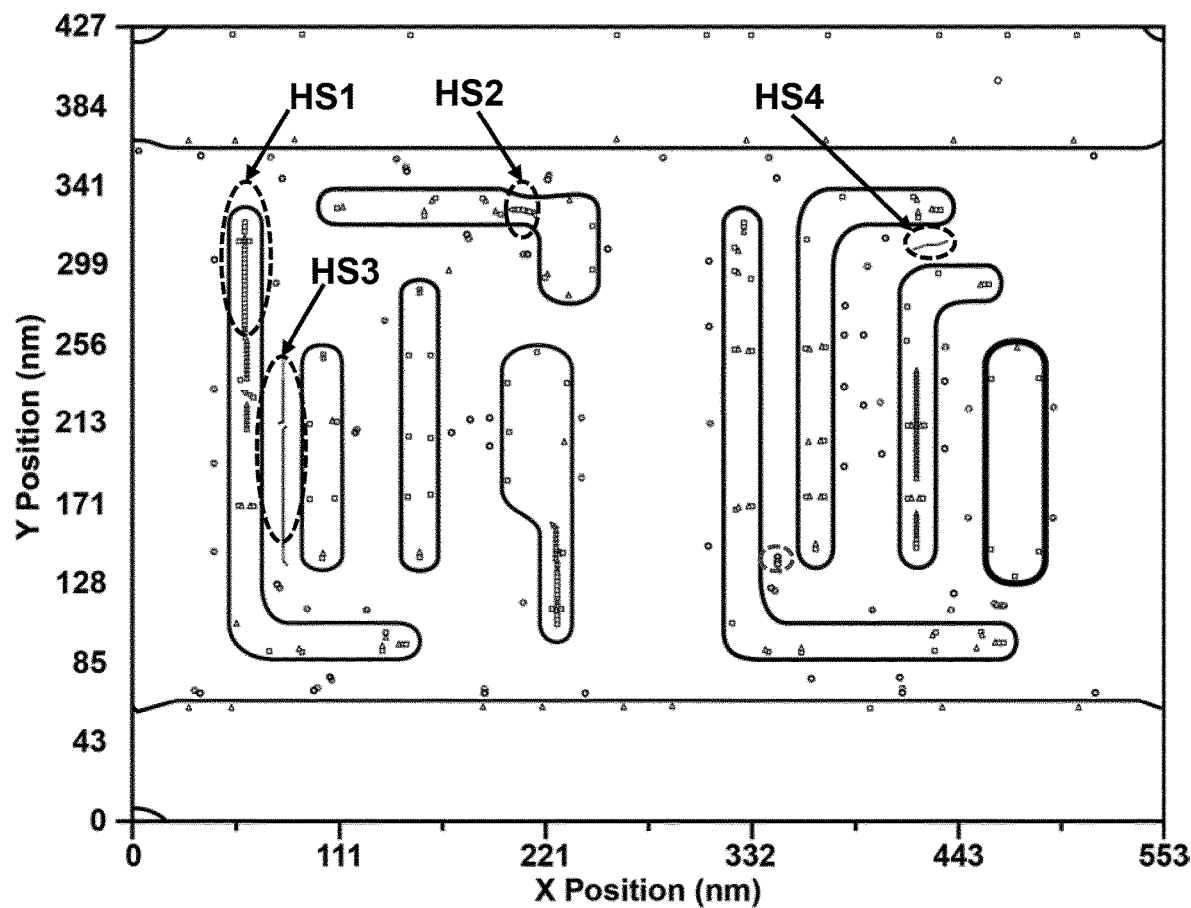
FIG. 17C illustrate example hot spots determined using the blurred image of FIG. 17A, according to an embodiment.

Procedure P1504 includes generating a blurred image 1504 of the target pattern 1503. In an embodiment, the blurred image 1504 can be used for determining hot spot locations. Particularly, intensity values of the blurred image can directly be used to determine hot spot patterns. For example, FIG. 17A-17C shows how intensity values at peaks and troughs can be indicative of hot spot locations. For example, minimum and maximum intensities at centers of a line (an example of a target feature) and space. Further, a dose value can be applied as a multiplier to the intensity values to allow a comparison of the hot spots with predicted failure rates using the calibrated model (e.g., using product of the dose*int). In other words, in an example, from a hot spot perspective, the regions that are most likely to fail can be read directly from the blurred image without any dose information. In an embodiment, the specified dose value may be a value within the dose-focus matrix that characterizes a process window of the patterning process. As discussed herein, the blurred image 1504 is generated by convoluting a Gaussian function, using a given, or calibrated blur value, with an aerial image of the target pattern. In an embodiment, the aerial image is generated by simulating an optical model (e.g., as discussed in FIG. 2) and for example, the applied dose value is selected to print the target pattern of particular CD value. For example, dose value can be a value in the range 30 mJ/cm$^2$-70 mJ/cm$^2$, for example, 50.3 mJ/cm$^2$.

Procedure P1506 includes determining, via the calibrated failure model 1501 and the blurred image 1504, the hot spot locations 1506 associated with the target pattern 1503. In an embodiment, the calibrated failure model 1501 is a function of a product of dose and intensity used for printing the targeted pattern, the calibrated failure model 1501 being configured to determine a failure rate associated with regions of the target pattern. Accordingly, the hot spot locations 1506 are regions of the blurred image having relatively higher failure rates.

In an embodiment, the determining of the hot spot locations 1506 includes identifying regions within the blurred image 1504 having relatively low intensity values. The regions are associated with locations at or near a feature of the target pattern. FIGS. 17A and 17B illustrate examples of the blurred image and locations/regions within the blurred image having relatively low intensity values. For example, the blurred image 1700 includes patterns corresponding to target patterns (e.g., horizontal and vertical lines). FIGS. 17A and 17B are further discussed later in the disclosure.

Using the specified dose and intensity values (e.g., of the blurred image 1700) within the identified regions of the blurred image, the calibrated failure model 1501 may be executed to predict failure rates within the identified regions. Then, based on the predicted failure rates within the identified regions, portions of the target pattern associated with relatively higher probability of failure are chosen/classified as the hot spot locations. In an embodiment, the choosing of the hot spot locations is based on determining whether a failure probability at a location of the identified regions breaches a hot spot threshold value, wherein the hot spot threshold value is a minimum acceptable failure probability value. An example application of method 1500 is discussed with respect to FIGS. 16A-16B, 17A-17C.

Figure 16A:
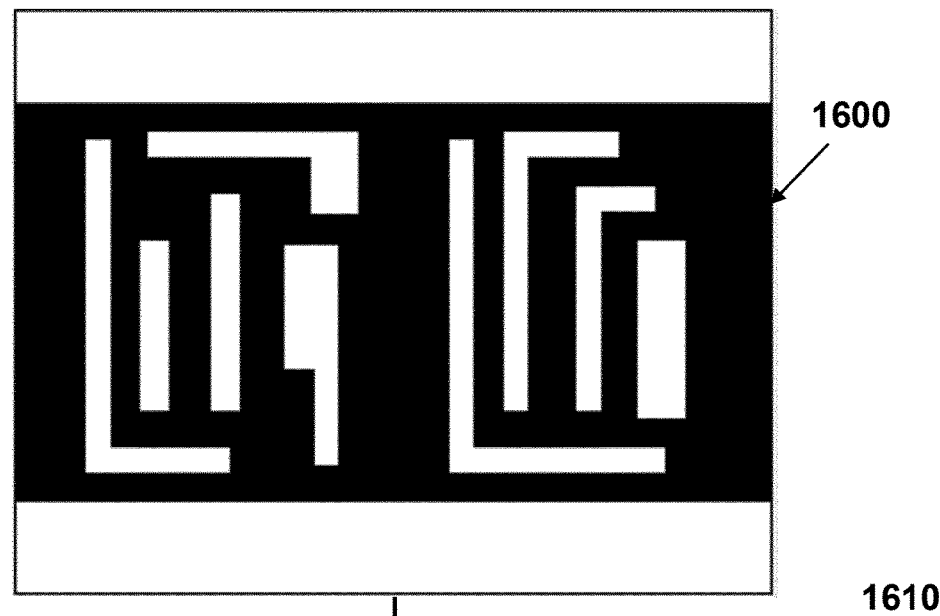
FIG. 16A is an example target pattern, according to an embodiment.
Figure 16B:
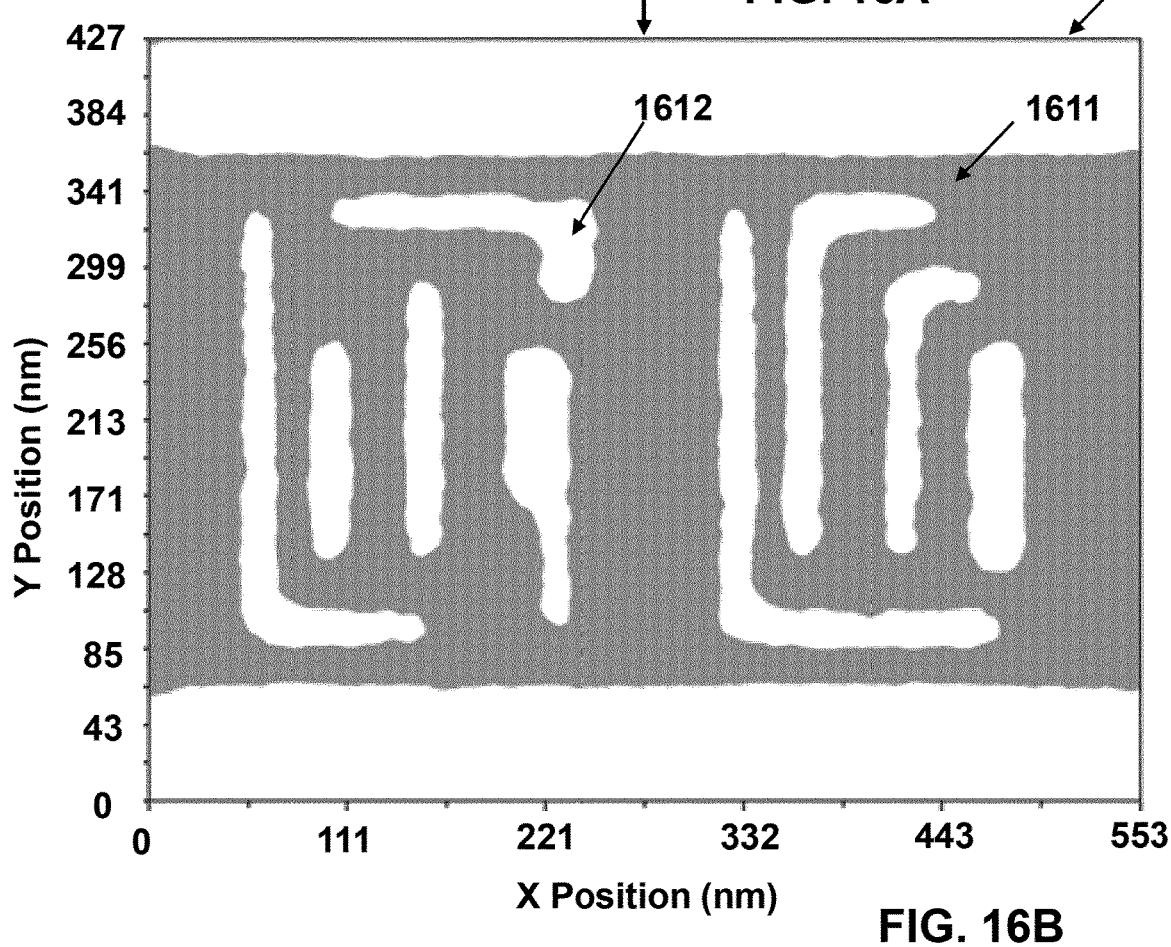
FIG. 16B is an example resist pattern for target pattern in FIG. 16A, according to an embodiment.

FIG. 16A illustrates an example target pattern 1600 including a plurality of target features (white features) to be printed on a substrate. In the present example, the target features are vertical and horizontal spaces placed related to each other to form a desired circuitry. When the target pattern is printed (e.g., via a lithographic apparatus) on a resist layer of the substrate, a resist pattern 1610 is formed. In an embodiment, the resist pattern may be developed using a positive resist process so the photoresist develops away with high light intensity and remains with low light intensity. In FIG. 16B, the white area (e.g., 1612) is where resist is removed (developed or dissolved). The grey portion (e.g., 1611) is remaining resist. The resist pattern 1610 can be simulated using the resist model (e.g., discussed in FIG. 2) or a stochastic model that models stochastic effects of the resist composition of the resist layer. It can be seen that the target pattern 1600 and the resist pattern 1610 are not identical. For example, edges and corners in the resist pattern 1610 are deformed, e.g., rounded compared to the target pattern 1600. In an embodiment, such deformations are results of optical diffraction, resist blur and stochastic variations in the resist process. The deformed resist patterns may cause failure of the target features. For example, lines may break, adjacent edges may merge, or other failures. Predicting such deformed patterns and further identifying locations at or near the target features can provide insights into features that have higher likelihood of failure when printed on the substrate. These features or locations associated thereof are hot spot locations.

In an embodiment, blurred image and the calibrated failure model can be employed to predict such hot spot locations associated with a target pattern (e.g., 1600). FIG. 17A illustrates an example blurred image 1700 generated from an aerial image of the target pattern 1600. In an embodiment, the target pattern 1600 may be OPCed (e.g., by biasing the feature sizes on the reticle or by applying SRAFs and SERIFs according to an OPC process) and further an aerial image may be generated from the OPCed target pattern. The aerial image may be generated using the optical model (e.g., discussed with respect to FIG. 2). In the current example, a Gaussian blur (e.g., characterizing a spatial blur of 5.5 nm) may be convoluted with the aerial image of the target pattern 1600 to generate the blurred image 1700. The blurred image may be a pixelated image where each pixel has an intensity value. According to the present disclosure, the intensity values of the blurred image 1700 can be used to determine hot spot locations. For example, FIGS. 17B and 17C illustrates use of the intensity values with the calibrated failure model (e.g., 1501 of the method 1500) to determine hot spot locations.

FIG. 17B illustrates an example signal (e.g., characterizing intensity of the blurred image) along a line 1710 drawn though the target features in the blurred image 1700. In an embodiment, the signal amplitude represent intensity values at different locations along the line 1710. In an embodiment, intensity peaks P1 and P2 have relatively low peak intensity at space center between the target features. Hence, such intensity peaks indicate highest risk for bridging. In other words, the resist in the space between the target features may not develop due to relatively low intensity values, while it is desired that all resist be removed in the space between the target features. Hence, peaks P1 and P2 may be indicative of a bridging defect. In another example, the intensity troughs at P3 and P4 for those line centers (i.e., a center of the target feature) are relatively high compared to other "darker" line centers. These higher intensity troughs at the center of the target feature may be indicative of a line break, as resist may develop completely through due to relatively higher intensity values. Hence, such locations corresponding to the peaks P1 and P2, or troughs P3 and P4 can be potential hot spot locations.

FIG. 17C illustrates example hot spot locations/regions HS1, HS2, HS3 and HS4 that are determined based on intensity values in the two-dimensional blurred image of FIG. 17A. In an embodiment, the procedure of determining the hot spot locations HS1, HS2, HS3, and HS4 includes finding image local extrema (e.g., centers of target features) in both X and Y. Then, classifying regions as potential hot spots based on the intensity at those local extrema. In an embodiment, the hot spot locations HS1 and HS2 are potential locations of microbridginq defects observed in a space (i.e., the target feature). The hot spot locations HS3 and HS4 are potential locations of line breaks.

Figure 18A:
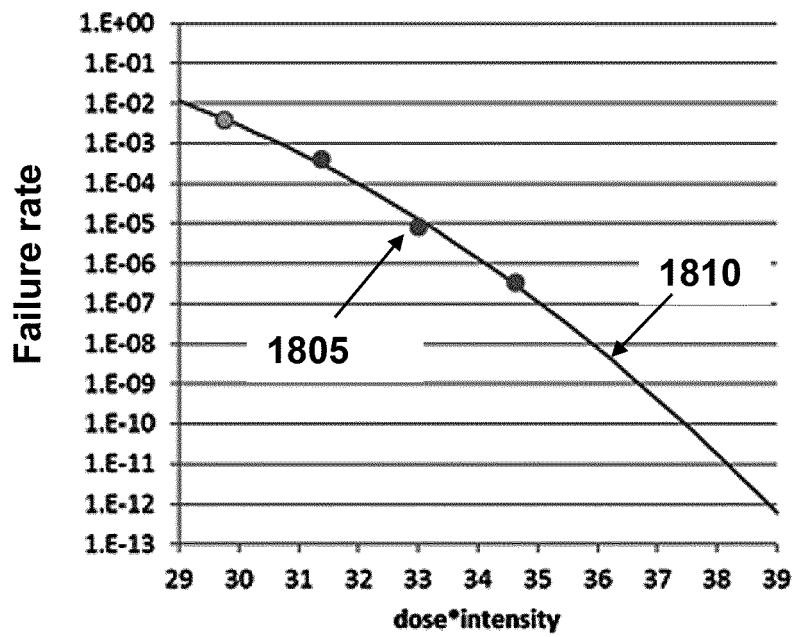
FIG. 18A is an example calibrated model fitted on failure data related to space between target features (e.g., line), according to an embodiment.
Figure 18B:
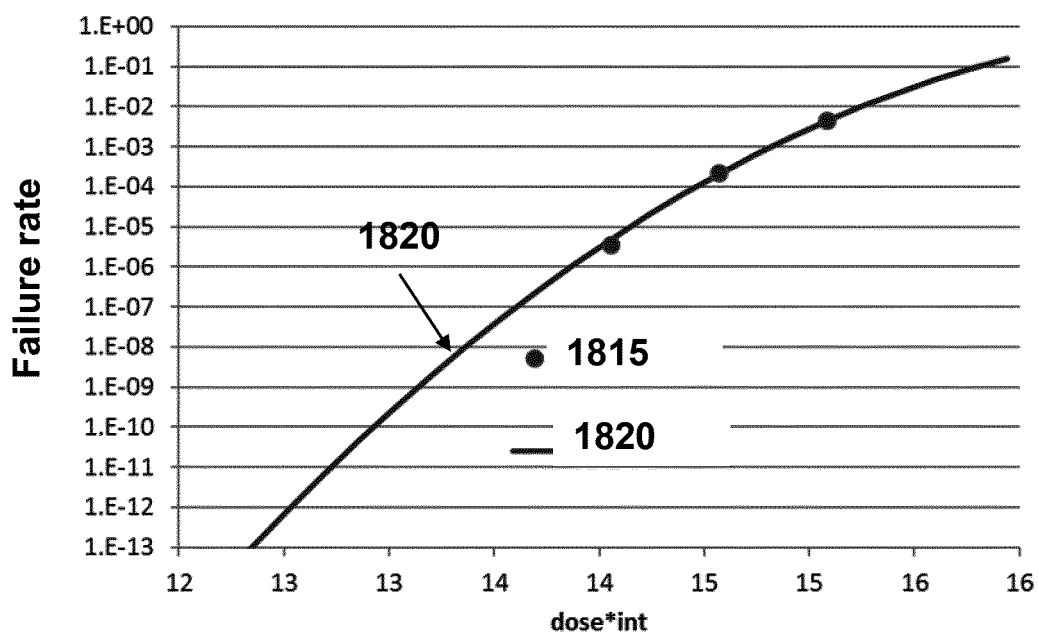
FIG. 18B is another example calibrated model fitted on failure data related to line break, according to an embodiment.

In an embodiment, the calibrated failure model may be used to determine a probability of failure at the locations of hot spots. For example, using the intensity values and a specified dose value, a product of the dose and intensity can be computed. Then, the computed does*intensity values can be used by the calibrated failure model to determine the probability of failure associated with a target feature. FIGS. 18A and 18B illustrate example results of calibrated failure models 1810 and 1820 for failure related to space and line, respectively. In FIG. 18A, the failure data 1805 indicates probability of failure increases as dose*intensity decreases. The calibrated failure model 1810 fits the failure data 1805 accurately. Hence, the model 1810 can be used to predict failure rate at any space-center dose*intensity value and quantitatively predicts failure rates for hot spots (e.g., corresponding to the peaks P1 and P2 in FIG. 17B) and other areas in the pattern. In FIG. 18B, the failure data 1815 indicates probability of failure increases as dose*intensity increases. The calibrated failure model 1820 fits the failure data 1815 accurately. Hence, the model 1820 can be used to predict failure rate at any line-center dose*intensity value and quantitatively predicts failure rates for hot spots (e.g., corresponding to the peaks P3 and P4 in FIG. 17B) and other areas in the pattern.

FIGS. 19A-23 discuss examples of determining a process window based on failure probability related to the target pattern. In an embodiment, a failure process window is determined using the calibrated failure model (e.g., 1501 of FIG. 15). In an embodiment, such failure process window can be determined as the calibrated failure model enables prediction of failure probability of target feature at focus-dose conditions around the preferred "nominal" conditions. Small variation in dose and focus are inevitable in during the semiconductor manufacturing process. Hence, knowledge of the process window characteristics is valuable.

Figure 19A:
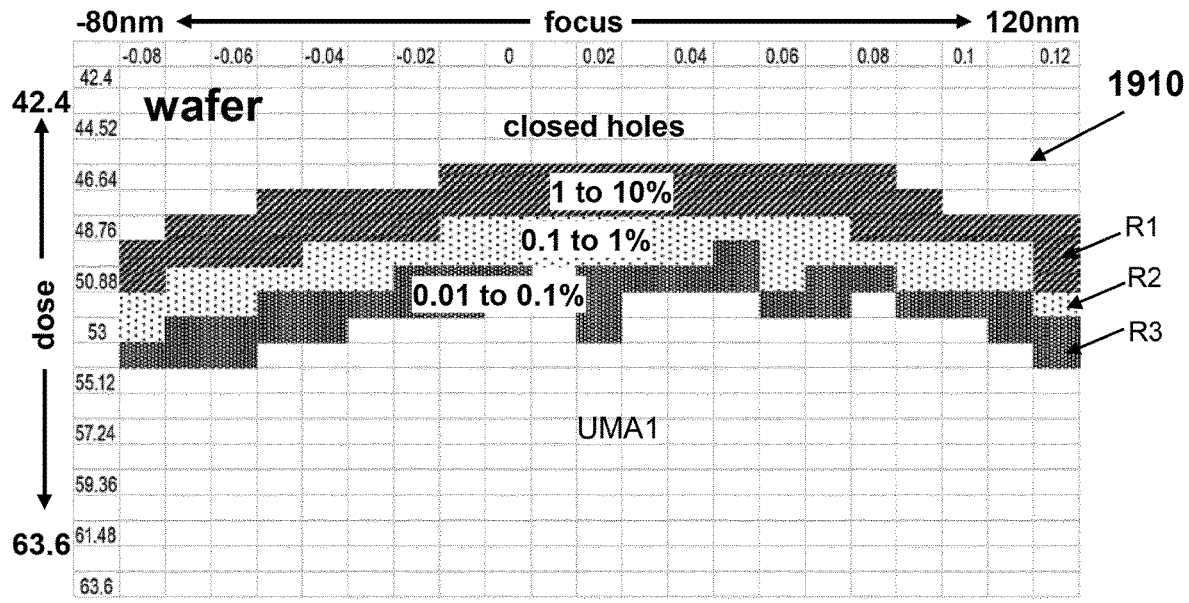
FIG. 19A illustrates example failure process window based on wafer data (e.g., closed holes) measured from a printed wafer, according to an embodiment.

FIG. 19A is an example failure process window based on real wafer data, where the wafer data is number of failures of a contact hole (e.g., closed holes). In an embodiment, only few closed holes may be available to measure (e.g., using a defect inspection tool). Hence, only a limited process window may be determined using real failure data. For example, the first failure process window 1910 includes dose-focus ranges illustrated as shaded regions R1, R2, R3, each region is associated with a failure rate, in this case, hole closure rates. While, below the region R3, e.g., dose-focus values in UMA1 there are too few closed holes to be measured, and above the region R1 more than 10% of the holes will be closed. The region R1 has a failure rate of approximately 1 to 10%, the region R2 has failure rate of approximately 0.1 to 1%, and the region R3 has a failure rate of approximately 0.01 o 1%. In the present example, the failure rate or, in this case, the hole closure rates are relatively higher for lower doses (e.g., 54-45.5) within the dose range of 63.6 mJ/cm²- 42.4 mJ/cm². However, enough real wafer data may not be available related to dose-focus values of low failure rates where the actual manufacturing process may be centered. Instead, the calibrated failure model of the present disclosure allow extrapolations into the "unmeasured" area UMA1— the region of interest.

Figure 19B:
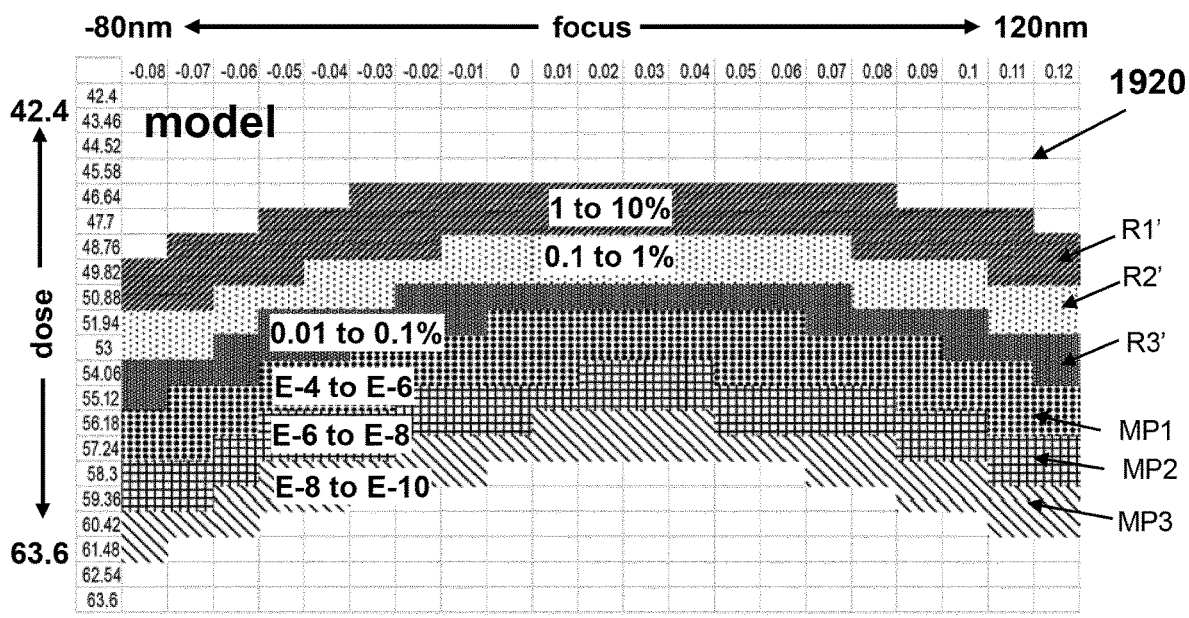
FIG. 19B illustrates example failure process window based on predictions from a calibrated failure model (e.g., related to closed holes), according to an embodiment.

FIG. 19B is the process window 1920 based on predictions of the calibrated failure model, where the calibrated model predicts failure rates of a contact hole (e.g., closed holes). It can be seen that the model predictions look similar to the wafer based data in the regions where they can be compared. For example, compare regions R1, R2, R3 (in FIG. 19A) and RI, R2', R3' (in FIG. 19B), respectively. In addition, the calibrated failure model enables extrapolation into additional regions MP1, MP2, and MP3. For example, the dose values and blurred image intensity can be inserted in the Gaussian function (e.g., a function of the dose*intensity). For example, the region MP1 has failure rate of approximately $10^{-4}$ to $10^{-6}$, another region MP2 has failure rate of approximately $10^{-6}$ to $10^{-8}$, and yet another region MP3 has failure rate of approximately $10^{-8}$ to $10^{-10}$. Thus, in the present example, shaded regions (including MP1, MP2, and MP3) in FIG. 19B show the closed hole probability.

Figure 19C:
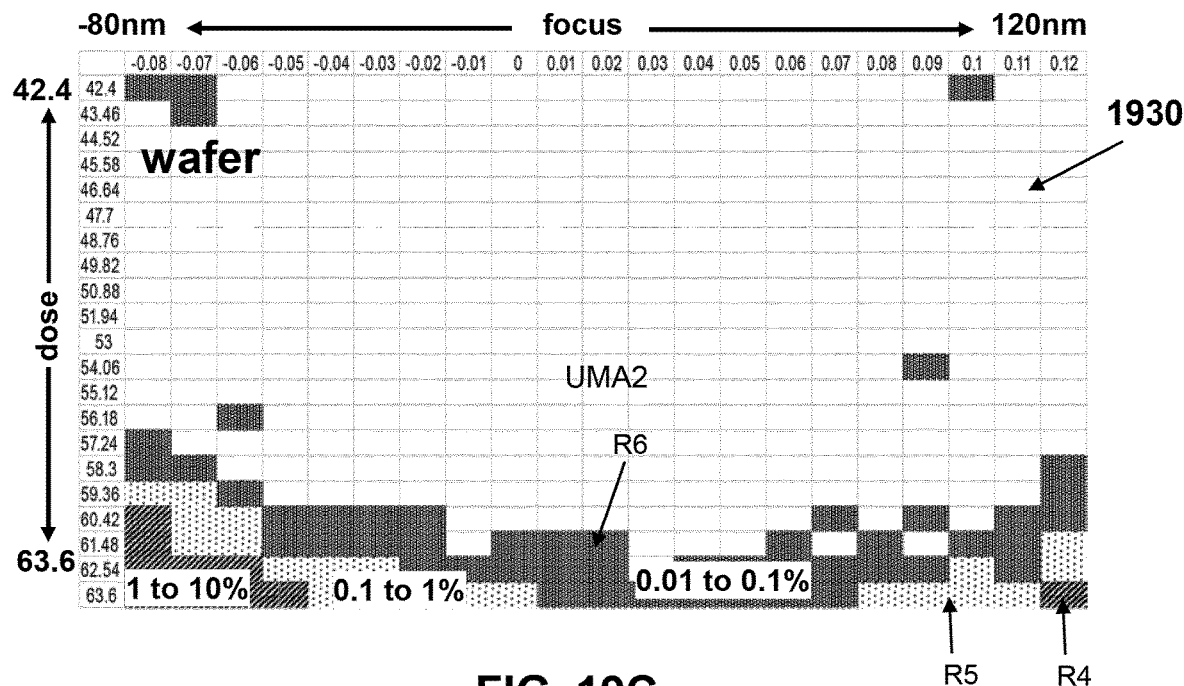
FIG. 19C illustrates example failure process window based on wafer data (e.g., merged holes) measured from a printed wafer, according to an embodiment.

FIG. 19C is an example second process window 1930 based on real wafer data, where the wafer data is number of failures of a contact hole (e.g., merged holes). In an embodiment, only few merged holes may be available to measure (e.g., using a defect inspection tool). Hence, only a limited process window may be determined using real failure data. For example, the second failure process window 1930 includes dose-focus ranges illustrated as shaded regions R4, R5, R6, each region is associated with a failure rate, in this case, holes merging rate. While, above the region R6, e.g., dose-focus values in UMA2 there are too few merged holes to be measured. The region R4 has a failure rate of approximately 1 to 10%, the region R5 has failure rate of approximately 0.1 to 1%, and the region R6 has a failure rate of approximately 0.01 o 1%. In the present example, the failure rate or, in this case, the hole merging rates are relatively higher for higher doses (e.g., 58-63.6) within the dose range of 42.4 mJ/cm²-63.6 mJ/cm². However, enough real wafer data may not be available related to dose-focus values of low failure rates. Instead, the calibrated failure model of the present disclosure allow extrapolations into the "unmeasured" area UMA2—the region of interest.

Figure 19D:
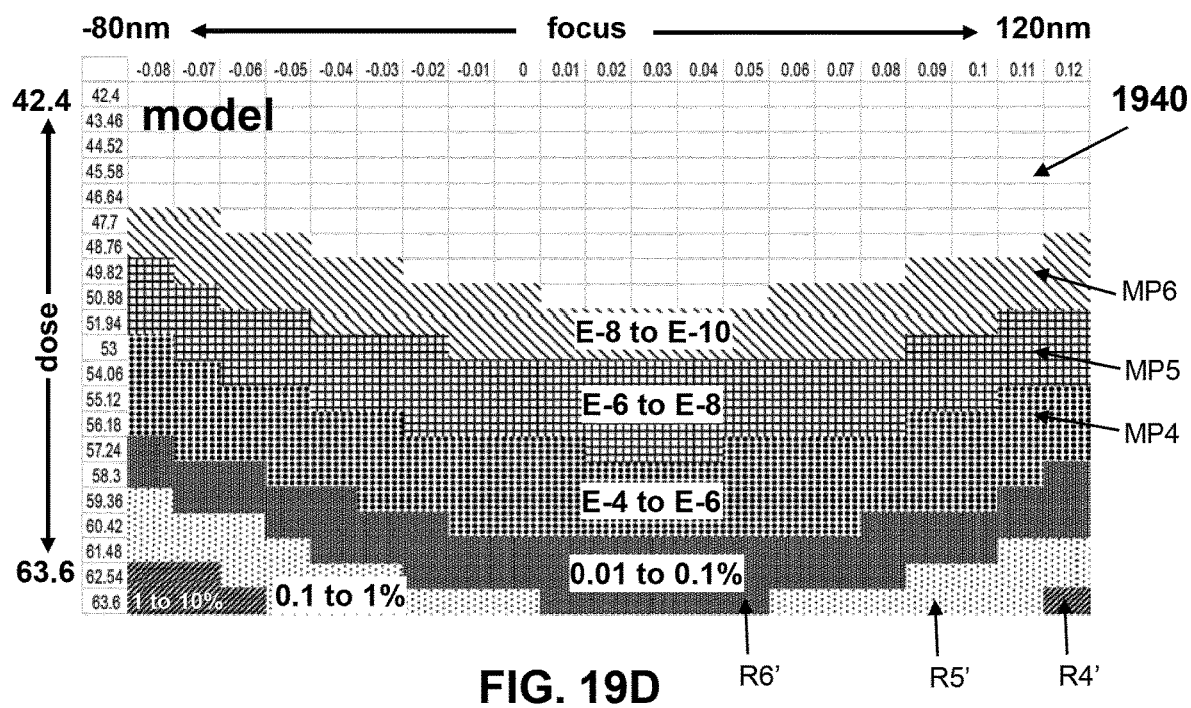
FIG. 19D illustrates example failure process window based on predictions from a calibrated failure model (e.g., related to merged holes), according to an embodiment.

FIG. 19D is an example second process window 1940 based on predictions of the calibrated failure model, where the calibrated model predicts failure rates of a contact hole (e.g., merged holes). It can be seen that the model predictions look similar to the wafer results in the regions where they can be compared. For example, compare regions R4, R5, R6 (in FIG. 19C) and R4', R5', R6' (in FIG. 19D), respectively. In addition, the calibrated failure model enables determining of additional regions MP4, MP5, and MP6. For example, the dose values and blurred image intensity can be inserted in the Gaussian function (e.g., a function of the dose*intensity). The calibrated model predicts, for example, the region MP4 has failure rate of approx. $10^{-4}$ to $10^{-6}$, another region MP5 has failure rate of approx. $10^{-6}$ to $10^{-8}$, and yet another region MP6 has failure rate of approx. $10^{-8}$ to $10^{-10}$.

Thus, in the present example, shaded regions (including MP4, MP5, and MP6) in FIG. 19D correspond to merged holes.

Now, notice failure rates (or regions) of different failure modes such as closed holes and merged holes. In case of closed holes example, the failure rates are relatively higher for lower doses (e.g., 54 mJ/cm$^2$-45.5 mJ/cm$^2$) within the dose range of 63.6 mJ/cm$^2$-42.4 mJ/cm$^2$. While, in case of merged holes the failure rates are relatively higher for higher doses (e.g., 58-63.6) within the dose range of 42.4 mJ/cm$^2$-63.6 mJ/cm$^2$. Thus, it would not be advisable to select only higher dose to avoid closed holes or lower doses to avoid merged holes. Similarly, for other failure modes, different failure process windows can be determined using a calibrated failure model of that particular failure mode. In an embodiment, to determine an optimum operating condition to minimize failures, appropriate dose-focus values (or failure process window) may be selected, for example, select dose-focus associated with minimum failure rates of all the failure modes. For example, an optimum failure process window may be selected by combining failure process windows of each failure modes.

Figure 20:
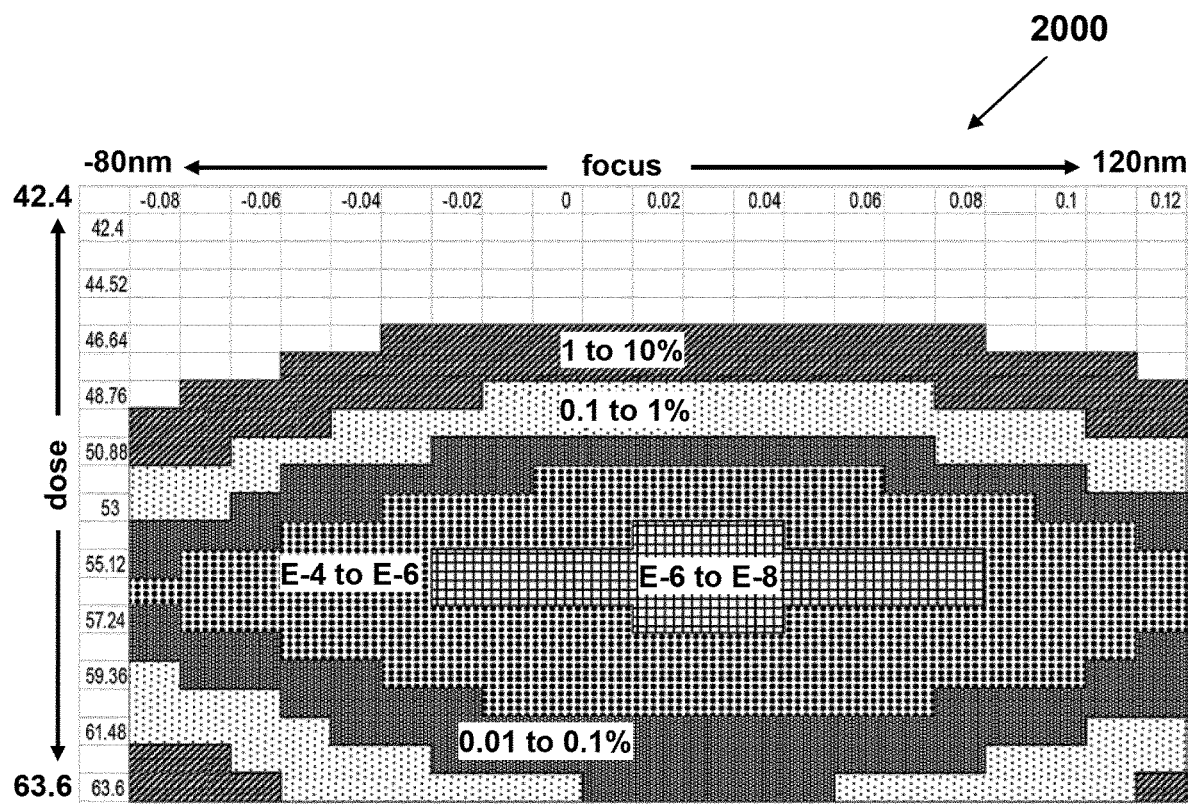
FIG. 20 is a combined failure process window of FIGS. 19B and 19D, according to an embodiment.

In an embodiment, referring to FIG. 20, failure process windows related to multiple failure modes can be combined to generate a combined failure process window 2000. In FIG. 20, a plot of max failure rate for closing and merging holes is used to obtain the failure process window 2000. For example, for each dose-focus values, maximum failure rate of the multiple failure modes is selected to generate the combined failure process window 2000.

Figure 21:
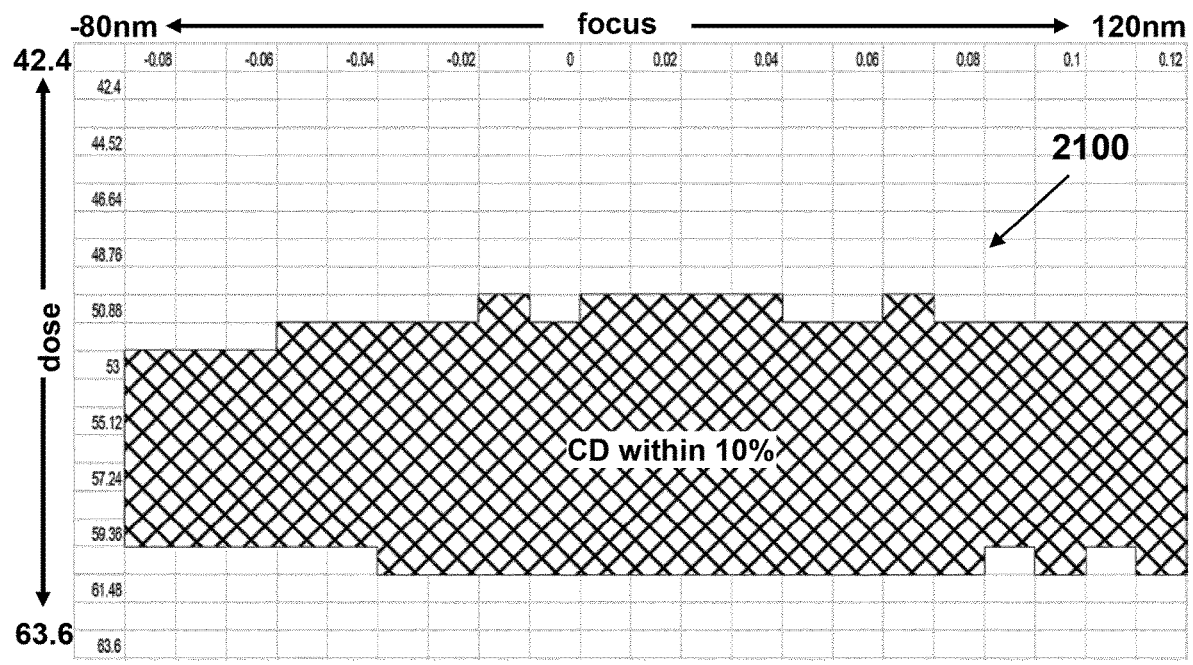
FIG. 21 is a process window based on CD, according to an embodiment.
Figure 22:
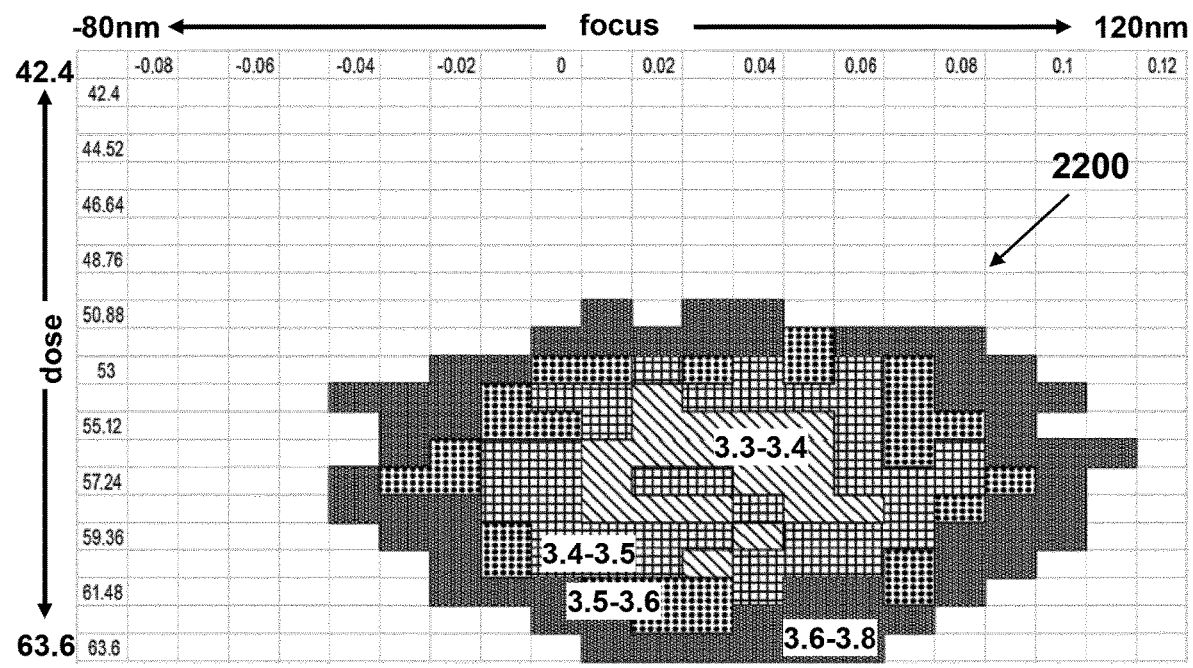
FIG. 22 is a process window based on LCDU, according to an embodiment.
Figure 23:
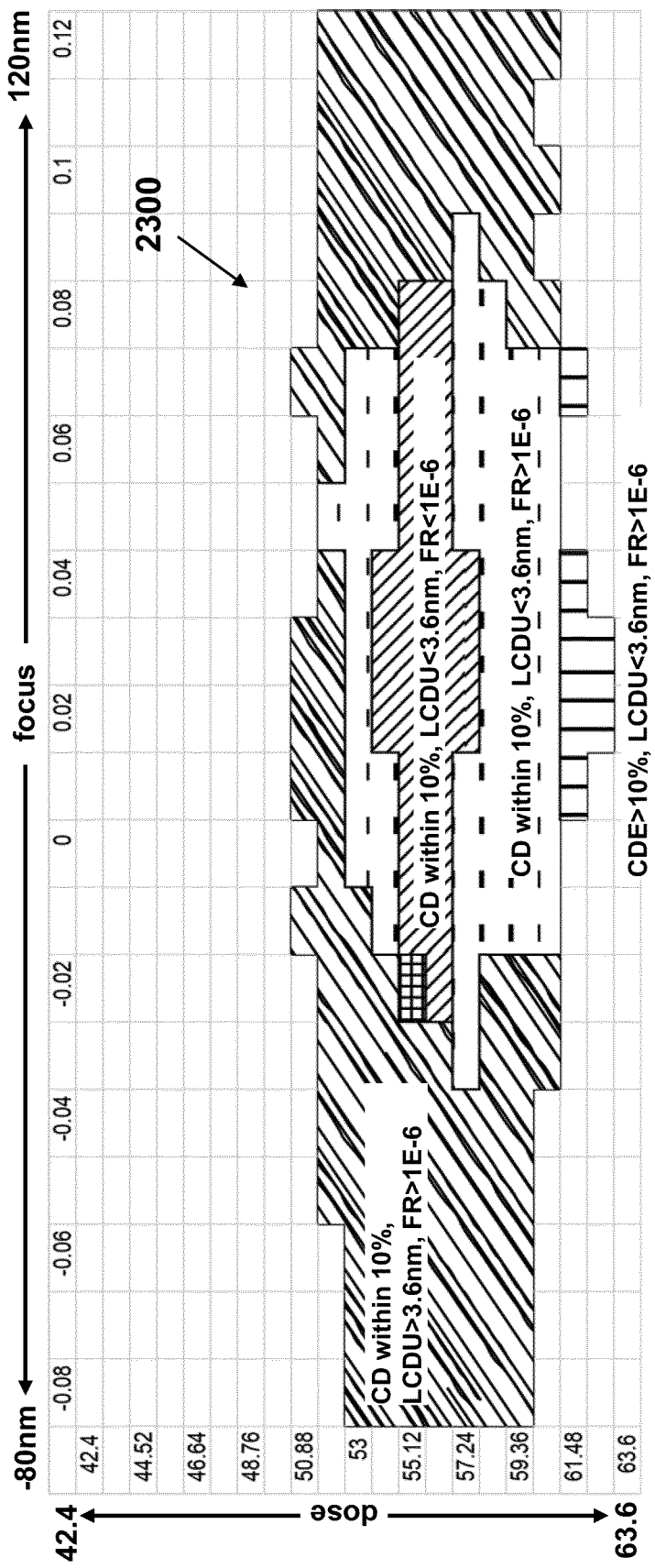
FIG. 23 is a combined failure process window of FIGS. 20, 21 and 22, according to an embodiment.

Further, using existing methods process windows based on CD and LCDU can be obtained. FIG. 21 is a plot of a CD based process window 2100, where the process window 2100 (e.g., dose focus values) is defined to print target features having CD values of 22 nm. For example, the process window 2100 is defined where CD values are within 10% of the desired CD value. FIG. 22 is a plot of a LCDU based process window 2200, where the process window 2200 (e.g., dose focus values) is defined to achieve a desired LCDU (e.g., within 3.3-3.6 nm range). In an embodiment, the process windows 2100, 2200, and 2300 can be combined to determine a combined process window. FIG. 23 is a combined process window 2300 that satisfies three conditions: 1) failure rates, 2) CD values, and 3) LCDU. For example, dose-focus values from each of the process windows 2000, 2100, and 2200 can be selected that satisfy the desired conditions (e.g., failure rates, CD, and LCDU). Thus, the process window 2300 (e.g., dose-focus values) can be used to adjust the dose focus values of a lithographic apparatus used to print the desired pattern on the substrate. Then, the printed target pattern will be satisfy the failure rate, CD, and LCDU conditions.

In an embodiment, the calibrated failure model 1501 may be configured to predict a failure rate based on stochastic variations related to a mask manufacturing process, a resist process, an etch process, and/or a lithographic process. For example, the stochastic variations associated with the mask manufacturing process can be modeled as another Gaussian function which contributes to a distribution of the peak image intensities of all the features. This effect may be subsumed by the previously described stochastic resist effect or broken out as a second Gaussian variation in calibrating failures to wafer data. In an embodiment, the calibrated failure model 1501 may be configured to account for the stochastic variations via one or more parameters of a Gaussian function.

As discussed in methods 600, 1000 and 1100, the failure model may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million-dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, as is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as $\gamma$ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p$ $(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq.1). For example, if considering N PW conditions, then one can categorize the evaluation points according to their PW conditions and write the cost functions as:

$$CF(z_1, z_2, \ldots, z_N) = \sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z_N) \quad \text{(Eq. 1')}$$

Where $f_{p_u}(z_1, z_2, \ldots, z_N)$ is the value of $f_p(z_1, z_2, \ldots, z_N)$ under the u-th PW condition u=1, ..., U. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. The desired throughput may limit the dose and thus has implications for the stochastic effects (e.g., imposing a lower bound on the stochastic effects). Higher throughput generally leads to lower dose, shorter longer exposure time and greater stochastic effects. Consideration of substrate throughput and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \underset{(z_1, z_2, \ldots, z_N) \in Z}{\operatorname{argmin}} CF(z_1, z_2, \ldots, z_N) = \qquad \text{(Eq. 2)}$$

$$\underset{(z_1, z_2, \ldots, z_N) \in Z}{\operatorname{argmin}} \sum_{p=1}^{P} w_p f_p^2(z_1, z_2, \ldots, z_N)$$

Figure 24:
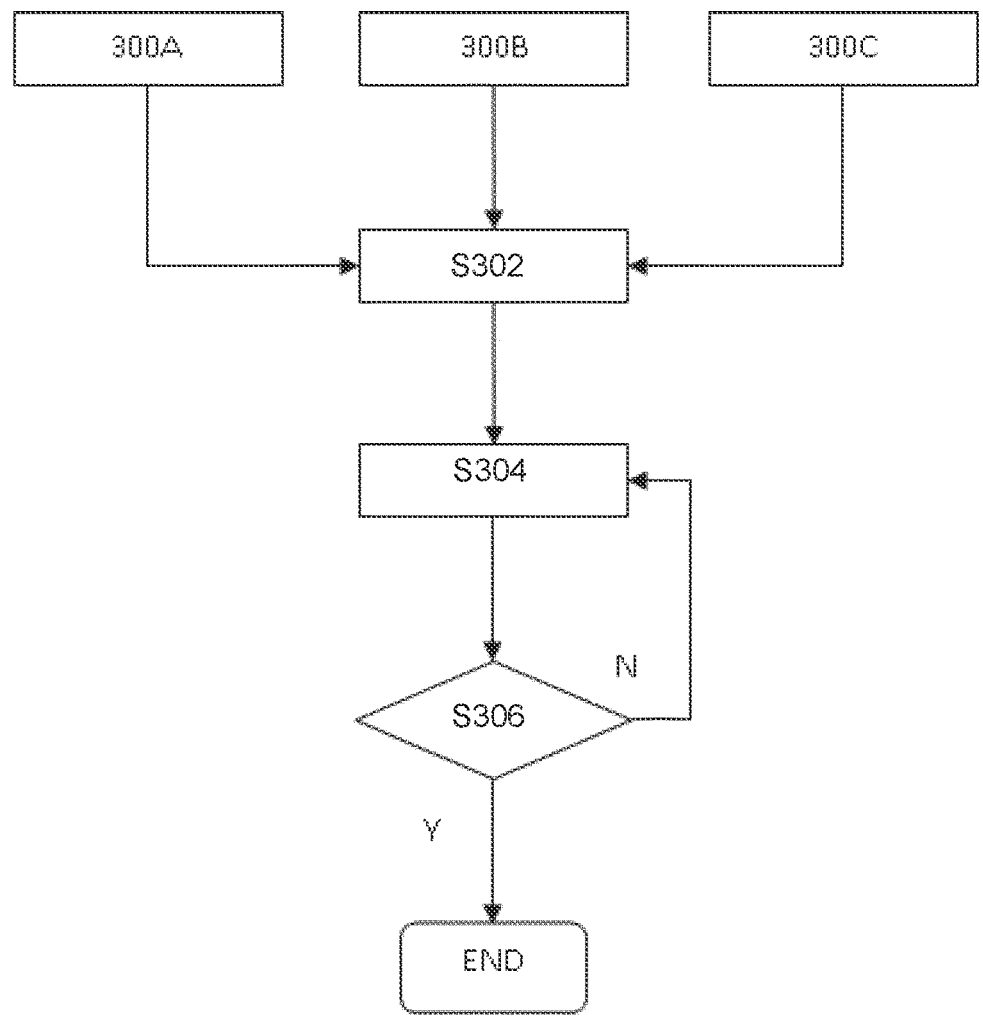
FIG. 24 is a flow diagram illustrating aspects of an example methodology of joint optimization, according to an embodiment.

A general method of optimizing the lithography projection apparatus, according to an embodiment, is illustrated in FIG. 24. This method comprises a step S302 of defining a multi-variable cost function of a plurality of design variables. The design variables may comprise any suitable combination selected from characteristics of the illumination source (300A) (e.g., pupil fill ratio, namely percentage of radiation of the source that passes through a pupil or aperture), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to an SMO. Alternatively, the design variables may include characteristics of the illumination source (300A), characteristics of the projection optics (300B) and characteristics of the design layout (300C), which leads to a source-mask-lens optimization (SMLO). In step S304, the design variables are simultaneously adjusted so that the cost function is moved towards convergence. In step S306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S306 is satisfied, the method ends. If none of the conditions in step S306 is satisfied, the step S304 and S306 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 25:
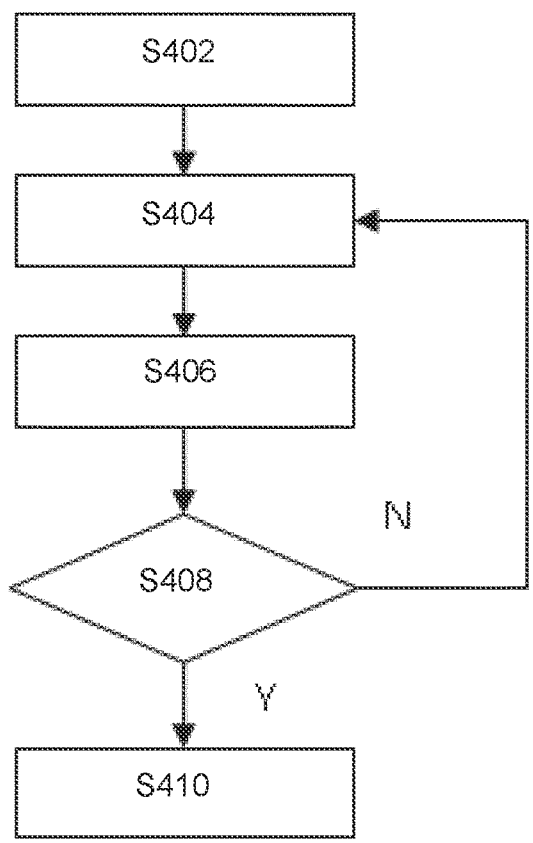
FIG. 25 shows an embodiment of another optimization method, according to an embodiment.

In FIG. 24, the optimization of all the design variables is executed simultaneously. Such flow may be called the simultaneous flow or co-optimization flow. Alternatively, the optimization of all the design variables is executed alternatively, as illustrated in FIG. 25. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 25, first, a design layout (step S402) is obtained, then a step of source optimization is executed in step S404, where all the design variables of the illumination source are optimized (SO) to minimize the cost function while all the other design variables are fixed. Then in the next step S406, a mask optimization (MO) is performed, where all the design variables of the patterning device are optimized to minimize the cost function while all the other design variables are fixed. These two steps are executed alternatively, until certain terminating conditions are met in step S408. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step S410, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 26A:
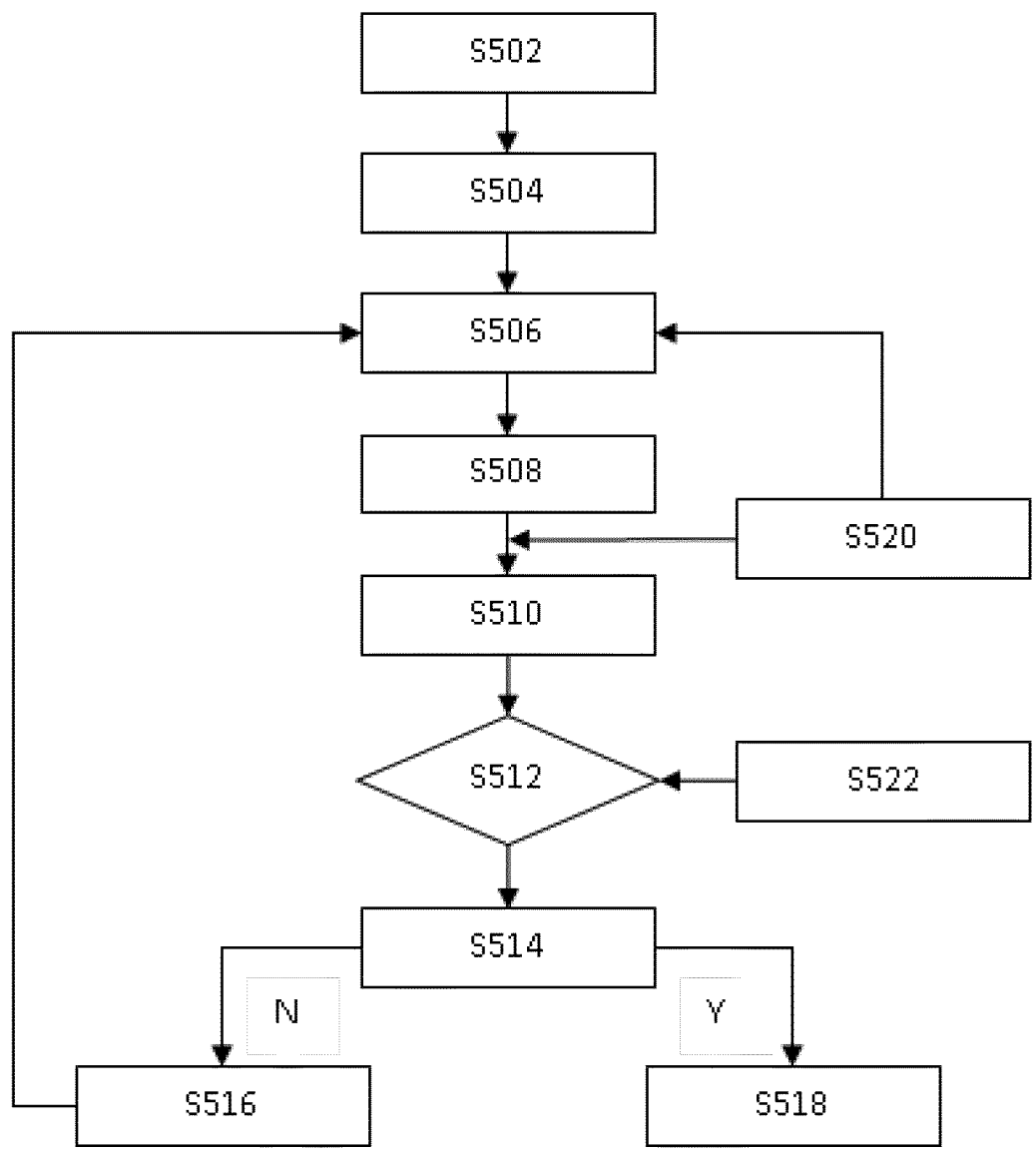
FIGS. 26A, 26B and 27 show example flowcharts of various optimization processes, according to an embodiment.

FIG. 26A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 26A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

(n=1, 2, . . . N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) \quad \text{(Eq. 4)}$$

$$= \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \right)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0,$$

wherein n=1, 2, . . . N.

If the design variables $(z_1, z_2, \ldots, z_N)$ are under the constraints in the form of J inequalities (e.g. tuning ranges of $(z_1, z_2, \ldots, z_N)$)

$$\sum_{n=1}^{N} A_{nj} z_n \leq B_j,$$

for j=1, 2, . . . J; and K equalities (e.g. interdependence between the design variables)

$$\sum_{n=1}^{N} C_{nk} z_n = D_k,$$

for k=1, 2, . . . K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin N.Y.: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1,$ $z_2, \ldots, z_N$) is approximated as in Eq. 3. Then the constraints on worst defect size are written as inequalities $E_{L_p} (z_1, z_2, \ldots, z_N) \leq E_{U_p}$, wherein $E_{L_p}$ and $E_{U_p}$ are two constants specifying the minimum and maximum allowed deviation for the $f_p(z_1, z_2, \ldots, z_N)$. Plugging Eq. 3 in, these constraints are transformed to, for $p = 1, \ldots P$, $$\sum_{n=1}^{N} \frac{\partial f_p(z_1, z_2, \ldots, z_N)}{\partial z_n} \bigg|_{z_1 = z_{1i}, z_2 = z_{2i}, \ldots, z_N = z_{Ni}}, \quad \text{(Eq. 6')}$$

$$z_n \leq E_{Up} + \sum_{n=1}^{N} \frac{\partial f_p(z_1, z_2, \ldots, z_N)}{\partial z_n} \bigg|_{z_1 = z_{1i}, z_2 = z_{2i}, \ldots, z_N = z_{Ni}},$$

$$z_{ni} - f_p(z_{1i}, z_{2i}, \ldots, z_{Ni})$$

and $$-\sum_{n=1}^{N} \frac{\partial f_p(z_1, z_2, \ldots, z_N)}{\partial z_n} \bigg|_{z_1 = z_{1i}, z_2 = z_{2i}, \ldots, z_N = z_{Ni}}, \quad \text{(Eq. 6'')}$$

$$z_n \leq -E_{Up} - \sum_{n=1}^{N} \frac{\partial f_p(z_1, z_2, \ldots, z_N)}{\partial z_n} \bigg|_{z_1 = z_{1i}, z_2 = z_{2i}, \ldots, z_N = z_{Ni}},$$

$$z_{ni} + f_p(z_{1i}, z_{2i}, \ldots, z_{Ni})$$

Since Eq. 3 is generally valid only in the vicinity of $(z_{1i}, z_{2i}, \ldots, z_{Ni})$, in case the desired constraints $E_{L_p} \leq f_p(z_1, z_2, \ldots, z_N) \leq E_{U_p}$ cannot be achieved in such vicinity, which can be determined by any conflict among the inequalities, the constants $E_{L_p}$ and $E_{U_p}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = \quad \text{(Eq. 6''')}$$

$$(1 - \lambda) \sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda = 0$, then this becomes Eq.4 and the RMS of the defect size is only minimized; while if $\lambda = 1$, then this becomes Eq.5 and the worst defect size is only minimized; if $0 < \lambda < 1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \Delta \varepsilon)$:

$$CF(z_1, z_2, \ldots, z_N, f_0, \varepsilon_0) = \quad \text{(Eq. 7)}$$

$$\max_{(f, \varepsilon) = (f_0 \pm \Delta f, \varepsilon_0 \pm \Delta \varepsilon)} \max_{p} |f_p(z_1, z_2, \ldots, z_N, f, \varepsilon)|.$$

or $$CF(z_1, z_2, \ldots, z_N, f_0, \varepsilon_0) = \quad \text{(Eq. 7')}$$

$$\sum_{(f, \varepsilon) = (f_0 \pm \Delta f, \varepsilon_0 \pm \Delta \varepsilon)} \sum_{p} w_p f_p^2(z_1, z_2, \ldots, z_N, f, \varepsilon)$$

or $$CF(z_1, z_2, \ldots, z_N, f_0, \varepsilon_0) = \quad \text{(Eq. 7'')}$$

$$(1 - \lambda) \sum_{(f, \varepsilon) = (f_0 \pm \Delta f, \varepsilon_0 \pm \Delta \varepsilon)} \sum_{p} w_p f_p^2(z_1, z_2, \ldots, z_N, f, \varepsilon) +$$

$$\lambda \max_{(f, \varepsilon) = (f_0 \pm \Delta f, \varepsilon_0 \pm \Delta \varepsilon)} \max_{p} |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \Delta \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \Delta \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7″. If the design variables are characteristics of the projection optics, such as the Zernike coefficients, then minimizing the cost functions of Eqs. 7, 7′, or 7″ leads to process window maximization based on projection optics optimization, i.e., LO. If the design variables are characteristics of the source and patterning device in addition to those of the projection optics, then minimizing the cost function of Eqs. 7, 7′, or 7″ leads to process window maximizing based on SMLO, as illustrated in FIG. 24. If the design variables are characteristics of the source and patterning device and, then minimizing the cost functions of Eqs. 7, 7′, or 7″ leads to process window maximization based on SMO. The cost functions of Eqs. 7, 7′, or 7″ can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 27:
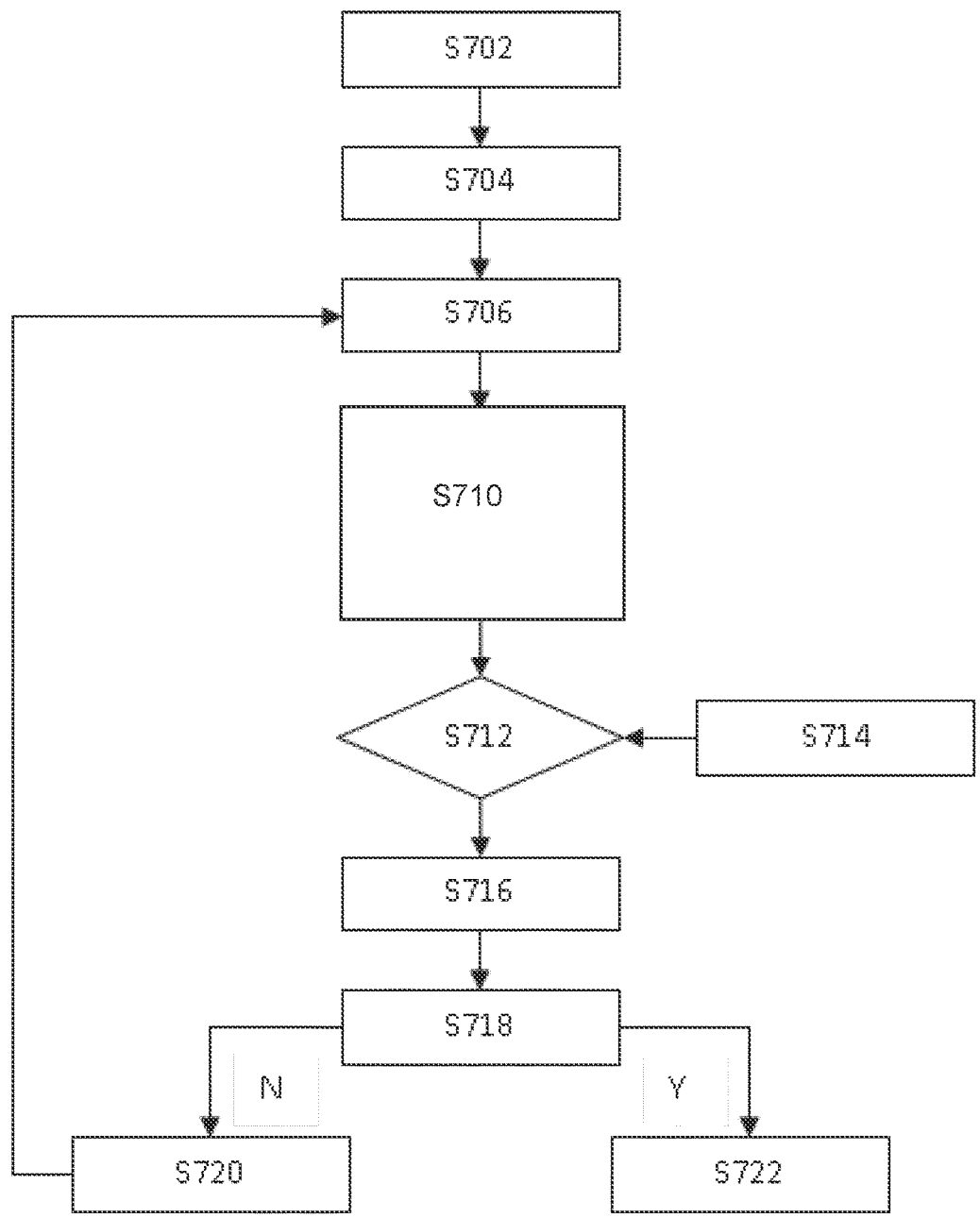

FIG. 27 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 26A. As mentioned before, the final output may be a wavefront aberration map in the pupil plane, optimized to produce the desired imaging performance. The final output may also be an optimized source map and/or an optimized design layout.

Figure 26B:
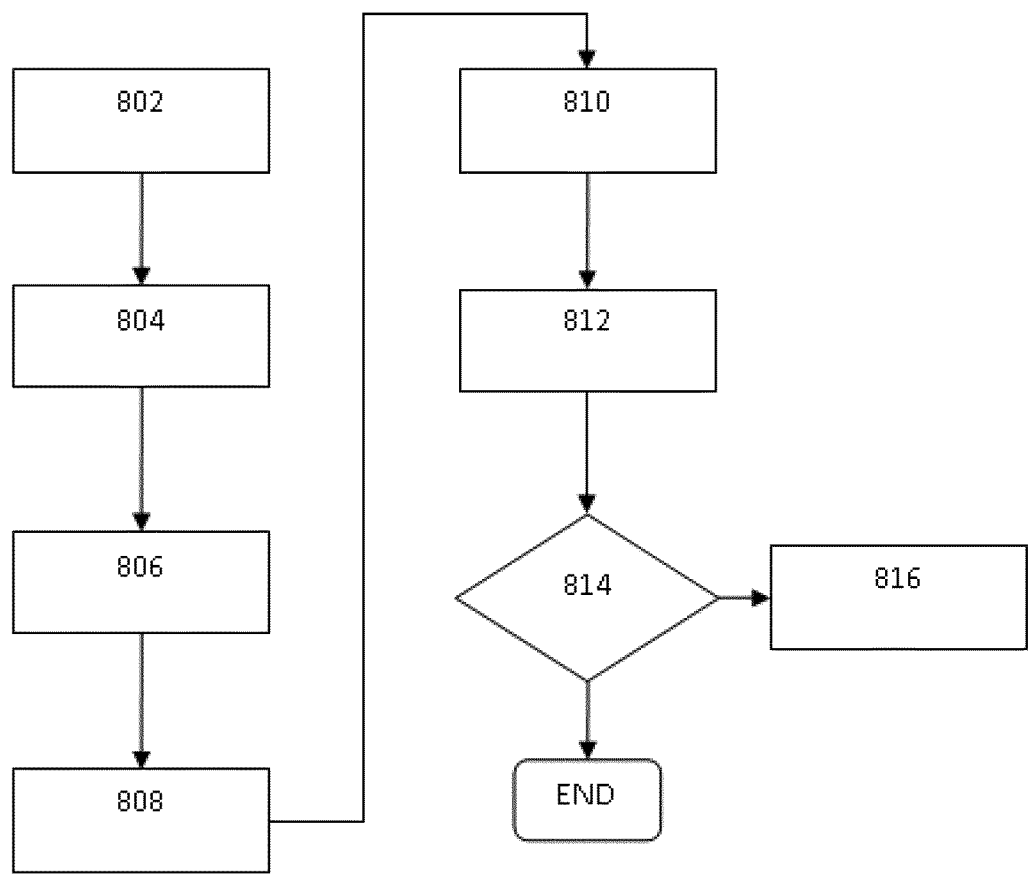

FIG. 26B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step 802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step 804, a lithographic model is selected as the basis for photolithographic simulation. Photolithographic simulations produce results that are used in calculations of photolithographic metrics, or responses. A particular photolithographic metric is defined to be the performance metric that is to be optimized (step 806). In step 808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps 802, 804, 806, and 808 are depicted as sequential steps, it will be appreciated that in other embodiments of the invention, these steps may be performed in other sequences.

In step 810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step 812). In step 812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step 812.

In other approaches, patterning device polygon shape adjustments and pairwise polling of pixel groups and/or patterning device tiles are also performed within the optimization process of 812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step 814, a determination is made as to whether the performance metric has converged. The performance metric may be considered to have converged, for example, if little or no improvement to the performance metric has been witnessed in the last several iterations of steps 810 and 812. If the performance metric has not converged, then the steps of 810 and 812 are repeated in the next iteration, where the modified illumination shape and modified patterning device from the current iteration are used as the initial illumination shape and initial patterning device for the next iteration (step 816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

As mentioned earlier for example in methods 600, 1000, and 1100, inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

Figure 28:
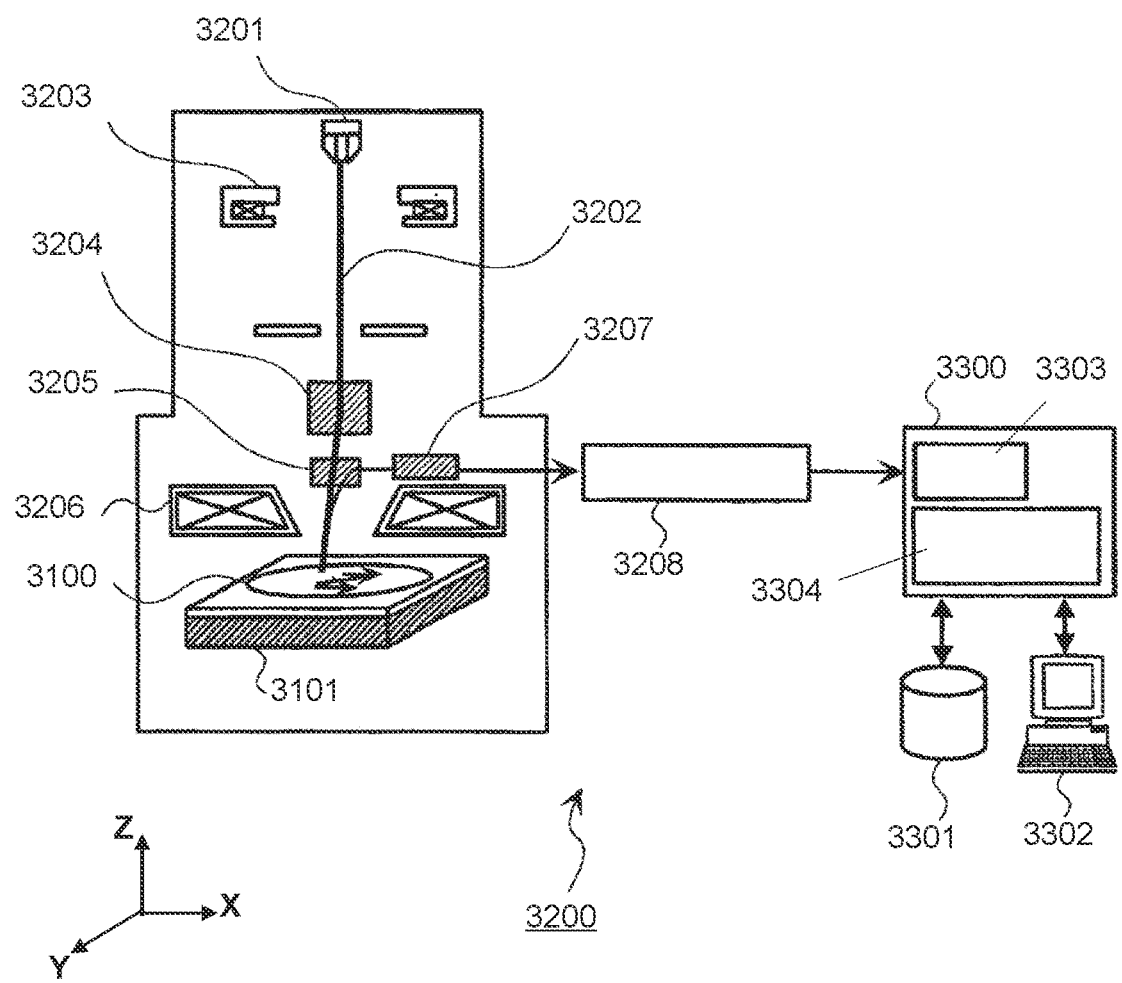
FIG. 28 schematically depicts an embodiment of a scanning electron microscope (SEM), according to an embodiment.

FIG. 28 schematically depicts an embodiment of an electron beam inspection apparatus 3200. A primary electron beam 3202 emitted from an electron source 3201 is converged by condenser lens 3203 and then passes through a beam deflector 3204, an E x B deflector 3205, and an objective lens 3206 to irradiate a substrate 3100 on a substrate table 3101 at a focus.

When the substrate 3100 is irradiated with electron beam 3202, secondary electrons are generated from the substrate 3100. The secondary electrons are deflected by the E x B deflector 3205 and detected by a secondary electron detector 3207. A two-dimensional electron beam image can be obtained by detecting the electrons generated from the sample in synchronization with, e.g., two dimensional scanning of the electron beam by beam deflector 3204 or with repetitive scanning of electron beam 3202 by beam deflector 3204 in an X or Y direction, together with continuous movement of the substrate 3100 by the substrate table 3101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 3204 can provide the electron beam 3202). Thus, the spatial extent of the field of the view is the spatial extent to which the angular range of the electron beam can impinge on a surface (wherein the surface can be stationary or can move with respect to the field).

A signal detected by secondary electron detector 3207 is converted to a digital signal by an analog/digital (A/D) converter 3208, and the digital signal is sent to an image processing system 3300. In an embodiment, the image processing system 3300 may have memory 3303 to store all or part of digital images for processing by a processing unit 3304. The processing unit 3304 (e.g., specially designed hardware or a combination of hardware and software or a computer readable medium comprising software) is configured to convert or process the digital images into datasets representative of the digital images. In an embodiment, the processing unit 3304 is configured or programmed to cause execution of a method described herein. Further, image processing system 3300 may have a storage medium 3301 configured to store the digital images and corresponding datasets in a reference database. A display device 3302 may be connected with the image processing system 3300, so that an operator can conduct necessary operation of the equipment with the help of a graphical user interface.

Figure 29:
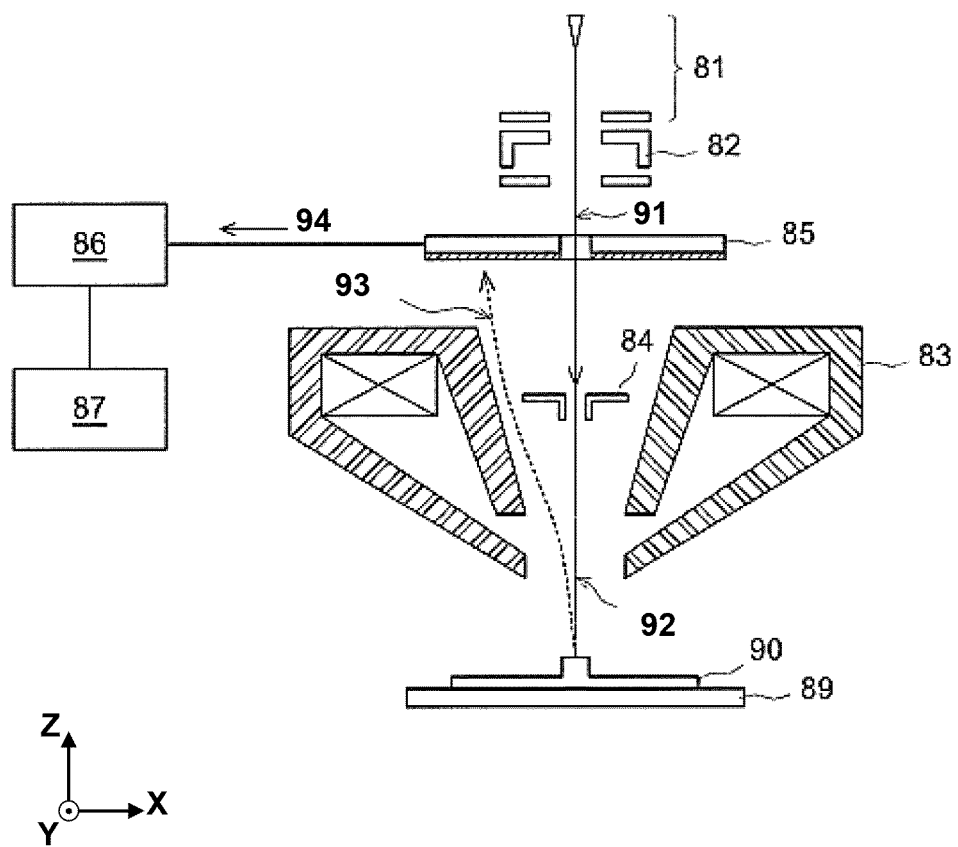
FIG. 29 schematically depicts an embodiment of an electron beam inspection apparatus, according to an embodiment.

FIG. 29 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 28 that uses a probe to inspect a substrate, the electron current in the system of FIG. 29 is significantly larger compared to, e.g., a CD SEM such as depicted in FIG. 28, such that the probe spot is large enough so that the inspection speed can be fast. However, the resolution may not be as high as compared to a CD SEM because of the large probe spot. In an embodiment, the above discussed inspection apparatus (in FIG. 28 or 29) may be single beam or a multi-beam apparatus without limiting the scope of the present disclosure.

The SEM images, from, e.g., the system of FIG. 28 and/or FIG. 29, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 30:
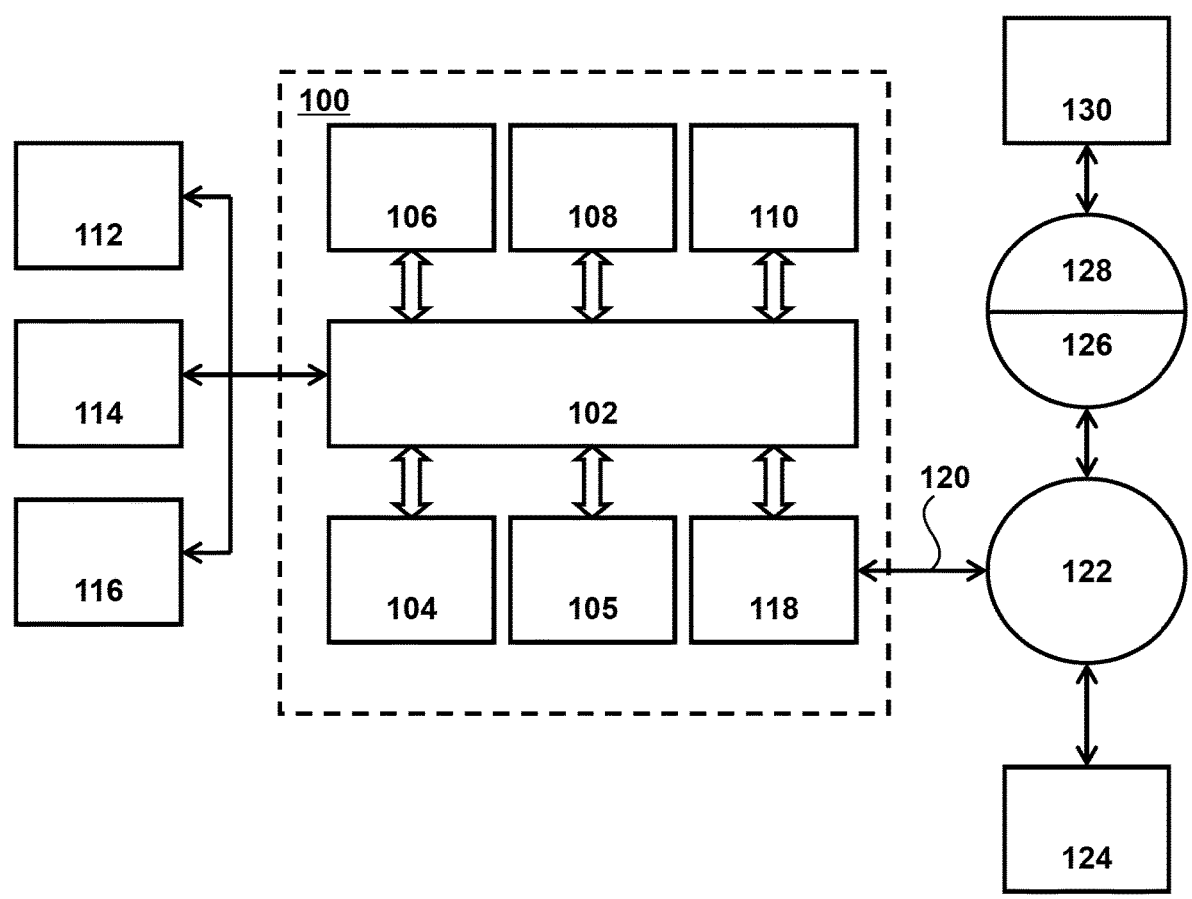
FIG. 30 is a block diagram of an example computer system, according to an embodiment.

FIG. 30 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 31:
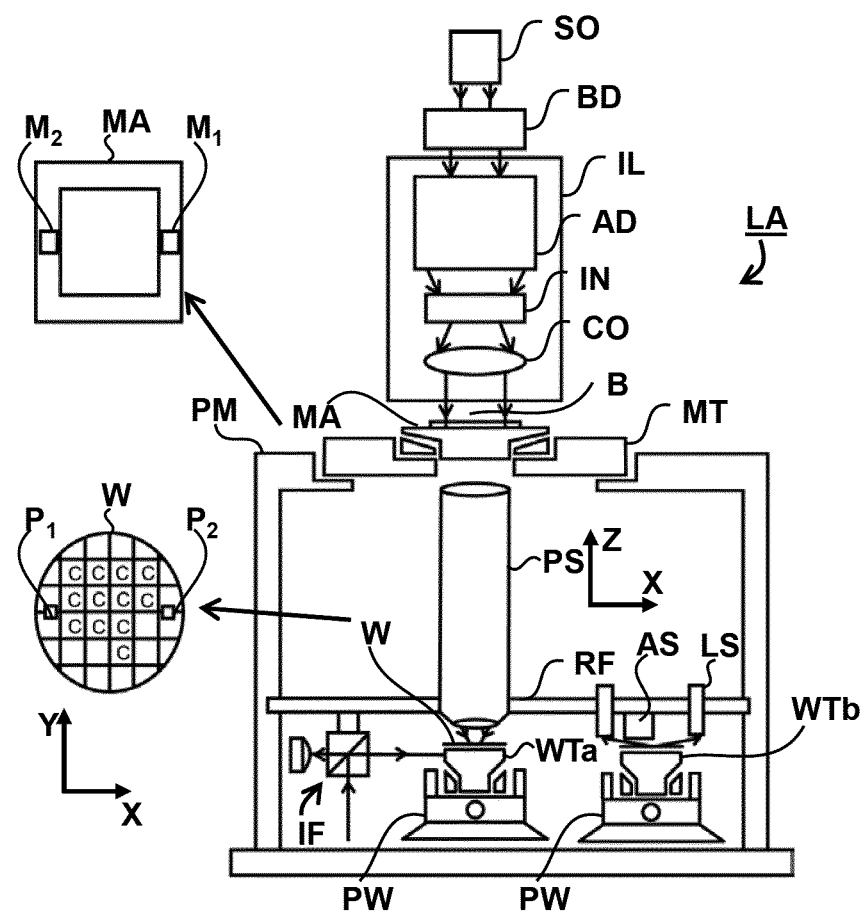
FIG. 31 is a schematic diagram of a lithographic projection apparatus, according to an embodiment.

FIG. 31 schematically depicts an exemplary lithographic projection apparatus whose illumination source could be optimized utilizing the methods described herein. The apparatus comprises:

- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 31 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 31. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 32:
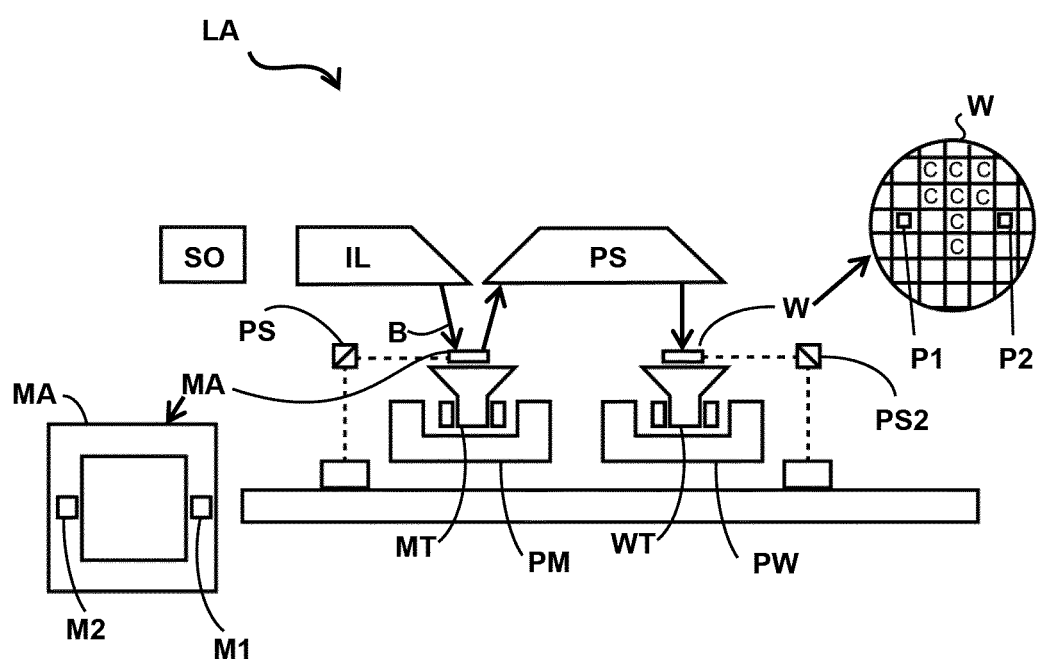
FIG. 32 is a schematic diagram of another lithographic projection apparatus, according to an embodiment.

FIG. 32 schematically depicts another exemplary lithographic projection apparatus 1000 whose illumination source could be optimized utilizing the methods described herein.

The lithographic projection apparatus 1000 includes:
- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 32, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 32, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 33:
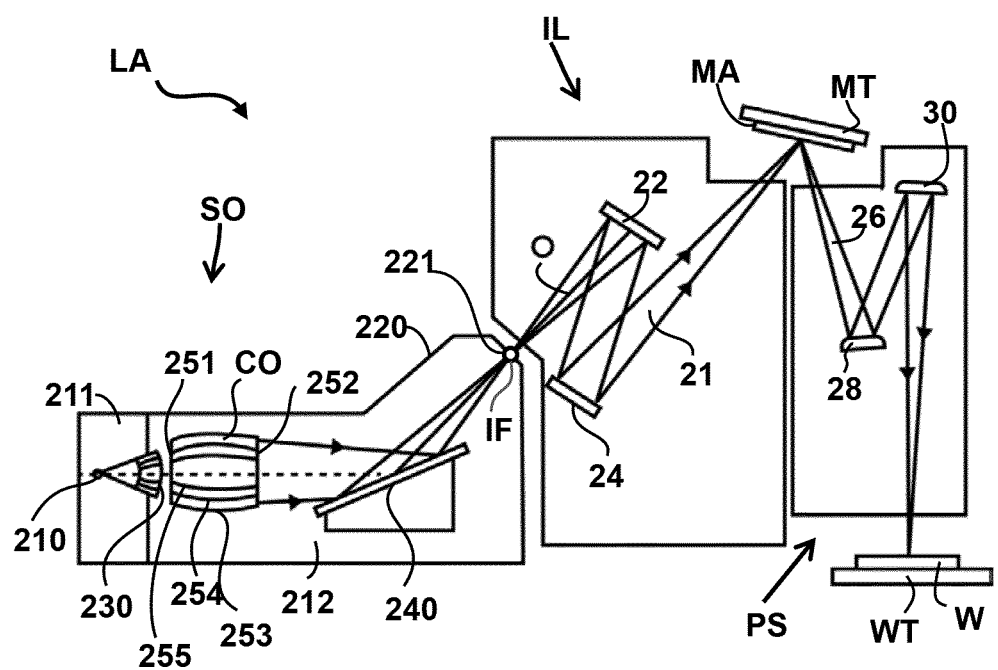
FIG. 33 is a more detailed view of the apparatus in FIG. 32, according to an embodiment.

FIG. 33 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 33.

Collector optic CO, as illustrated in FIG. 33, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 34:
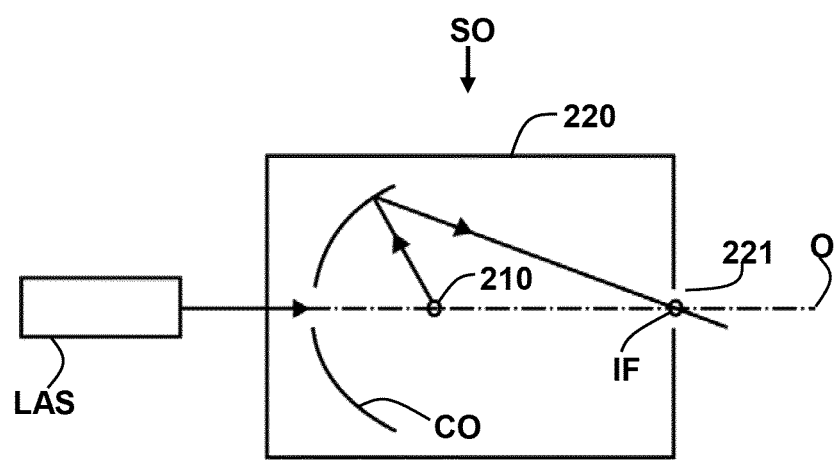
FIG. 34 is a more detailed view of the source collector module SO of the apparatus of FIGS. 32 and 33, according to an embodiment.

Alternatively, the source collector module SO may be part of an LPP radiation system as shown in FIG. 34. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of determining a failure model of a resist process of a patterning process, the method comprising:
    obtaining (i) measured data of a pattern failure related to a feature printed on a wafer based on a range of values of dose, and (ii) an image intensity values for the feature via simulating a process model using the range of the dose values; and
    determining, via fitting the measured data of the pattern failure to a product of the dose values and the image intensity values, the failure model that models a stochastic behavior of spatial fluctuations in the resist.
2. The method of clause 1, further comprises:
    applying, via a processor, the values of dose and image intensity to the failure model configured to predict a value of the pattern failure, wherein the failure model represents spatial fluctuations in resist composition of a resist layer as a function of the dose and the image intensity; and
    adjusting, via the processor, a parameter of the patterning process based on the value of the pattern failure predicted by the failure model.
3. The method of clause 2, wherein the applying the values of dose and image intensity comprises predicting, via executing of the failure model with the values of the dose and image intensity as input, the value of the pattern failure.
4. The method of any of clauses 1-3, wherein the failure model is a probabilistic model fitted as the product of the values of dose and image intensity.
5. The method of clause 4, wherein the probabilistic model comprises a Gaussian function fitted based on a product of the values of dose and image intensity.
6. The method of clause 5, wherein the Gaussian function comprises at least two fitting parameters.
7. The method of clause 6, wherein the fitting parameters are mean and variance of the values of the dose and image intensity.
8. The method of any of clauses 1-7, wherein the measured data of the pattern failure comprises a failure rate of a failure of the feature upon exposure of the resist layer.
9. The method of clause 8, wherein the failure comprises at least one of: a hole closure, a missing hole, merging holes, a space closure, and a line breaking.
10. The method of clause 9, wherein the failure of the feature is dependent on an amount of light at a center of the feature center and on an amplitude of stochastic fluctuations of the resist layer, wherein the amplitude of the fluctuations is determined from the failure model based on the measured data of the failure rate and the values of dose and image intensity.
11. The method of clause 10, wherein the image intensity is determined from an aerial image obtained for a design pattern.
12. The method of clause 10, wherein the image intensity is blurred image intensity, wherein the blurred image intensity is a function of the resist process of the patterning process.
13. The method of clause 12, wherein the blurred image intensity is determined by convolution of an aerial image with a function chosen to approximately predict behavior of the resist layer or the resist process.
14. The method of clause 13, wherein the resist model is another Gaussian function.
15. The method of any of clauses 1-14, wherein adjusting a parameter of the patterning process comprises:
    determining the value of the pattern failure via simulation of the lithographic model and the failure model using the values of the dose and intensity; and
    adjusting a value of the parameter of the patterning process such that the value of the pattern failure is reduced.
16. The method of clause 15, wherein the parameter of the patterning process is at least one of: dose, focus, critical dimension, mask bias, mask pattern, and optical proximity correction.
17. The method of clause 16, wherein the adjusting a value of the optical proximity correction of the patterning process comprises placement of assist features relative to a main feature of the design pattern.
18. The method of any of clauses 1-17, wherein the values of dose are obtained at a center of a feature of the pattern printed on the resist layer.
19. The method of any of clauses 1-18, wherein the image intensity is a peak image intensity or a normalized image log-slope of a distribution of the values of the image intensity.
20. The method of any of clauses 12-19, wherein blur is a variable of the failure model, wherein the blur, applied to the optical image, is used to fit the measured data of the pattern failure.
21. A method for calibrating a failure model related to a resist process of a patterning process, the method comprising:
    obtaining measured values of a pattern failure related to a failure for a feature on a wafer subjected to the patterning process; and calibrating the failure model based on the measured values of the pattern failure such that a difference between predictions of the failure model and the measured values is reduced.

22. The method of clause 21, wherein the failure model is a probabilistic model configured to predict the values of the pattern failure.

23. The method of any of clauses 21-22, wherein the value of the pattern failure comprises a failure rate of the failure of the feature upon exposure of the resist layer.

24. The method of any of clauses 21-23, wherein the calibrating the failure model comprises fitting the probabilistic model based on a product of the measured values of dose and image intensity.

25. The method of clause 24, wherein the probabilistic model is a Gaussian function comprising at least two fitting parameters including a mean and a standard deviation.

26. The method of any of clauses 21-25, further comprising:
integrating the calibrated failure model with a blurred image model or a resist model of a lithographic model to allow the blurred image model or the resist model to predict a failure rate of a feature within the resist layer.

27. The method of clause 26, wherein the blurred image model includes a blur variable that can be adjusted to best fit the measured values of the pattern failure.

28. The method of clause 26, further comprising:
extrapolating, via calculation with the lithographic model and the calibrated failure model, to the low failure conditions associated with high volume manufacturing of the patterning process.

29. The method of clause 28, wherein the extrapolating of the failure model is based on data from under exposed condition and over exposed condition at nominal focus of the patterning process.

30. The method of any of clauses 21-29, further comprising:
determining, via the calibrated failure model, a failure process window, the failure process window being a dose-focus matrix, wherein each elements of the matrix is failure probability value.

31. The method of clause 30, wherein the determining of the failure process window comprises:
executing the calibrated failure model for each value of dose and focus to determine the failure probability value for each dose and focus values.

32. A method comprising:
obtaining values of dose and intensity for a resist process of a patterning process;
obtaining a failure model configured to predict a value of a pattern failure, wherein the failure model models resist stochastic composition fluctuations of a resist layer after exposure and bake as a function of the dose and intensity values; and
adjusting a parameter of the patterning process based on the value of the pattern failure predicted by the failure model to improve performance of the patterning process.

33. The method of clause 32, wherein adjusting the parameter of the patterning process comprises:
determining the value of the pattern failure via simulating a lithographic model and the failure model using the values of the dose and intensity; and
adjusting a value of the parameter of the patterning process such that the value of the pattern failure is reduced.

34. The method of clause 33, wherein the parameter of the patterning process is at least one of: dose, focus, critical dimension, mask bias, mask pattern, and optical proximity correction.

35. The method of clause 34, wherein the adjusting a value of the optical proximity correction of the patterning process comprises placement of assist features relative to a main feature of the design pattern.

36. The method of any of clauses 33-35, wherein the values of dose are obtained at a center of a feature of the pattern printed on the resist layer.

37. A method of determining hot spot locations associated with a target pattern to be printed, the method comprising:
generating a blurred image of the target pattern; and
determining, via a calibrated failure model and the blurred image, hot spot locations associated with the target pattern,
the calibrated failure model being a function of a product of dose and intensity used for printing the targeted pattern,
the calibrated failure model being configured to determine a failure rate associated with regions of the target pattern,
wherein the hot spot locations are regions of the target pattern having relatively higher failure rates.

38. The method of clause 37, wherein the blurred image is generated by convoluting a Gaussian function, using a given blur value, with an aerial image of the target pattern.

39. The method of clause 38, wherein the aerial image is generated by simulating an optical model and applying a specified dose value.

40. The method of any of clauses 37-39, wherein the determining of the hot spot locations comprises:
identifying regions within the blurred image around the target pattern having relatively low peak intensity values in a center of a relatively bright region, or having relatively high trough intensity values in a center of relatively dark region;
executing, using the specified dose and intensity values within the identified regions of the blurred image around the target pattern, the calibrated failure model to predict failure rates within the identified regions; and
choosing, based on the predicted failure rates within the identified regions, portions of the target pattern associated with relatively higher failure rate as the hot spot locations.

41. The method of clause 40, wherein the choosing of the hot spot locations is based on determining whether a failure rate at a location of an identified region breaches a hot spot threshold value, wherein the hot spot threshold value is a minimum acceptable failure rate.

42. The method of any of clauses 41, wherein the calibrated failure model is configured to predict the failure rate based on stochastic variations related to a mask manufacturing process, a resist process, an etch process, and/or a lithographic process.

43. The method of clause 42, wherein the calibrated failure model is configured to account for the stochastic variations via one or more parameters of a Gaussian function.

44. A computer program product comprising a non-transitory computer readable medium having instructions recorded thereon, the instructions when executed by a computer implementing the method of any of clauses 1-43.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method of determining a failure model of a resist process of a patterning process, the method comprising:
    obtaining (i) measured data of a pattern failure related to a feature printed on a substrate based on a range of values of dose, and (ii) image intensity values for the feature via simulating a process model using the range of dose values; and
    determining, by a hardware computer fitting the measured data of the pattern failure to a product of the dose values and the image intensity values, the failure model that models a stochastic behavior of spatial fluctuations in the resist.

2. The method of claim 1, further comprising:
    applying values of dose and image intensity to the failure model to predict a value of the pattern failure; and
    adjusting a parameter of the patterning process based on the value of the pattern failure predicted by the failure model.

3. The method of claim 2, wherein the applying the values of dose and image intensity comprises predicting, via executing of the failure model with the applied values of the dose and image intensity as input, the value of the pattern failure.

4. The method of claim 2, wherein adjusting a parameter of the patterning process comprises:
    determining the value of the pattern failure via simulation and the failure model using the applied values of the dose and intensity; and
    adjusting a value of the parameter of the patterning process such that the value of the pattern failure is reduced.

5. The method of claim 4, wherein the parameter of the patterning process is at least one selected from: dose, focus, critical dimension, mask bias, mask pattern, and/or optical proximity correction.

6. The method of claim 1, wherein the failure model is a probabilistic model fitted based on the product of the values of dose and image intensity, and/or wherein the failure model comprises a Gaussian function fitted based on the product of the values of dose and image intensity.

7. The method of claim 6, wherein the failure model comprises the Gaussian function and the Gaussian function comprises at least two fitting parameters.

8. The method of claim 1, wherein the measured data of the pattern failure comprises a failure rate of a failure of the feature upon exposure of the resist, and/or
    wherein the pattern failure comprises at least one selected from: a hole closure, a missing hole, merging holes, a space closure, and/or a line breaking.

9. The method of claim 8, wherein the measured data of the pattern failure comprises the failure rate and wherein the pattern failure is dependent on an amount of radiation at a center of the feature and on an amplitude of stochastic fluctuations of the resist, wherein the amplitude of the fluctuations is determined from the failure model based on the measured data of the failure rate and the values of dose and image intensity.

10. The method of claim 1, wherein the image intensity is determined from an aerial image obtained for a design pattern, and/or
    wherein the image intensity is blurred image intensity, wherein the blurred image intensity is a function of the resist process of the patterning process.

11. The method of claim 10, wherein the image intensity is blurred image intensity and wherein the blurred image intensity is determined by convolution of an aerial image with a function chosen to approximately predict behavior of the resist or the resist process.

12. The method of claim 1, wherein the values of dose are obtained at a center of a feature of the pattern printed on the resist.

13. The method of claim 1, wherein the image intensity is a peak image intensity or a normalized image log-slope of a distribution of the values of the image intensity.

14. The method of claim 13, wherein blur is a variable of the failure model, and wherein the blur is used to fit the measured data of the pattern failure.

15. A non-transitory computer-readable medium carrying instructions, the instructions, when executed by a computing system, configured to cause the computing system to at least:
    obtain (i) measured data of a pattern failure related to a feature printed on a substrate based on a range of values of dose, and (ii) image intensity values for the feature via simulating a process model using the range of dose values; and
    determine, by fitting the measured data of the pattern failure to a product of the dose values and the image intensity values, a failure model of a resist process of a patterning process, the failure model modelling a stochastic behavior of spatial fluctuations in the resist.

16. A method comprising:
    applying, by a hardware computer, values of dose and image intensity to a failure model to predict a value of a pattern failure, wherein the failure model models a stochastic behavior of spatial fluctuations in resist and is determined from fitting measured data of pattern failure related to a feature printed on a substrate based on a range of values of dose to a product of the dose values and image intensity values for the feature corresponding to the range of dose values; and
    adjusting a parameter of a patterning process based on the value of the pattern failure predicted by the failure model.

17. The method of claim 16, wherein the failure model is a probabilistic model fitted based on the product of the values of dose and image intensity, and/or wherein the failure model comprises a Gaussian function fitted based on the product of the values of dose and image intensity.

18. A non-transitory computer-readable medium carrying instructions, the instructions, when executed by a computing system, configured to cause the computing system to at least:
    apply values of dose and image intensity to a failure model to predict a value of a pattern failure, wherein the failure model models a stochastic behavior of spatial fluctuations in resist and is determined from fitting measured data of pattern failure related to a feature printed on a substrate based on a range of values of dose to a product of the dose values and image intensity values for the feature corresponding to the range of dose values; and adjust a parameter of a patterning process based on the value of the pattern failure predicted by the failure model.

19. The computer-readable medium of claim 18, wherein the failure model is a probabilistic model fitted based on the product of the values of dose and image intensity, and/or wherein the failure model comprises a Gaussian function fitted based on the product of the values of dose and image intensity.

20. The computer-readable medium of claim 18, wherein the measured data of the pattern failure comprises a failure rate of a failure of the feature upon exposure of the resist, and/or
   wherein the pattern failure comprises at least one selected from: a hole closure, a missing hole, merging holes, a space closure, and/or a line breaking.

* * * * *